United States Patent [19]
Sato

[11] Patent Number: 5,754,480
[45] Date of Patent: May 19, 1998

[54] SEMICONDUCTOR DEVICE INCLUDING AN OUTPUT BUFFER CIRCUIT THAT CAN OUTPUT DATA WHILE ESTABLISHING IMPEDANCE MATCHING WITH AN EXTERNAL DATA TRANSMISSION LINE

[75] Inventor: Hirotoshi Sato, Hyogo, Japan

[73] Assignee: Mitsubishi Denki Kabushiki Kaisha, Tokyo, Japan

[21] Appl. No.: 597,229

[22] Filed: Feb. 6, 1996

[30] Foreign Application Priority Data

Feb. 17, 1995  [JP]  Japan ................. 7-029303

[51] Int. Cl.⁶ ........................................... H03K 17/687
[52] U.S. Cl. .................. 365/189.05; 365/204; 365/203
[58] Field of Search ........................... 365/233, 230.01, 365/189.01, 189.05, 204, 203

[56] References Cited

U.S. PATENT DOCUMENTS 5,535,171  7/1996  Kim et al. ............................ 365/233
5,598,371  1/1997  Lee et al. ........................ 365/189.05
5,617,362  4/1997  Mori et al. ...................... 365/189.05

FOREIGN PATENT DOCUMENTS 3-19425  1/1991  Japan.

OTHER PUBLICATIONS

"Digitally Adjustable Resistors in CMOS for High-Performance Applications," by Thaddeus J. Cabara et al., *IEEE Journal of Solid-State Circuits*, vol. 27, No. 8, Aug. 1992.

Primary Examiner—Viet Q. Nguyen
Attorney, Agent, or Firm—Lowe, Price, LeBlanc & Becker

[57] ABSTRACT

When a potential D of an output node is drawn out to the level of ground potential GND by an n channel pull-down output transistor, a pull-down gate control transistor is rendered conductive. The output node and the n channel pull-down output transistor conduct.

4 Claims, 24 Drawing Sheets

SEMICONDUCTOR DEVICE INCLUDING AN OUTPUT BUFFER CIRCUIT THAT CAN OUTPUT DATA WHILE ESTABLISHING IMPEDANCE MATCHING WITH AN EXTERNAL DATA TRANSMISSION LINE

BACKGROUND OF THE INVENTION

1. Field of the Invention

The present invention relates to semiconductor devices, and more particularly, to a semiconductor device including an output buffer that provides internal data to the outside world.

2. Description of the Background Art

Various semiconductor devices such as microcomputers, memories, and gate arrays are incorporated into various electrical products such as personal computers and work stations. In most cases, the semiconductor devices include a pin for transmitting data to/from the outside world and an output buffer circuit (driver circuit) for providing a signal formed inside the device and stored information to this pin. When a semiconductor device is incorporated into an electrical product, the pin is connected to a printed wiring and the like on the mounting substrate. This pin is required to charge/discharge the floating capacitance present on the mounting substrate or the load capacitance (parasitic capacitance) having a relatively great capacitance such as the input capacitance of another device connected to the pin.

FIG. 36 shows a driver circuit disclosed in, for example, Japanese Patent Laying-Open No. 3-19425. FIG. 37 is an equivalent circuit diagram of the circuit of FIG. 36. Referring to FIGS. 36 and 37, a power supply potential $V_{CC}$ is applied to a power supply potential node 1a, and a ground potential is applied to a ground node 1b. An input signal IN is applied to an input node 2. An inverter 3 has its input connected to input node 2, and includes a p channel transistor 3a and an n channel transistor 3b. An inverter 4 has its input connected to input node 2, and includes a p channel transistor 4a and an n channel transistor 4b. An n channel transistor 6 is connected between power supply potential $V_{CC}$ and an output node 5 of inverter 3. The gate of n channel transistor 6 is connected to output node 12. A p channel transistor 8 is connected between the ground potential and an output node 7 of inverter 4. The gate of p channel transistor 8 is connected to an output node 12. A p channel transistor 9 has its source connected to power supply $V_{CC}$, its gate connected to output node 5 of inverter 3, and its source connected to one end of a load resistor 10. Load resistor 10 has its other end connected to an output node 12. An n channel transistor 13 has a source connected to the ground potential, a gate connected to output node 7 of inverter 4, and a drain connected to one end of load resistor 11. The other end of load resistor 11 is connected to output node 12. An output signal OUT is provided from output node 12.

An operation of a conventional driver circuit having the above structure will be described hereinafter. When input signal IN is pulled down to ground potential GND from power supply potential $V_{CC}$, the potential of node 5 rises to the level of power supply potential $V_{CC}$ by inverter 3. P channel transistor 9 receiving the potential of node 5 at its gate is rendered non-conductive. The potential of node 7 also rises to the level of power supply potential $V_{CC}$ by inverter 4, whereby n channel transistor 13 is rendered conductive. When output signal OUT is pulled down to the level of ground potential GND and becomes lower than power supply potential $V_{CC}$ minus the absolute value $V_{thp}$ of the threshold voltage of p channel transistor 8, p channel transistor 8 conducts, whereby the potential $V_7$ of node 7 is lowered while maintaining the state of $V_7=\text{OUT}+V_{thp}$.

When input signal IN is pulled up from the level of ground potential GND to power supply potential $V_{CC}$, the potential of node 5 is lowered towards ground potential GND by inverter 3, whereby p channel transistors 9 is rendered conductive. The potential of node 7 is lowered towards ground potential GND by inverter 4, whereby n channel transistor 13 is rendered non-conductive. Therefore, output signal OUT is increased towards the level of power supply potential $V_{CC}$. When output signal OUT becomes higher than the potential of ground potential GND plus threshold voltage $V_{thn}$ of n channel transistor 6, n channel transistor 6 is rendered conductive. More specifically, potential $V_5$ of node 5 is increased while maintaining the state of $V_5=\text{OUT}-V_{thn}$.

A conventional driver circuit shown in FIGS. 36 and 37 maintain the match of the output impedance with the impedance of a transmission line (not shown) that provides output signal OUT by setting gate potentials $V_5$ and $V_7$ of p channel transistor 9 and n channel transistor so as to follow output signal OUT.

FIG. 38 is a graph showing output impedance characteristics with respect to drain-source voltage $V_{ds}$ when gate-source voltage $V_{gs}$ of an n channel transistor is varied as a parameter. It is appreciated from FIG. 38 that the output impedance rises in proportion to the increase of drain-source voltage $V_{ds}$ to take a maximum value and then fall when the gate-source voltage is constant, and that the output impedance is reduced in proportion to the rise of gate-source voltage $V_{gs}$. The output impedance is greatly offset from a set value when the absolute value of the gate-source voltage or the drain-source voltage of output transistors 9 and 13 are small during transition of the level of output signal OUT of the driver circuit. Therefore, a mismatch in impedance with the transmission line providing output signal OUT having a constant characteristic impedance occurs.

In a conventional driver circuit of the above-described structure, p channel transistor 4a and p channel transistor 8 in inverter 4 are rendered conductive when input signal IN attains the level of ground potential GND. Therefore, a through current is generated from power supply potential node 1a towards ground potential node 1b via p channel transistors 4a and 8. When input signal IN attains the level of power supply potential $V_{CC}$, n channel transistors 3b and 6 in inverter 3 are rendered conductive. Therefore, a through current is generated from power supply potential node 1a to ground potential node 1b via n channel transistors 6 and 3b. There was a problem that the power consumption is great.

Furthermore, when the transmission line providing output signal OUT is commonly shared with another semiconductor device of a different power supply potential, the potential of output node 12 is increased if the potential of this another semiconductor device is higher than power supply potential $V_{CC}$ applied to power supply potential node 1a. When an output buffer circuit provides output signal OUT of the level of ground potential GND under such a state, a mismatch in impedance is generated between the transmission line providing output signal OUT and the output buffer circuit during the period where the potential (output signal) OUT of output node 12 becomes lower than the level of power supply potential $V_{CC}$ minus absolute value $V_{thp}$ of the threshold voltage of p channel transistor 8 to render p channel transistor 8 conductive so that potential $V_7$ of node 7 follows output signal OUT. There was a problem that a reflection of the transmission wave of output signal OUT is generated to prevent high speed transmission.

In order to obtain a desired impedance, the size of output transistors 9 and 13 must be adjusted critically. There was a problem that the impedance cannot be easily set at a desired value.

SUMMARY OF THE INVENTION

An object of the present invention is to provide a semiconductor device including an output buffer of low power consumption and that has an impedance matching function.

Another object of the present invention is to provide a semiconductor device including an output buffer with matching impedance even when the power supply potential differs from an external power supply potential.

A further object of the present invention is to provide a semiconductor device including an output buffer that can have the impedance set to a desired value.

According to an aspect of the present invention, a semiconductor device includes an output buffer circuit. The output buffer circuit includes an output node, a first node, a second node, a first switch circuit, a second switch circuit, and a control circuit.

The output node provides an output potential according to an input signal that attains a first or a second level. The first node is supplied with an output potential corresponding to the first level. The second node is supplied with an output potential corresponding to the second level. The first switch circuit connected between the first node and the output node is rendered conductive/non-conductive by a first control signal according to the input signal. The second switch circuit connected between the second node and the output node is rendered conductive/non-conductive according to the input signal.

The control circuit receives the input signal and a potential of the output node to provide the first control signal. The control circuit renders the first switch circuit non-conductive when the input signal attains the second level, and renders the first switch circuit conductive and then non-conductive so as to follows a change in the potential level of the output node when the input signal shows transition from the second level to the first level.

According to another aspect of the present invention, a semiconductor device includes an output buffer circuit. The output buffer circuit includes an output node, a first node, a second node, a first switch circuit, a second switch circuit, and a control circuit.

The output node provides an output potential according to an input signal attaining either a first or a second level. The first node is supplied with an output potential corresponding to the first level. The second node is supplied with an output potential corresponding to the second level.

The first switch circuit connected between the first node and the output node is rendered conductive/non-conductive by a first control signal according to the input signal. The second switch circuit connected between the second node and the output node is rendered conductive/non-conductive by a second control signal according to the input signal.

The control circuit receives an input signal and a potential of the output node to provide first and second control signals. The control circuit renders conductive one of the first and second switch circuits that is to be rendered to a conductive state from a non-conductive state, and then non-conductive so as to follow a change in the potential level of the output node according to a level change in the input signal.

An advantage of the present invention is to provide a semiconductor device including an output buffer circuit that allows data output while establishing impedance matching with an external data line, and that is suitable for high speed data transmission.

Another advantage of the present invention is to provide a semiconductor device including an output buffer circuit that can realize impedance matching and low power consumption at the same time.

A further advantage of the present invention is to provide a semiconductor device including an output buffer that allows impedance matching even when the power supply potential differs from an external power supply potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS FIRST EMBODIMENT

An SRAM (Static Random Access Memory) according to a first embodiment of the present invention will be described hereinafter with reference to FIGS. 1 and 2.

Figure 1:
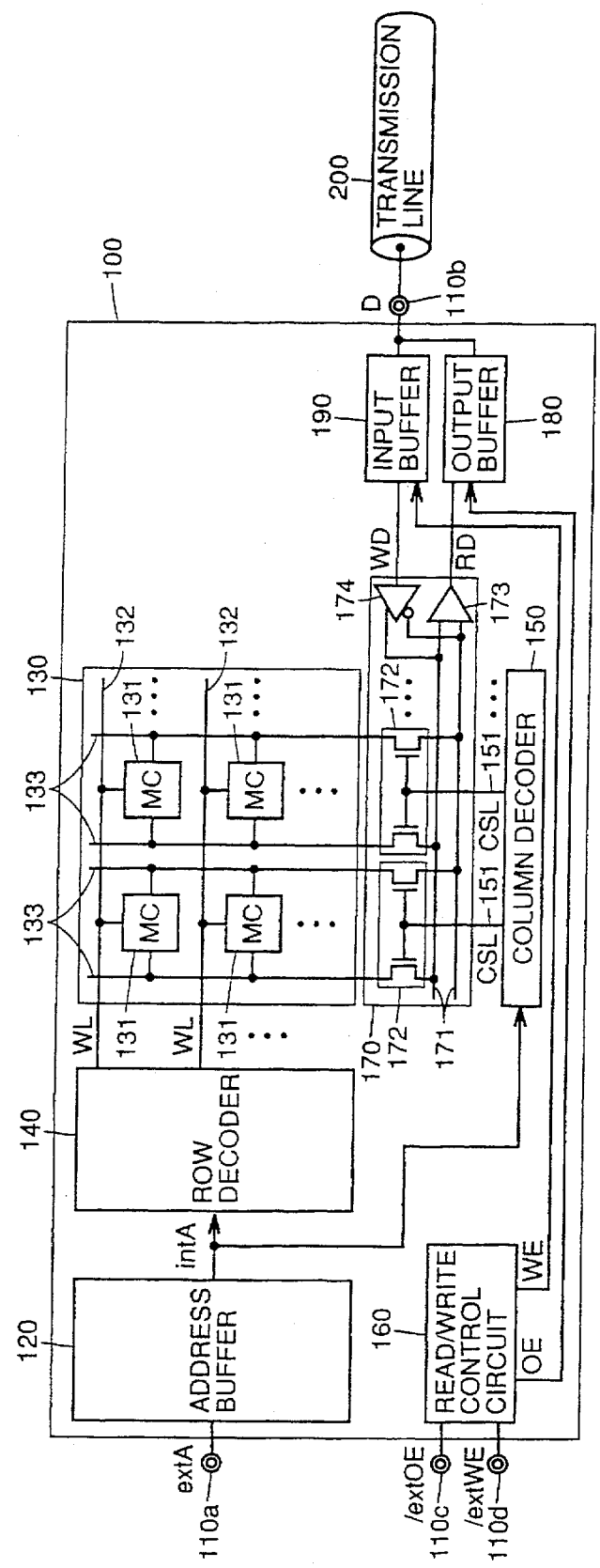
FIG. 1 is a block diagram of an SRAM according to a first embodiment of the present invention.

FIG. 1 is a schematic block diagram showing a structure of the SRAM of the first embodiment. An SRAM 100 receives an external address signal extA via a plurality of address pins 110a. An address buffer 120 receives external address signal extA to provide an internal address signal intA according to this external address signal extA. A memory cell array 130 includes a plurality of memory cells 131 arranged in a plurality of rows and columns, a plurality of word line 132 arranged in a plurality of rows, each word line connected to a plurality of memory cells 131 arranged in a corresponding row, and a plurality of bit line pairs 133 arranged in a plurality of columns, each bit line pair being connected to a plurality of memory cells 131 arranged in a corresponding column. A row decoder 140 responds to internal address signal intA from address buffer 120 to drive a potential WL of a selected word line 132 to an H level (logical high). A column decoder 150 responds to internal address signal intA from address buffer 120 to drive a potential CSL of a selected column select line 151 to an H level. An I/O circuit 170 includes an I/O line pair 171, an I/O gate 172 connected between bit line pair 133 and I/O line pair 171 to receive potential CSL of column select line 151 to render conductive bit line pair 133 and I/O line pair 171 in response to potential CSL attaining an H level, a sense amplifier 173 connected to I/O line pair 171 for providing readout data RD which is an amplification of the potential difference of the pair of I/O lines 171, and a write circuit 174 receiving write data WD to provide a potential difference according to this write data WD to I/O line 171. I/O circuit 170 controls the input and output operation of write data WD and readout data RD with respect to a memory cell selected according to external address signal extA. A read/write control circuit 160 receives an external output enable signal /extOE provided to a control pin 110c and an external write enable signal ext/WE provided at a control pin 110d to provide an output enable signal OE and a write enable signal WE which are inverted versions of the signals. When external output enable signal /extOE attains an L level (logical low), a readout operation is specified with respect to SRAM 100. When external write enable signal /extWE attains an L level, a write operation is specified for SRAM 100.

An RD output buffer circuit 180 receives readout data RD and output enable signal OE from control circuit 160. When output enable signal OE attains an H level (signal /extOE attains an L level), output buffer circuit 180 provides data D according to readout data RD to an input/output pin 110b. An input buffer circuit 190 receives data D applied at input/output pin 110b and write enable signal WE from control circuit 160. When write enable signal WE attains an H level (signal /extWE attains an L level), input buffer circuit 190 provides write data WD according to data D to write circuit 174. Data input/output pin 110b is connected to an external transmission line (data bus) 200, whereby data D is transferred between SRAM 100 and transmission line 200.

Figure 2:
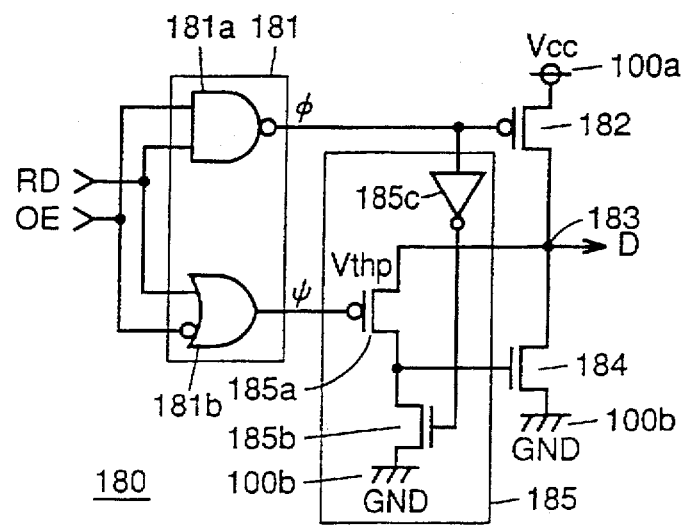
FIG. 2 is a circuit diagram of an output buffer according to the first embodiment of the present invention.

FIG. 2 is a circuit diagram of output buffer circuit 180 in SRAM 100 shown in FIG. 1. Referring to FIG. 2, a data preamplifier 181 receives read data RD from sense amplifier 173 and output enable signal OE from read/write control circuit 160. When output enable signal OE attains an L level of inactivation, data preamplifier 181 provides signals φ and ψ both attaining an H level. During the period where output enable signal OE attains an H level of activation, signals φ and ψ are driven to an L level and an H level, respectively, in response to read data RD attaining an H level, and are driven to an H level and an L level, respectively, in response to read data RD attaining an L level. Preamplifier circuit 181 includes a gate circuit 181a and a gate circuit 181b. Gate circuit 181a receives read data RD and output enable signal OE. When both of these signals attain an H level, gate circuit 181a provides signal φ of an L level, otherwise signal φ of an H level. Gate circuit 181b receives read data RD and output enable signal OE to provide signal ψ of an L level when output enable signal OE attains an L level and read data RD attains an L level, and otherwise signal ψ of an H level.

A p channel pull-up output transistor 182 is connected between a power supply node 100a to which power supply potential $V_{CC}$ is supplied and an output node 183 connected to input/output pin 110b to receive signal φ at its gate. An n channel pull-down output transistor 184 is connected between output node 183 and a ground potential node 100b to which ground potential GND is supplied. A pull-down control circuit 185 receives signals φ and ψ. Pull-down control circuit 185 responds to signal φ of an L level to drive the gate potential of n channel pull-down output transistor 184 to an L level. Pull-down control circuit 185 renders output node 183 and the gate of n channel pull-down output transistor 184 conductive when signal ψ attains an L level and potential D of output node 183 is greater than signal ψ by at least absolute value $V_{thp}$ of the threshold voltage. Pull-down control circuit 185 includes a pull-down gate control transistor 185a, a gate discharge transistor 185b, and an inverter 185b. Pull-down gate control transistor 185a is connected between output node 183 and the gate of n channel pull-down output transistor 184 to receive signal ψ at its gate. Gate discharge transistor 185b is connected between the gate of n channel pull-down output transistor 184 and ground potential node 100b. Inverter 185 receives signal φ and has its output connected to the gate of gate discharge transistor 185b.

In output buffer circuit 180 shown in FIG. 2, output enable signal OE attaining an H level of activation causes signal φ from gate circuit 181a to be driven to an L level and signal ψ from gate circuit 181b to be driven to an H level when read data RD attains an H level. As a result, p channel pull-up output transistor 182 receiving signal φ at its gate is rendered conductive, and inverter 185c receiving signal φ provides a signal of an H level to the gate of gate discharge transistor 185b to render this gate discharge transistor 185b conductive. As a result, n channel pull-down output transistor 184 is rendered non-conductive, whereby potential D of node 183 is increased towards the level of power supply potential $V_{CC}$.

When output enable signal OE attains an H level of activation and read data RD attains an L level, signal φ from gate circuit 181a is driven to an H level and signal ψ from gate circuit 181b is driven to an L level. As a result, p channel pull-up output transistor 182 receiving signal φ at its gate is rendered non-conductive, and inverter 185c receiving signal φ provides a signal of an L level to the gate of gate discharge transistor 185b to render this gate discharge transistor 185b non-conductive. Also, pull-down gate control transistor 185a receiving signal φ at its gate is rendered conductive, and output node 183 and the gate of n channel pull-down output transistor 184 conduct. Thus, n channel pull-down output transistor 184 attains a conductive state, and potential D of output node 183 is reduced. Pull-down gate control transistor 185a is rendered non-conductive when potential D is lowered to the level of absolute value $V_{thp}$ of the threshold voltage of pull-down gate control transistor 185a. The gate potential of n channel pull-down output transistor 184 does not change its level, and potential D of output node 183 attains the level of ground potential GND.

When output enable signal OE attains an L level of inactivation, signals φ and ψ provided from gate circuits 181a and 181b, respectively, both attain an H level regardless of the level of read data RD. Then, p channel up output transistor 182 receiving signal φ at its gate and pull-down gate control transistor 185a receiving signal ψ at its gate are rendered non-conductive. Inverter 185c receiving signal φ provides a signal of an L level to the gate of gate discharge transistor 185b to render this gate discharge transistor 185b non-conductive. As a result, the gate potential of n channel pull-down output transistor 184 maintains its state of that when output enable signal OE was driven to an L level. Therefore, n channel pull-down output transistor 184 attains a non-conductive or a slightly conductive state. Potential D of output node 183 attains a high impedance state or an L level.

Figure 3:
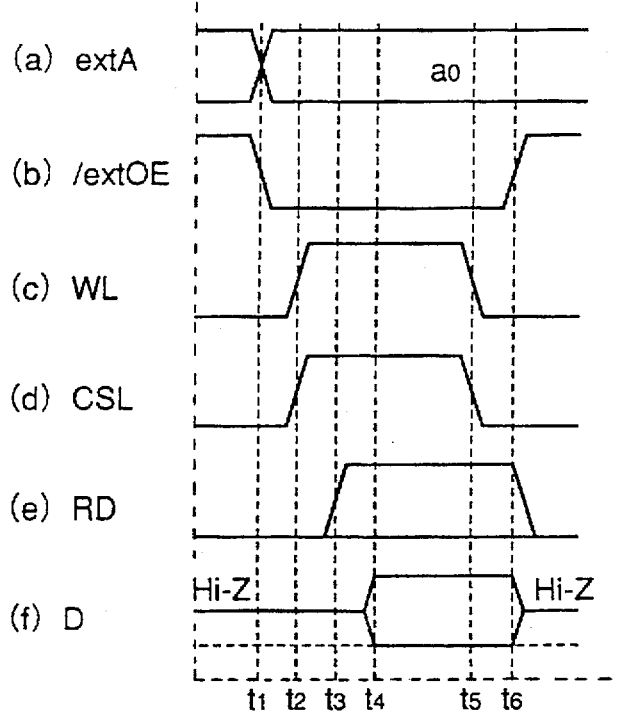
FIG. 3 is a timing chart showing an operation of the SRAM of the first embodiment.

A readout operation of SRAM 100 of the above structure will be described with reference to FIG. 3. When external address signal extA is set to address $A_0$ at time $t_1$ and external output enable signal /extOE is pulled down to an L level, address buffer 120 provides an internal address signal intA according to external address signal extA indicating address $A_0$. Row decoder 140 and column decoder 150 receiving internal address signal intA respectively decode a portion or all of internal address signal intA to select a word line 132 and a column select line 151 according to this internal control signal intA. In other words, row decoder 140 and column decoder 150 drives potential WL of selected word line 132 and potential CSL of column select line 151 to an H level at time $t_2$.

As a result, data stored in memory cell 131 connected to selected word line 132 and bit line pair 133 corresponding to selected column select line 151 is read out as the potential difference to bit line pair 133. This potential difference is provided to I/O line pair 171 via I/O gate 172. Sense amplifier 173 connected to I/O line pair 171 drives read data RD to an H level or an L level at time $t_3$ according to the potential difference transmitted to I/O line pair 171. Output buffer 180 receiving read data RD and output enable signal OE from read/write control circuit 160 drives data D to an H level and an L level when read data RD attains an H level and an L level, respectively, at $t_4$ since output enable signal OE attains an H level of activation.

At time $t_5$ of an elapse of a predetermined time, row decoder 140 and column decoder 150 are inactivated, whereby all word lines 132 and column select lines 151 including the selected lines are driven to an L level. Here, read data RD is maintained independent of the potential difference of the pair of I/O line 171 since sense amplifier 173 has a latching function. Output buffer 180 receiving read data RD continues to provide data D. When external output enable signal /extOE is pulled up to an H level of inactivation at time $t_6$, output enable signal OE from read/write control circuit 160 attains an L level. Data D provided from output buffer 180 attains a high impedance state or an L level shown by the dotted line.

According to SRAM 100 of the first embodiment, the gate potential of n channel pull-down output transistor 184 is lowered following data D (potential of output node 183), so that the impedance of n channel pull-down output transistor 184 matches that of transmission line (data bus) 200. This will be described in further detail with reference to FIG. 4.

Figure 4:
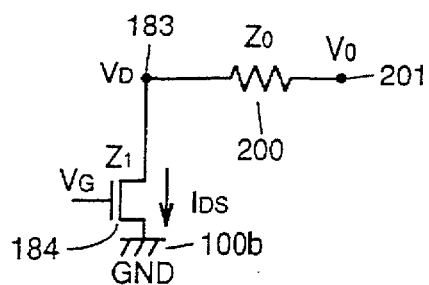
FIG. 4 is an equivalent circuit diagram of an output buffer of the first embodiment.

FIG. 4 is an equivalent circuit diagram of n channel pull-down output transistor 184 and transmission line 200 when data D of an L level is output. It is assumed that impedance $Z_1$ of n channel pull-down output transistor 184 is set to be equal to impedance $Z_0$ of transmission line 200 when the potential of node 201 is charged to the level of power supply potential $V_{CC}$. If gate potential $V_G$ of n channel pull-down output transistor 184 is fixed at the level of power supply potential $V_{CC}$, the gate-source voltage remains fixed. Therefore, drain current $I_{DS}$ flowing through n channel pull-down output transistor 184 is lowered as drain potential $V_D$ is reduced. However, drain current $I_{DS}$ is not lowered in proportion to the reduction of drain potential $V_D$. Therefore, impedance $Z_1$ of n channel pull-down output transistor 184 increases. In other words, impedance $Z_1$ is offset from impedance $Z_0$ to result in mismatch of the impedance.

It is possible to reduce drain current $I_{DS}$ to a level lower than that of the case where gate potential $V_G$ is fixed, by lowering gate potential $V_G$ of n channel pull-down output transistor 184 so as to follow the potential of output node 183, i.e. drain potential $V_D$. Impedance $Z_1$ is suppressed from being increased to result in impedance matching.

Even when the amplitude of transmission line 200 is greater than power supply potential $V_{CC}$ of SRAM 100 and transmission line 200 is charged to a level higher than power supply potential $V_{CC}$ in the first embodiment, the potential of output node 183 is increased, which is to be applied to the gate of n channel pull-down output transistor 184. Therefore, the impedance of n channel pull-down output transistor 184 matches the impedance of transmission line 200 from the beginning of charge being drawn out from output node 183. This will be described in detail with reference to FIG. 4.

It is assumed that impedance of $Z_1$ of n channel pull-down output transistor 184 is set to $Z_0$ when transmission line 200 is charged to the level of power supply potential $V_{CC}$, i.e. when the potential of node 201 attains the level of power supply potential $V_{CC}$. Here, the following relationship is established.

$V_{CC} - V_D = Z_0 \cdot I_{DS}$ and $Z_0 = Z_1$

Therefore, current $I_{DS}$ flowing through n channel pull-down output transistor 184 is:

$I_{DS} = V_{CC}/2Z_0$

When potential $V_0$ of node 201 is higher than power supply potential $V_{CC}$, the gate-source voltage remains fixed if gate potential $V_G$ of n channel pull-down output transistor 184 is fixed at the level of power supply potential $V_{CC}$. In this case, when drain potential $V_D$ exceeds the level of potential $V_{CC} - V_{th}$ which is power supply potential $V_{CC}$ minus the threshold voltage of n channel pull-down output transistor 184, n channel pull-down output transistor 184 operates in a saturation region, and there is substantially no change in current $I_{DS}$. Therefore, impedance $Z_1$ of n channel pull-down output transistor 184 becomes:

$Z_1 = Z_0(2V_0/V_{CC} - 1)$

At the initiation of charge being drawn out from output node 183, impedance $Z_1$ of n channel pull-down output transistor 184 is increased to be offset from $Z_0$. Therefore, mismatch in impedance occurs.

However, when transmission line 200 is charged to a level higher than power supply potential $V_{CC}$, the potential of output node 183 is increased. This higher potential of output node 183 is applied to the gate of n channel pull-down output transistor 184. At the initiation of charge being drawn out from output node 183, impedance $Z_1$ of n channel pull-down output transistor 184 is reduced in comparison with the case where gate potential $V_G$ is fixed to power supply potential $V_{CC}$ to suppress impedance $Z_1$ from being increased. Therefore, the impedance matches at the initiation of charge being drawn out from output node 183.

Figure 5:
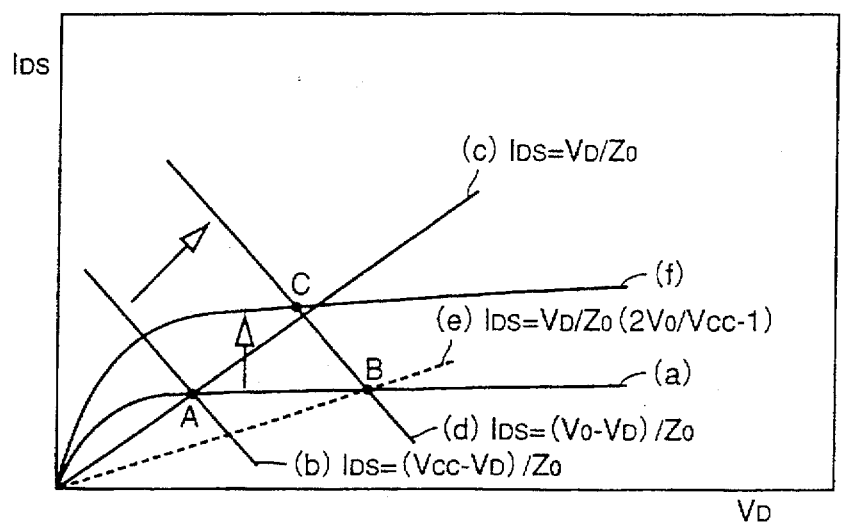
FIG. 5 is a graph showing impedance characteristics of an n channel pull-down transistor of an output buffer of the first embodiment.

FIG. 5 shows drain current $I_{DS}$ with respect to drain current $V_D$. In FIG. 5, (a) is a curve showing the $V_D-I_{DS}$ characteristics of n channel pull-down output transistor 184 when gate potential $V_G$ is low, and (b) is a straight line showing the $V_D-I_{DS}$ characteristics of transmission line 200 when the potential of node 201 attains the level of power supply potential $V_{CC}$. The characteristics of $V_D-I_{DS}$ is represented by $I_{DS}=(V_{CC}-V_D)/Z_0$. $V_D$ and $I_{DS}$ at the crossing point A with curve (a) shows the values of $V_D$ and $I_{DS}$ when the potential of node 201 attains the level of power supply potential $V_{CC}$. (c) is a straight line represented by $I_{DS}=V_D/Z_0$ that passes the crossing point A between curve (a) and straight line (b). A reciprocal of the gradient of this straight line indicates impedance $Z_1$ of n channel pull-down output transistor 184 when gate potential $V_G$ is low. In other words, $Z_1=Z_0$ when the potential of node 201 attains the level of power supply potential $V_{CC}$.

(d) is a straight line showing the $V_D-I_{DS}$ characteristics of transmission line 200 when the potential of node 201 attains $V_0$ which is higher than power supply potential $V_{CC}$. This straight line is represented by $I_{DS}=(V_0-V_D)/Z_0$. $V_D$ and $I_{DS}$ at a crossing point B with curve (a) indicate the values of $V_D$ and $I_{DS}$ when the potential of node 201 attains the level of $V_0$. (e) is a straight line represented by $I_{DS}=V_D/Z_0(2V_0/V_{CC}-1)$ that passes through crossing B between curve (a) and straight line (D). A reciprocal of the gradient of this straight line indicates impedance $Z_1$ of n channel pull-down output transistor 184 when transmission line 200 is charged to a level higher than power supply potential $V_{CC}$ while gate potential $V_G$ is fixed. In other words, $Z_1=Z_0(2V_0/V_{CC}-1)$ is established when the potential of node 201 is $V_0$. (f) is a curve showing the $V_D-I_{DS}$ characteristics of n channel pull-down output transistor 184 when gate potential $V_G$ is high.

It is appreciated from the graph of FIG. 5 that the $V_D-I_{DS}$ characteristics of transmission line 200 changes from straight line (b) to line (d) when the potential of node 201 attains the level of $V_0$ which is higher than power supply potential $V_{CC}$. If gate potential $V_G$ of n channel pull-down output transistor 184 is fixed, the $V_D-I_{DS}$ characteristics of n channel pull-down output transistor 184 remains as curve (a). Therefore, the values of $V_D$ and $I_{DS}$ become the value of crossing B, which is greatly offset from straight line (c). Therefore, the impedance do not match. However, by increasing gate potential $V_G$ of n channel pull-down output transistor 184, the $V_D-I_{DS}$ characteristics of n channel pull-down output transistor 184 changes from curve (a) to curve (f). Therefore, the values of $V_D$ and $I_{DS}$ attain the value of crossing C on straight line (c). Therefore, impedance $Z_1$ of n channel pull-down output transistor 184 substantially equals $Z_0$. Thus, the impedance matches.

When n channel pull-down output transistor 184 of output buffer 180 in SRAM 100 of the first embodiment is rendered conductive, gate discharge transistor 185 is rendered nonconductive, whereby the current path from the gate of n channel pull-down output transistor 184 towards ground potential node 100b is cut off. Therefore, no through current flows in pull-down control circuit 185 to reduce power consumption.

Figure 36:
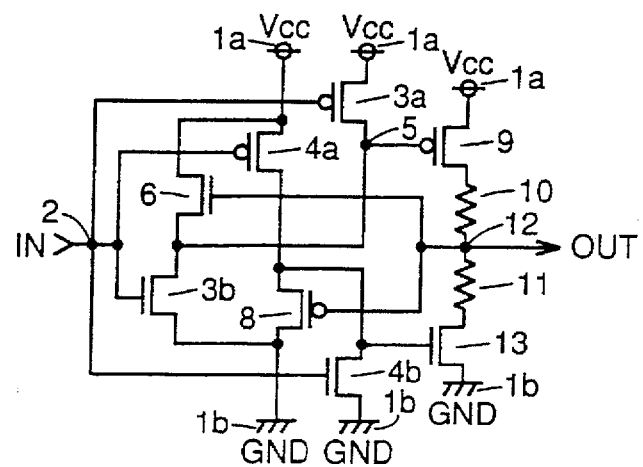
FIGS. 36 and 37 are circuit diagrams showing a conventional driver circuit (output buffer).
Figure 37:
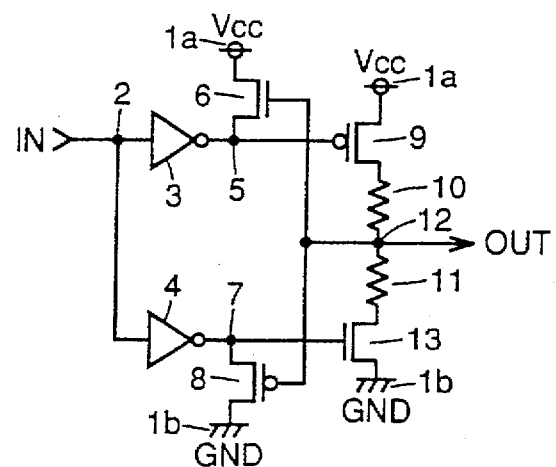
Figure 38:
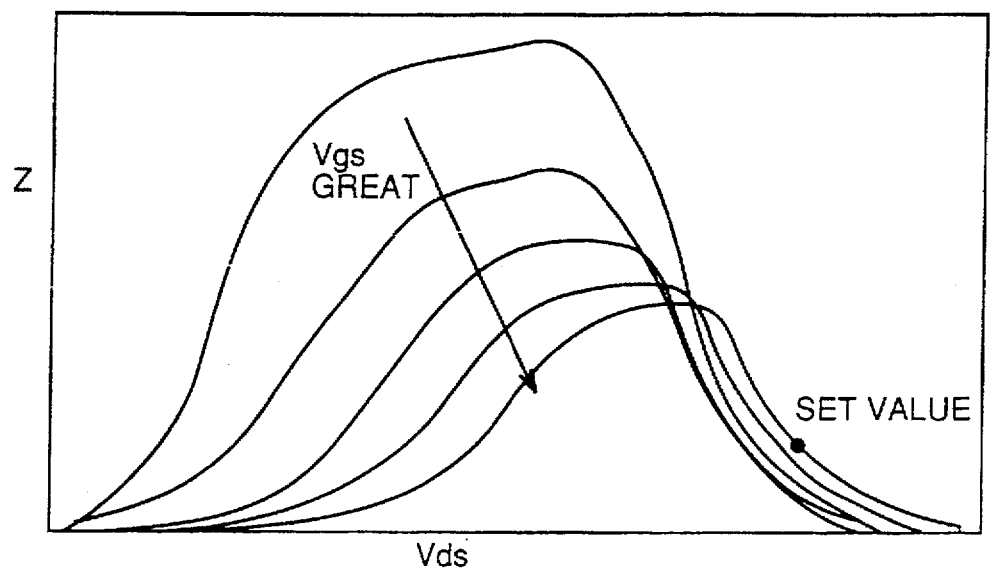
FIG. 38 is a graph showing impedance characteristics of a conventional driver circuit.

It is known that there is a possibility of the potential of node 7 not being reduced following the potential of output node 12 even when p channel transistor 8 is rendered conductive if the sizes of p channel transistors 4a and 8 are not set appropriately in the conventional driver circuit of FIG. 36. In output buffer 180 of the first embodiment, the gate potential of n channel pull-down output transistor 184 can be reduced following the potential of output node 183 even when the size of the transistor forming pull-down control circuit 185 is set to a rough value.

SECOND EMBODIMENT

An SRAM according to a second embodiment of the present invention will be described hereinafter with reference to FIG. 6. The second embodiment differs from first embodiment in the structure of output buffer 180. Components corresponding to those of the first embodiment have the same reference characters allotted, and only differing features will be described.

Figure 6:
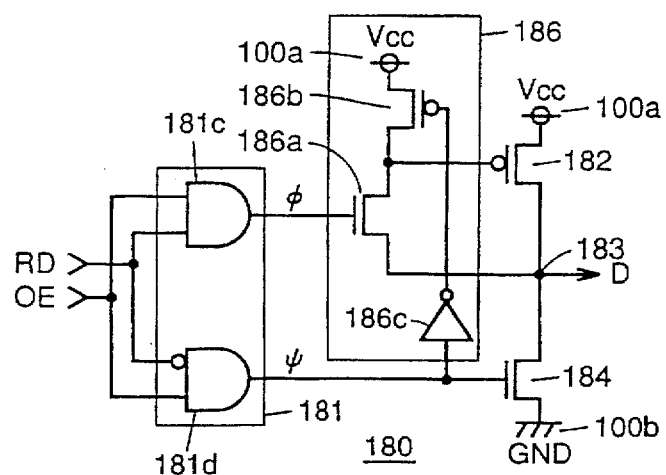
FIGS. 6–26 are circuit diagrams of an output buffer according to second to twenty-second embodiments, respectively, of the present invention.

FIG. 6 is a circuit diagram showing output buffer 180 of the second embodiment. In contrast to output buffer 180 of the first embodiment having the impedance of n channel pull-down output transistor 184 set to match the impedance of transmission line 200, output buffer 180 of the second embodiment has the output impedance of p channel pull-up output transistor 182 set to match the impedance of transmission line 200. Therefore, the structure of data preamplifier 181 differs, and a pull-up control circuit 186 is provided instead of pull-down control circuit 185.

Data preamplifier 181 receives read data RD from sense amplifier 173 and output enable signal OE from read/write control circuit 160 to provide signals $\phi$ and $\psi$ of an L level when output enable signal OE attains an L level of inactivation. When data preamplifier 181 receives output signal OE of an H level of activation and read data RD attains an H level, the output signals $\phi$ and $\psi$ attain an H level and an L level, respectively. When read data RD attains an L level, signals $\phi$ and $\psi$ attain an L level and an H level, respectively.

Data preamplifier circuit 181 includes a gate circuit 181c and a gate circuit 181d. Gate circuit 181c receives read data RD and output enable signal OE. When these signals both attain an H level, signal $\phi$ of an H level is provided, otherwise, signal $\phi$ of an L level is provided.

Gate circuit 181d receives read data RD and output enable signal OE to provide signal $\psi$ of an H level when output enable signal OE attains an H level and read data RD attains an L level, and otherwise signal $\psi$ of an L level.

Pull-up control circuit 186 receives signals $\phi$ and $\psi$ to drive the gate potential of p channel pull-up output transistor 182 to an H level when signal $\psi$ attains an H level. Pull-up control circuit 186 renders output node 183 and the gate of p channel pull-up transistor 182 conductive if signal $\phi$ attains an H level and potential D of output node 183 is lower than the potential of signal $\phi$ by more than at least threshold voltage $V_{thn}$. Pull-up control circuit 186 includes a pull-up gate control transistor 186a, a gate charge transistor 186b and an inverter 186c.

Pull-up gate control transistor 186a is connected between output node 183 and the gate of p channel pull-up output transistor 182 to receive signal $\phi$ at its gate. Gate charge transistor 186b is connected between power supply potential node 100a and the gate of p channel pull-up output transistor 182 to receive signal $\psi$. The output of gate charge transistor 186b is connected to the gate of gate charge transistor 186b.

According to output buffer 180 of FIG. 6, when output enable signal OE attains an H level of activation and read data RD attains an L level, signals $\phi$ and $\psi$ provided from gate circuits 181c and 181d, respectively, attain an L level and an H level, respectively. In response, n channel pull-down output transistor 184 receiving signal $\psi$ at its gate is rendered conductive, and inverter 186c receiving signal $\psi$ provides a signal of an L level to the gate of gate charge transistor 186b, which is rendered conductive. As a result, p channel pull-up output transistor 182 is rendered non-conductive, and potential D of node 183 is lowered towards the level of ground potential GND.

When output enable signal OE attains an H level of activation and read data RD attains an H level, signals φ and ψ provided from gate circuits 181c and 181d, respectively, attain an H level and an L level, respectively. In response, n channel pull-down output transistor 184 receiving signal ψ at its gate is rendered non-conductive, and inverter 186c receiving signal ψ provides a signal of an H level to gate charge transistor 186b, which is rendered non-conductive. As a result, pull-up gate control transistor 186a receiving signal ψ at its gate is rendered conductive, and output node 183 and the gate of p channel pull-up output transistor 182 are rendered conductive. Therefore, p channel pull-up output transistor 182 is rendered conductive. In response, potential D of output node 183 increases. Pull-up gate control transistor 186a is rendered conductive when potential D rises to a level lower than power supply potential $V_{CC}$ by threshold voltage $V_{thn}$. The gate potential of p channel pull-up output transistor 182 is maintained, and potential D of output node 183 attains the level of power supply potential $V_{CC}$.

When output enable signal OE attains an L level of inactivation, signals φ and ψ provided from gate circuits 181c and 181d, respectively, attain an L level independent of the level of read data RD. In response, n channel pull-down output transistor 184 receiving signal ψ at its gate and pull-up gate control transistor 186a receiving signal φ at its gate both attain a non-conductive state. Inverter 186c receiving signal ψ provides a signal of an H level to the gate of gate charge transistor 186b, which is rendered non-conductive. Therefore, the gate potential of p channel pull-up output transistor 182 maintains the state at which output enable signal OE attains an L level. P channel pull-up output transistor 182 attains a non-conductive or a slightly conductive state. Potential D of output node 183 attains a high impedance state or an H level.

In SRAM 100 of the second embodiment, the gate potential of p channel pull-up output transistor 182 is increased following data D (potential of output node 183), when data D of an H level is provided from output buffer 180. Therefore, the impedance of p channel pull-up output transistor 182 matches that of transmission line 200 (data bus).

Furthermore, when p channel pull-up output transistor 182 of output buffer 180 is rendered conductive, gate charge transistor 186b is rendered non-conductive, whereby the current path from power supply potential 100a to the gate of p channel pull-up output transistor 182 is cut off. Therefore, no through current flows to pull-up control circuit 186 to result in a lower power consumption.

If the size of n channel transistors 3b and 6 in the conventional driver circuit of FIG. 36 is not appropriately adjusted, there is a possibility that the potential of node 5 is not increased following the potential of output node 12 even when n channel transistor 6 is rendered conductive. In output buffer 180 of the second embodiment, the gate potential of p channel pull-up output transistor 182 can be increased following the potential of output node 183 even if the size of the transistor forming pull-up control circuit 186 is set to a rough value.

THIRD EMBODIMENT

An SRAM according to a third embodiment of the present invention will be described hereinafter with reference to FIG. 7. The third embodiment differs from the first and second embodiments in the structure of output buffer 180. Components corresponding to those of the first and second embodiments have the same reference characters allotted. Only different features will be described.

In contrast to the first embodiment in which output buffer 180 has only the impedance of n channel pull-down transistor 184 match the impedance of transition line 200 and the second embodiment in which output buffer 180 only has the impedance of p channel pull-up transistor 182 match the impedance of transmission line 200, output buffer 180 of the third embodiment has the output impedances of p channel pull-up output transistor 182 and n channel pull-down output transistor 184 both set to match the impedance of transmission line 200. Therefore, the structure of data preamplifier 181 differs, and pull-down control circuit 185 and pull-up control circuit 186 are both provided.

Data preamplifier 181 receives read data RD from sense amplifier 173 and output enable signal OE from read/write control circuit 160. Data preamplifier 181 provides signal φ and ψ of an L level and an H level, respectively, when output enable signal OE attains an L level of inactivation. When output enable signal OE attains an H level of activation, data preamplifier 181 provides signals φ and t both attaining the same H level and an L level when read data RD attains an H level and an L level, respectively. Similar to the second embodiment, data preamplifier 181 includes a gate circuit 181c receiving read data RD and output enable signal OE to provide a signal φ attaining an H level when the received signals both attain an H level, and otherwise, signal φ of an L level. Data preamplifier 18 also includes a gate circuit 181b receiving read data RD and output enable signal OE to provide signal ψ of an L level when output enable signal OE attains an H level and read data RD attains an L level, otherwise, signal ψ of an H level.

The gate of gate discharge transistor 185b of pull-down control circuit 185 directly receives signal φ differing from the first embodiment. Inverter 185c of pull-down control circuit 185 is eliminated. Furthermore, in contrast to the second embodiment, the gate of gate charge transistor 186b of pull-up control circuit 186 directly receives signal ψ, and inverter 186c of pull-up control circuit 186 is eliminated.

Figure 7:
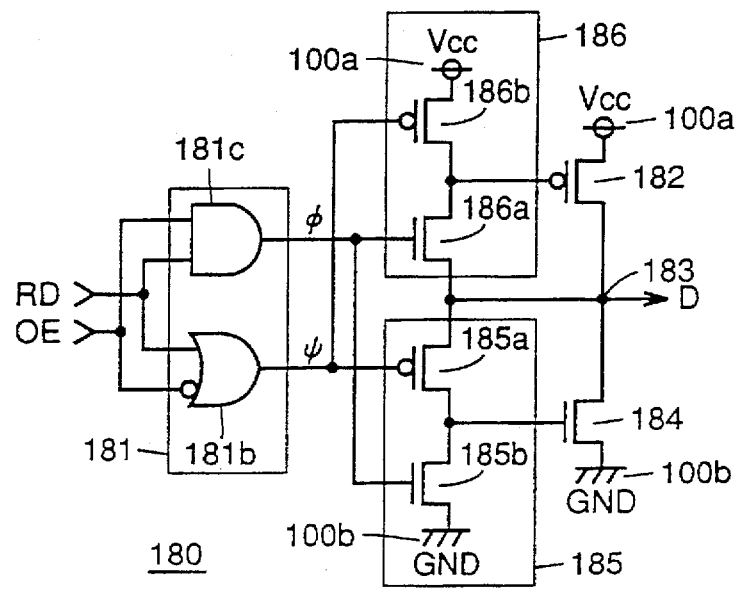

According to output buffer 180 shown in FIG. 7, signal φ provided from gate circuit 180c attains an L level and signal ψ from gate circuit 181b attains an L level when output enable signal OE attains an H level of activation and read data RD attains an L level. Pull-down gate control transistor 185a receiving signal 4 at its gate and gate discharge transistor 186b are rendered conductive. Pull-up gate control transistor 186a receiving signal φ at its gate and gate discharge transistor 185b are rendered non-conductive. As a result, n channel pull-down output transistor 184 is rendered conductive, and p channel pull-up output transistor 182 is rendered non-conductive, whereby potential D of output node 183 is lowered. When potential D of output node 183 becomes as low as the level of absolute value $V_{thp}$ of the threshold voltage of pull-down gate control transistor 185a, pull-down gate control transistor 185a is rendered non-conductive. The gate potential of n channel pull-down output transistor 184 is maintained, and potential D of output node 183 attains the level of ground potential GND.

Signals φ and ψ provided from gate control circuits 181c and 181b, respectively, attain an H level when output enable signal OE attains an H level of activation and read data RD attains an H level. Pull-down gate control transistor 185a and gate charge transistor 186b receiving signal ψ at their gates are rendered non-conductive, and pull-up gate control transistor 186a and gate discharge transistor 185b receiving signal φ at their gates are rendered conductive. As a result, n channel pull-down output transistor 184 is rendered non-conductive, and p channel pull-up output transistor 182 is rendered conductive. Potential D of output node 183 is increased. When potential D of output node 183 increases to a level lower than power supply potential $V_{CC}$ by threshold output voltage $V_{thn}$ of pull-up gate control transistor 186a, pull-up gate control transistor 186a is rendered non-conductive, and the gate potential of p channel pull-up output transistor 182 is maintained. Potential D of output node 183 attains the level of ground potential GND.

When output enable signal OE attains an L level of inactivation, signals φ and ψ provided from gate circuits 181c and 181b, respectively, attain an L level, and an H level, respectively, independent of the level of read data RD. Pull-down gate control transistor 185a and gate charge transistor 186b receiving signal ψ at the gates are rendered non-conductive, and pull-up gate control transistor 186a and gate discharge transistor 185b receiving signal φ at their gates are rendered non-conductive. Therefore, the gate potential of p channel pull-up output transistor 182 and the gate potential of n channel pull-down output transistor 184 maintain the state where output enable signal OE attains an L level. One of p channel pull-up output transistor 182 and n channel pull-down output transistor 184 is rendered non-conductive, and the other is rendered slightly conductive. Potential D of output node 183 attains an H level or an L level.

In SRAM 100 of the third embodiment, the gate potential of n channel pull-down output transistor 184 is reduced following data D (potential of output node 183) when data D of an L level is provided from output buffer 180. Therefore, the impedance of n channel pull-down output transistor 184 matches that of transmission line (data bus) 200.

When the amplitude of transmission line 200 is greater than power supply potential $V_{CC}$ of SRAM 100 and this transmission line 200 is charged to a level higher than power supply potential $V_{CC}$, the potential of output node 183 is increased, which is applied to the gate of n channel pull-down output transistor 184. Therefore, the impedance of n channel pull-down output transistor 184 matches the impedance of transmission line 200 from the initiation of charge being drawn out from output node 183.

When n channel pull-down output transistor 184 of output buffer 180 is rendered conductive, gate discharge transistor 185b is rendered non-conductive, so that the current path from the gate of n channel pull-down output transistor 184 to ground potential node 100b is cut off. Therefore, no through current flows to pull-down control circuit 185 to result in a lower power consumption.

If the size of p channel transistors 4a and 8 are not adjusted appropriately in the conventional driver circuit of FIG. 36, there is a possibility that the potential of node 7 is not reduced to follow the potential of output node 12 even when p channel transistor 8 is rendered conductive. In output buffer 180 of the third embodiment, the gate potential of n channel pull-down output transistor 184 can be reduced following the potential of output node 183 even if the size of the transistor forming pull-down control circuit 185 is set to a rough value.

When data D of an H level is provided from output buffer 180, the gate potential of p channel pull-up output transistor 182 is increased following data (potential of output node 183) D. Therefore, the impedance of p channel pull-up output transistor 182 matches that transmission line (data bus) 200.

When p channel pull-up output transistor 182 of output buffer 180 is rendered conductive, gate discharge transistor 186b is rendered non-conductive, whereby the current path from power supply node 100a to the gate of p channel pull-up output transistor 182 is cut off. Therefore, no through current flows through pull-up control circuit 186 to result in reduction in the power consumption.

If the size of n channel transistors 3b and 6 is not appropriately adjusted in the conventional driver circuit of FIG. 36, there is a possibility that the potential of node 5 does not rise following the potential of output node 12 even when n channel transistor 6 is rendered conductive. In output buffer 180 of the third embodiment, the gate potential of p channel pull-up output transistor 182 is increased following the potential of output node 183 even if the size of the transistor forming pull-up control circuit 186 is set to a rough value.

FOURTH EMBODIMENT

An SRAM according to a fourth embodiment of the present invention will be described hereinafter with reference to FIG. 8. The fourth embodiment differs from the first embodiment in the structure of output buffer 180. Components corresponding to those of the fifth embodiment have the same reference characters allotted, and only different features will be described.

Figure 8:
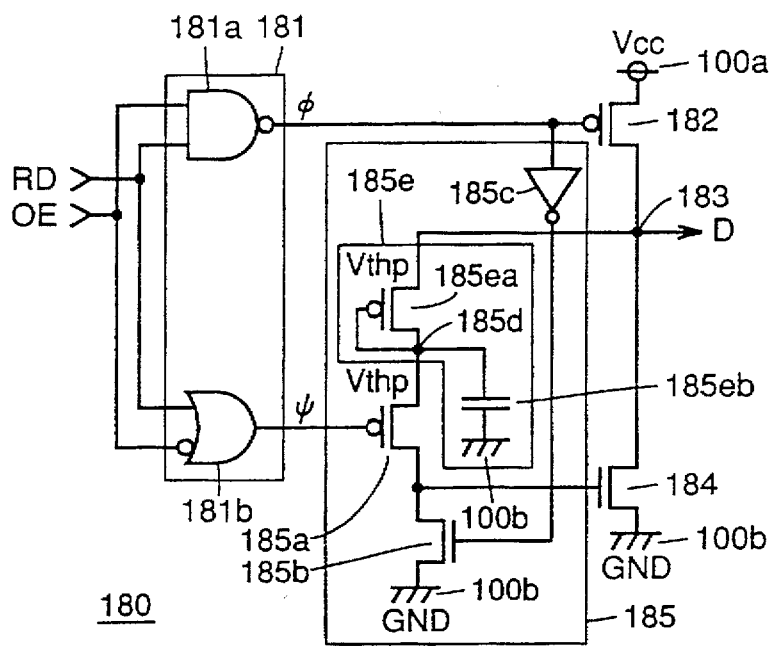

FIG. 8 shows a circuit diagram of output buffer 180 of the fourth embodiment which differs from output buffer 180 of the first embodiment shown in FIG. 2 in the structure of pull-down control circuit 185. Pull-down control circuit 185 of the fourth embodiment includes pull-down gate control transistor 185a, gate discharge transistor 185b and inverter 185c. Pull-down control circuit 185 further includes a hold circuit 185e for maintaining the potential of a node 185d according to potential D of output node 183. Hold circuit 185e includes a p channel MOS transistor 185ea between output node 183 and node 185d, having a gate connected to 185d, and rendered non-conductive when potential D of output node 183 becomes lower than the level of a potential of node 185d plus absolute value $V_{thp}$ of the threshold voltage, and a capacitor 185eb connected between node 185d and ground potential node 100b. Pull-down gate control transistor 185a is connected to output node 183 via p channel MOS transistor 185ea.

In output buffer 180 shown in FIG. 8, when output enable signal OE attains an H level of activation and read data RD attains an H level, signals φ and ψ output from gate circuits 181a and 181b, respectively, attain an L level and an H level, respectively, similar to the first embodiment. As a result, p channel pull-up output transistor 182 receiving signal φ at its gate is rendered conductive, and inverter 185c receiving signal φ provides a signal of an H level to the gate of gate discharge transistor 185b, which is rendered non-conductive. In response, n channel pull-down output transistor 184 is rendered non-conductive, and potential D of node 183 increases to the level of power supply potential $V_{CC}$. Pull-down gate control transistor 185a receiving signal ψ at its gate is rendered non-conductive, and p channel MOS transistor 185ea responds to the rise of potential D of output node 183 to the level of power supply potential $V_{CC}$ to be rendered conductive. When the potential of node 185d increases to the level of $V_{CC}-V_{thp}$, p channel MOS transistor 185ea is rendered non-conductive, whereby the potential of node 185d is maintained.

When output enable signal OE attains an H level and read data RD attains an L level, signals φ and ψ provided from gate circuits 181a and 181b, respectively, attain an H level and an L level, respectively. As a result, p channel pull-up output transistor 182 receiving signal φ at its gate is rendered non-conductive, and inverter 185c receiving signal φ provided a signal of an H level to the gate of gate discharge transistor 185b, which is rendered non-conductive. Also, pull-down gate control transistor 185 receiving signal ψ at its gate is rendered conductive, whereby node 185d maintaining a potential lower than potential D of output node 183 by threshold voltage $V_{thp}$, and the gate of n channel pull-down output transistor 184 conduct. Therefore, n channel pull-down output transistor 184 is rendered conductive, whereby potential D of output node 183 is reduced to the level of ground potential GND.

When output enable signal OE attains an L level of inactivation, signals φ and ψ provided from gate circuits 181a and 181b, respectively, attain an H level irrespective of the level of read data RD. As a result, p channel pull-up output transistor 182 receiving signal φ at its gate and pull-down gate control transistor 185a receiving signal ψ at its gate are rendered non-conductive. Inverter 185c receiving signal φ at its gate provides a signal of an L level to the gate of gate discharge transistor 185b, which is rendered non-conductive. As a result, the gate potential of n channel pull-down output transistor 184 maintains the state when output enable signal OE was driven to an L level, whereby n channel pull-down output transistor 184 is rendered non-conductive or conductive. Potential D of output node 183 attains a high impedance state or an L level.

Even when the amplitude of transmission line 100 is greater than power supply potential $V_{CC}$ of SRAM 100 and transmission line 200 is charged to a level higher than power supply potential $V_{CC}$, the potential of output node 183 is correspondingly increased to result in a higher potential of node 185d. This potential is provided to the gate of n channel pull-down output transistor 184. Therefore, the impedance of n channel pull-down output transistor 184 matches the impedance of transmission line 200 from the initiation of charge being drawn out from output node 183.

When n channel pull-down output transistor 184 of output buffer 180 is rendered conductive, gate discharge transistor 185b is rendered non-conductive, whereby the current path from the gate of n channel pull-down output transistor 184 to ground potential node 100b is cut off. Therefore, no through current flows to pull-down control circuit 185 to result in a lower power consumption.

The provision of capacitor 185ed allows the potential of node 185d to be stored for a predetermined time period according to the potential D of output node 183. Therefore, the gate potential of n channel pull-down output transistor 184 can be controlled stably.

FIFTH EMBODIMENT

An SRAM according to a fifth embodiment of the present invention will be described hereinafter with reference to FIG. 9. The fifth embodiment differs from the second embodiment in the structure of output buffer 180. Components corresponding to those of the second embodiment have the same reference characters allotted, and only different features will be described. 7

Figure 9:
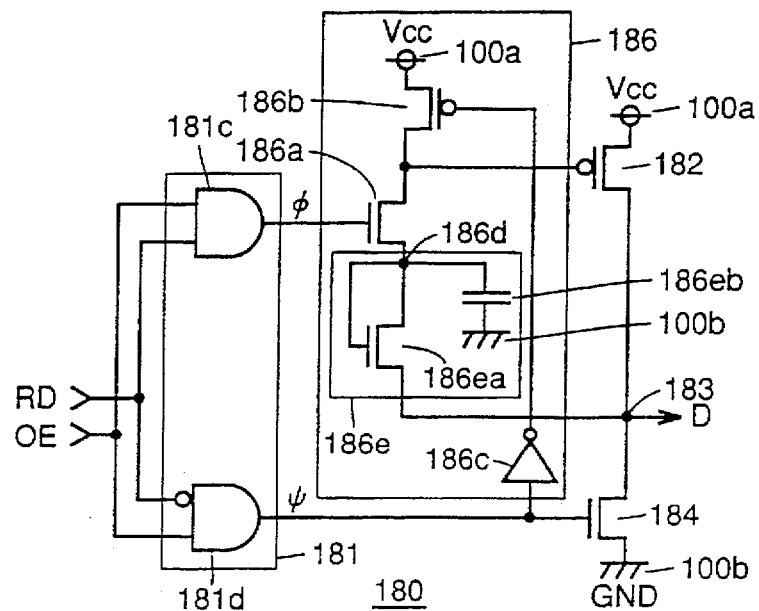

FIG. 9 is a circuit diagram showing an output buffer 180 of the fifth embodiment differing in the structure of pull-up control circuit 186. Pull-up control circuit 186 of the fifth embodiment includes pull-up gate control transistor 186a, gate charge transistor 186b, and inverter 186b. Pull-up control circuit 186 further includes a hold circuit 186e for maintaining the potential of a node 186d according to the potential of output node 183. Hold circuit 186e includes an n channel MOS transistor 186ea between output node 183 and node 186d, having a gate connected to node 186d, and rendered non-conductive when potential D of output node 183 is higher than the potential of node 186d minus threshold voltage $V_{thn}$, and a capacitor 186eb connected between node 186d and ground potential node 100b. Therefore, pull-up gate control transistor 186a is connected to output node 183 via n channel MOS transistor 186ea.

When output enable signal OE attains an H level of activation and read data RD attains an L level in output buffer 180 of FIG. 9, signals ψ and φ provided from gate circuits 181d and 181c attain an H level and an L level, respectively, similar to the second embodiment. In response n channel pull-down output transistor 184 receiving signal ψ at its gate is rendered conductive, and inverter 186c receiving signal ψ provides a signal of an L level to the gate of gate charge transistor 186b, which is rendered conductive. As a result, p channel pull-up output transistor 182 is rendered non-conductive. Potential D of node 183 is lowered to the level of ground potential GND. Pull-up gate control transistor 186a receiving signal ψ at its gate is rendered non-conductive, and n channel MOS transistor 186ea is rendered conductive in response to potential D of output node 183 being lowered to the level of ground potential GND. When the potential of node 186d is lowered to the level of $V_{thn}$, and n channel MOS transistor 186ea is rendered non-conductive, and the potential of node 186d is maintained.

When output enable signal OE attains an H level of activation and read data RD attains an H level, signals ψ and φ provided from gate circuits 181d and 181c, respectively, attain an L level and an H level, respectively. In response, n channel pull-down output transistor 184 receiving signal ψ at its gate is rendered non-conductive, and inverter 186c receiving signal ψ at its gate provides a signal of an H level to the gate of gate charge transistor 186b, which is rendered non-conductive. Also, pull-up gate control transistor 186a receiving signal φ at its gate is rendered conductive, and node 186d maintaining threshold voltage $V_{thn}$ and the gate of p channel pull-up output transistor 182 conduct. As a result, p channel pull-up output transistor 182 is rendered conductive, and potential D of output node 183 rises to the level of power supply potential $V_{CC}$.

When output enable signal OE attains an L level of inactivation, signals φ and ψ provided from gate circuits 181c and 181d, respectively, attain an L level independent of the level of read data RD. In response, n channel pull-down output transistor 184 receiving signal ψ at its gate and pull-up gate control transistor 186a receiving signal φ at its gate are rendered non-conductive. Inverter 186c receiving signal ψ at its gate provides a signal of an H level to the gate of gate charge transistor 186b which is rendered non-conductive. Therefore, the gate potential of p channel pull-up output transistor 182 maintains the state when output enable signal OE was driven to an L level. P channel pull-up output transistor 182 is rendered non-conductive, or conductive, and potential D of output node 183 attains a high impedance state or an H level.

In SRAM 100 of the fifth embodiment, gate charge transistor 186b is rendered non-conductive when p channel pull-up output transistor 182 of output buffer 180 is rendered conductive, whereby the current path from power supply potential node 100a to the gate of p channel pull-up output transistor 182 is cut off. Therefore, no through current flows to pull-up control circuit 186 to reduce the power consumption.

The provision of capacitor 186eb allows the potential of node 186d according to potential D of output node 183 to be stored for a predetermined time period. Therefore, the gate potential of p channel pull-up output transistor 184 can be controlled stably.

SIXTH EMBODIMENT

An SRAM according to a sixth embodiment of the present invention will be described hereinafter with reference to FIG. 10. The sixth embodiment differs from the third embodiment in the structure of output buffer 180. Components corresponding to those of the third embodiment have the same reference characters allotted, and only different features will be described.

Figure 10:
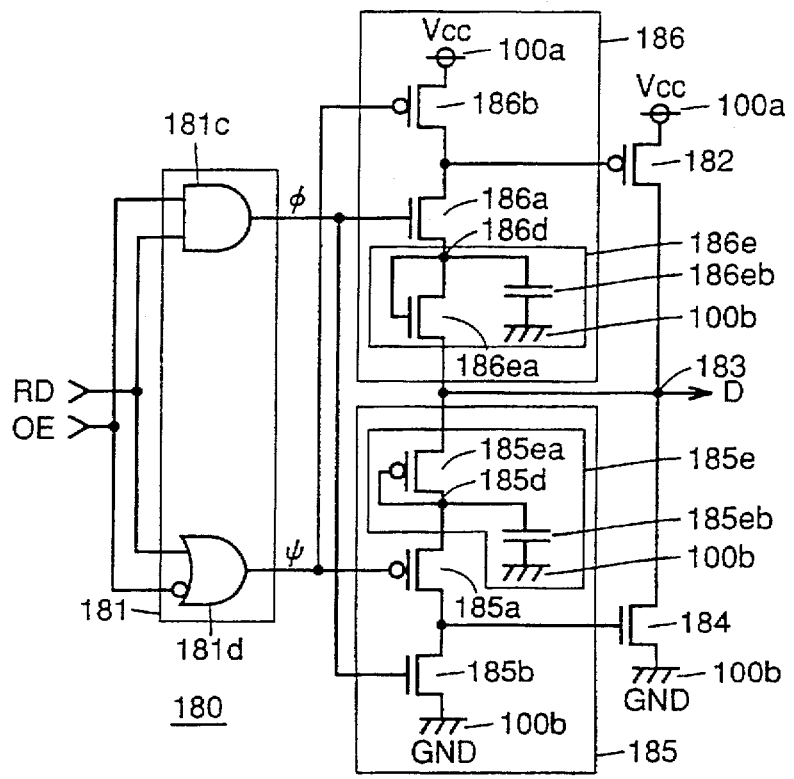

FIG. 10 is a circuit diagram showing output buffer 180 of the sixth embodiment. Output buffer 180 of the sixth embodiment differs from output buffer 180 of the third embodiment shown in FIG. 7 in the structure of pull-down control circuit 185 and pull-up control circuit 186. Pull-down control circuit 185 of the fifth embodiment includes a hold circuit 185e having a p channel MOS transistor 185ea and a capacitor 185eb, in addition to pull-down gate control transistor 185a and gate discharge transistor 185b, similar to the fourth embodiment. It is to be noted that the gate of gate discharge transistor 185b directly receives signal $\phi$ in contrast to the fourth embodiment. Furthermore, inverter 185c is eliminated.

Pull-up control circuit 186 includes a hold circuit 186e with an n channel MOS transistor 186ea and a capacitor 186eb, in addition to pull-up gate control transistor 186a and gate discharge transistor 186b, similar to the fifth embodiment. It is to be noted that the gate of gate discharge transistor 186b of pull-up control circuit 186 directly receives signal $\psi$, in contrast to the fifth embodiment. Also, inverter 186c is removed.

In output buffer 180 of FIG. 10, when output enable signal OE attains an H level of activation and read data RD attains an L level, signals $\phi$ and $\psi$ provided from gate circuits 181c and 181b, respectively, attain an L level, similar to the third embodiment. Pull-down gate control transistor 185a and gate discharge transistor 186b receiving signal $\psi$ at their gates are rendered conductive, and pull-up gate transistor 186a and gate discharge transistor 185b receiving signal $\phi$ at their gates are rendered non-conductive. As a result, n channel pull-down output transistor 184 is rendered conductive, and p channel pull-up output transistor 182 is rendered non-conductive. Potential D of output node 183 is lowered towards the level of ground potential GND.

When output enable signal OE attains an H level of activation and read data RD attains an H level, signals $\phi$ and $\psi$ provided from gate circuits 181c and 181b, respectively, attain an H level. In response, pull-down gate control circuit 185a and gate charge transistor 186b receiving signal $\psi$ at their gates are rendered non-conductive, and pull-up gate control transistor 186a and gate discharge transistor 185b receiving signal $\phi$ at their gates are rendered conductive. As a result, n channel pull-down output transistor 184 is rendered non-conductive and p channel pull-up output transistor 182 is rendered conductive. Potential D of output node 183 is increased towards the level of power supply potential $V_{CC}$.

When output enable signal OE attains an L level of inactivation, signals $\phi$ and $\psi$ provided from gate circuits 181c and 181b, respectively, attain an L level and an H level, respectively, irrespective of the level of read data RD. In response, pull-down gate control transistor 185a and gate discharge transistor 186b receiving signal $\psi$ at their gates are rendered non-conductive, and pull-up gate control transistor 186a and gate discharge transistor 185a receiving signals $\phi$ at their gates are rendered non-conductive. Therefore, the gate potential of p channel pull-up output transistor 182 and the gate potential of n channel pull-down output transistor 184 maintain the state when output enable signal OE was driven to an L level, whereby one of p channel pull-up output transistor 182 and n channel pull-down output transistor 184 is rendered non-conductive, and the other conductive. Potential D of output node 183 attains an H level or an L level.

According to SRAM 100 of the sixth embodiment, even when the amplitude of transmission line 200 is greater than power supply potential $V_{CC}$ of SRAM 200 and transmission line 200 is charged to a level higher than power supply potential $V_{CC}$, the potential of output node 183 is correspondingly increased and applied to the gate of n channel pull-down output transistor 184. Therefore, the impedance of n channel pull-down output transistor 184 matches that of transmission line 200 at the initiation of charge being drawn out from output node 183.

When n channel pull-down output transistor 184 of output buffer 180 is rendered conductive, gate discharge transistor 185b is rendered non-conductive, whereby the current path from the gate of n channel pull-down output transistor 184 to ground potential node 100b is cut off. Therefore, no through current flows to pull-down control circuit 185 to result in reduction in power consumption.

When p channel pull-up output transistor 182 of output buffer 180 is rendered conductive, gate discharge transistor 186b is rendered non-conductive, whereby the current path from power supply potential node 100a to the gate of p channel pull-up output transistor 182 is cut off. Therefore, no through current flows to pull-up control circuit 186, so that power consumption is reduced.

The provision of capacitor 185eb allows the potential of node 186d according to potential D of output node 183 to be stored for a predetermined time period. Therefore, the gate potential of p channel pull-up output transistor 184 can be controlled stably.

SEVENTH EMBODIMENT

An SRAM according to a seventh embodiment of the present invention will be described hereinafter with reference to FIG. 11. The seventh embodiment differs from the fourth embodiment in the structure of output buffer 180. Components corresponding to those of the fourth embodiment have the same reference characters allotted, and only different features will be described.

Figure 11:
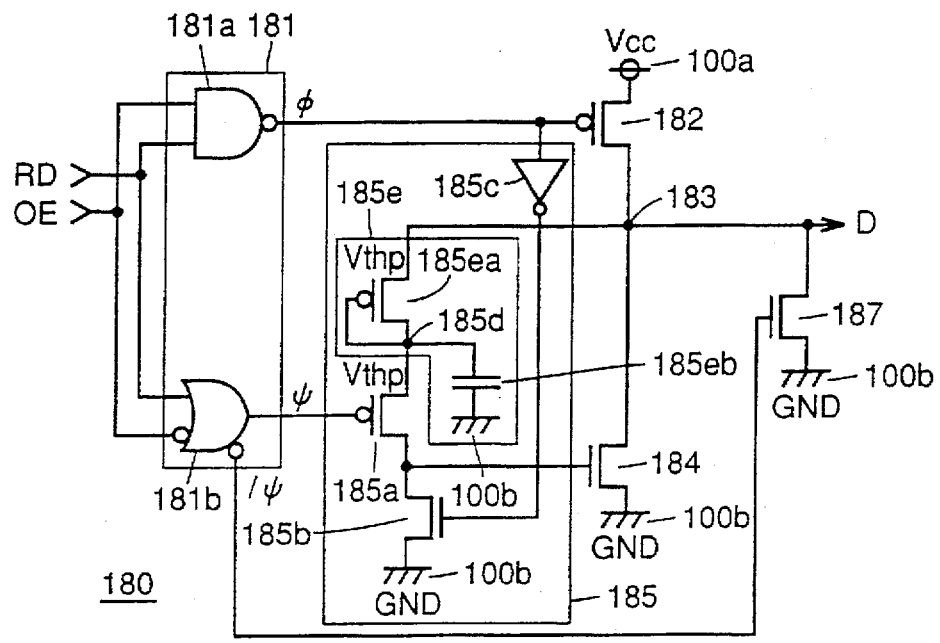

FIG. 11 is a circuit diagram showing output buffer 180 of the seventh embodiment. Output buffer 180 of the seventh embodiment differs from output buffer 180 of the fourth embodiment shown in FIG. 8 in that gate circuit 181b of data preamplifier 181 provides not only signal $\psi$, but also an inverted signal /$\psi$, and that an n channel pull-down output transistor 187 connected between output node 183 and ground potential node 100b for receiving signal /$\psi$ at its gate is further included. According to output buffer 180 shown in FIG. 11, n channel pull-down output transistor 187 is rendered conductive when signal /$\psi$ provided from gate circuit 181b attains an H level, i.e. when output enable signal OE attains an H level and read data RD attains an L level, and otherwise rendered non-conductive.

SRAM 100 of the seventh embodiment has advantages similar to those of the fourth embodiment. Since n channel pull-down output transistor 187 that is directly controlled by signal /ψ is newly provided, potential D of output node 183 is pulled down at high speed to improve the access rate.

EIGHTH EMBODIMENT

An SRAM according to an eighth embodiment of the present invention will be described hereinafter with reference to FIG. 12. The eighth embodiment differs from the fifth embodiment in the structure of output buffer 180. Components corresponding to those of the fifth embodiment have the same reference characters are allotted, and only different features will be described.

Figure 12:
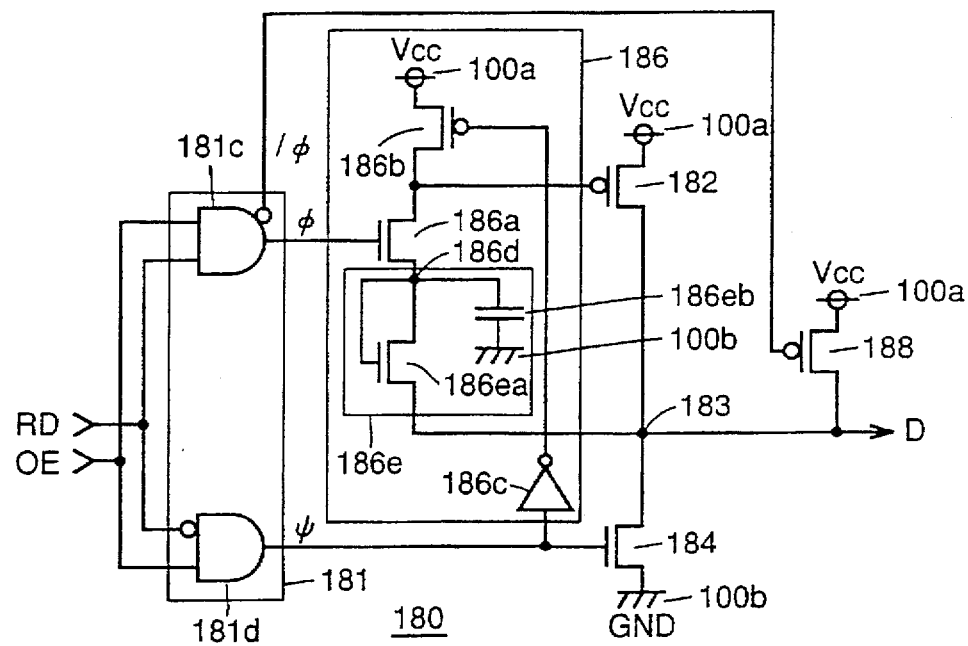

FIG. 12 is a circuit diagram showing output buffer 180 of the eighth embodiment. Output buffer 180 of FIG. 12 differs from output buffer 180 of the fifth embodiment shown in FIG. 9 in that gate circuit 181c of data preamplifier 181 provides not only signal φ but also an inverted signal /φ, and that a p channel pull-up output transistor 188 is further provided, which is connected between power supply potential node 100a and output node 183 for receiving signal /φ at its gate. According to output buffer 180 of FIG. 12, p channel pull-up output transistor 188 is rendered conductive, when signal /φ provided from gate circuit 181c attains an L level, i.e. when output enable signal OE attains an H level and read data RD attains an H level, and otherwise rendered nonconductive.

SRAM 10 of the eighth embodiment provides advantages similar to those of the fifth embodiment. Since p channel pull-up output transistor 188 is newly provided that is directly controlled by signal /φ, potential D of output node 183 is increased at high speed to improve the access rate.

NINTH EMBODIMENT

An SRAM according to a ninth embodiment of the present invention will be described hereinafter with reference to FIG. 13. The ninth embodiment differs from the sixth embodiment in the structure of output buffer 180. Components corresponding to those of the sixth embodiment have the same reference characters allotted, and only different features will be described.

Figure 13:
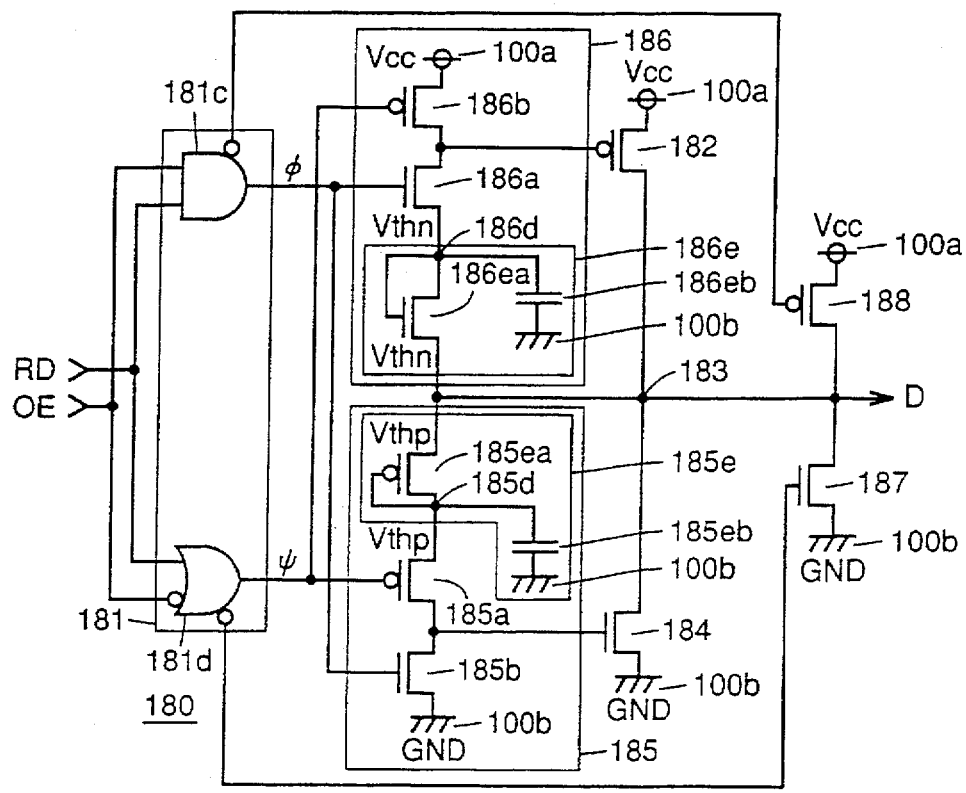

FIG. 13 is a circuit diagram of output buffer 180 of the ninth embodiment. Output buffer 180 of the ninth embodiment differs from output buffer 180 of the sixth embodiment shown in FIG. 10 in that gate circuit 181c of data preamplifier 181 provides not only a signal φ, but also an inverted signal /φ, similar to the eighth embodiment, and that gate circuit 181b provides not only signal ψ, but also an inverted signal /ψ, similar to the seventh embodiment. Furthermore, a p channel pull-up output transistor 188 connected between power supply potential node 100a and output node 183 for receiving signal φ at its gate is provided similar to the eighth embodiment, and an n channel pull-down output transistor 187 connected between output node 183 and ground potential node 100b for receiving signal /ψ is provided, similar to the seventh embodiment. According to output buffer 180 shown in FIG. 13, p channel pull-up output transistor 188 attains a conductive state when signal /φ provided from gate circuit 181b attains an L level, i.e. when output enable signal OE attains an L level and read data RD attains an H level, and otherwise is rendered non-conductive. Also, when output signal /ψ from gate circuit 181b attains an H level, i.e., when output enable signal OE attains an H level and read data RD attains an L level, n channel pull-down output transistor 187 is rendered conductive, otherwise rendered non-conductive.

SRAM 100 of the ninth embodiment provides advantages similar to those of the sixth embodiment. The provision of p channel pull-up output transistor 181 directly controlled by signal /φ and n channel pull-down output transistor 187 directly controlled by signal /ψ allows potential D of output node 183 to be altered at high speed to improve the access rate.

TENTH EMBODIMENT

An SRAM according to a tenth embodiment of the present invention will be described hereinafter with reference to FIG. 14. The tenth embodiment differs from the fourth embodiment in the structure of output buffer 180. Components corresponding to those of the fourth embodiment have the same reference characters allotted, and only different features will be described.

Figure 14:
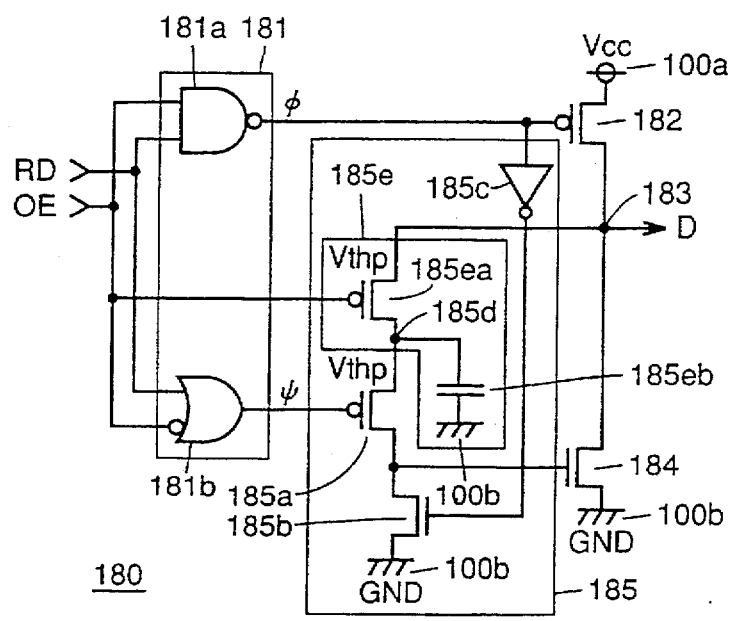

FIG. 14 is a circuit diagram showing output buffer 180 according to the tenth embodiment. Output buffer 180 of the tenth embodiment differs from output buffer 180 of the fourth embodiment shown in FIG. 8 in that the gate of p channel MOS transistor 185ea in hold circuit 185e of pull-down control circuit 185 receives output enable signal OE without being connected to node 185d. This p channel MOS transistor 185ea is rendered conductive and nonconductive when output enable signal OE attains an L level and an H level, respectively.

SRAM 100 of the tenth embodiment provides advantages similar to those of the fourth embodiment. Furthermore, no unnecessary current flows due to p channel MOS transistor 185ea being controlled by output enable signal OE.

ELEVENTH EMBODIMENT

An SRAM according to an eleventh embodiment of the present invention will be described hereinafter with reference to FIG. 15. The eleventh embodiment differs from the fifth embodiment in the structure of output buffer 180. Component corresponding to those of the fifth embodiment of the same reference characters allotted, and only different features will be described.

Figure 15:
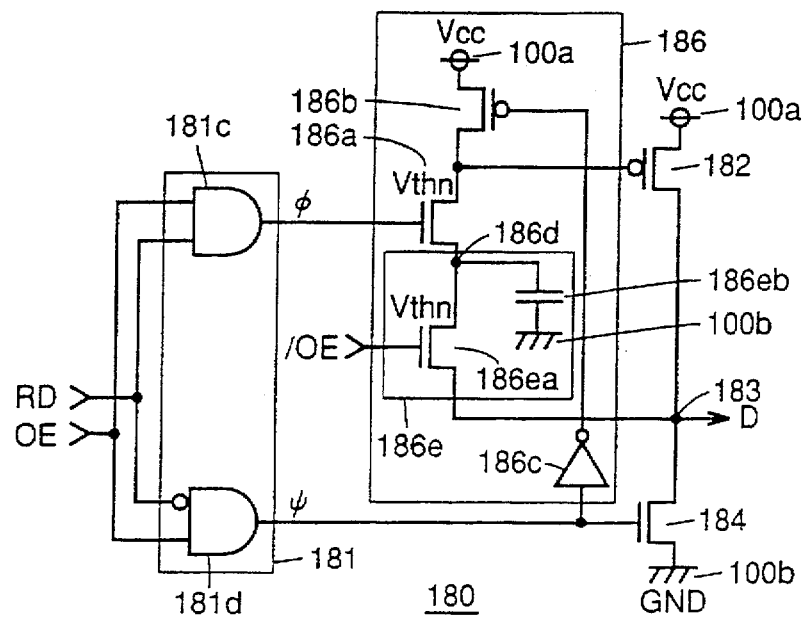

FIG. 15 shows a circuit diagram of output buffer 180 of the eleventh embodiment. Output buffer 180 of the eleventh embodiment differs from output buffer 180 of the fifth embodiment shown in FIG. 9 in that the gate of n channel MOS transistor 186ea in hold circuit 186e of pull-down control circuit 186 receives inverted signal /OE of output enable signal OE without being connected to node 186d. This n channel MOS transistor 186ea is rendered conductive and non-conductive when output enable signal OE attains an L level and an H level, respectively.

SRAM 100 of the eleventh embodiment provides advantages similar to those of the fifth embodiment. Furthermore, no unrequired current flows due to n channel MOS transistor 186ea being controlled by output enable signal OE.

TWELFTH EMBODIMENT

An SRAM according to a twelfth embodiment of the present invention will be described hereinafter with reference to FIG. 16. The twelfth embodiment differs from the sixth embodiment in the structure of output buffer 180. Components corresponding to those of sixth embodiments have the same reference characters allotted, and only different features will be described.

Figure 16:
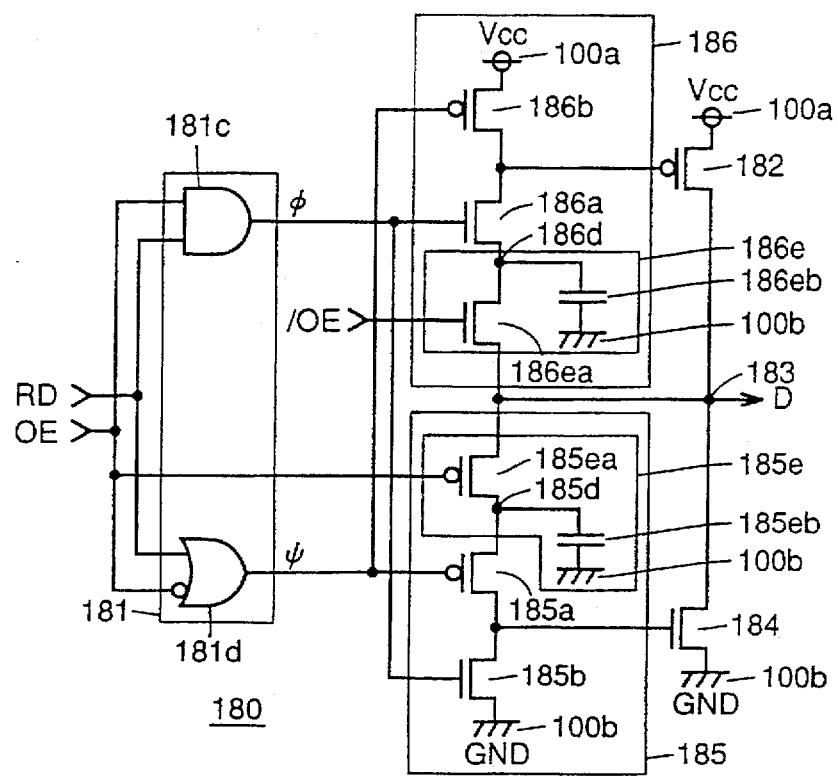

FIG. 16 is a circuit diagram of output buffer 180 of the twelfth embodiment which differs from output buffer 180 of the sixth embodiment shown in FIG. 10 in that p channel MOS transistor 185ea of hold circuit 185e of pull-down control circuit 185 receives output enable signal OE at its gate, similar to the tenth embodiment, and n channel MOS transistor 186ea of hold circuit 186e of pull-up control circuit 186 receives inverted signal /OE of output enable signal OE similar to the eleventh embodiment. When output enable signal OE attains an L level and an H level, p channel MOS transistor 185ea is rendered conductive and non-conductive, respectively, and n channel MOS transistor 186ea attains a conductive state and a non-conductive state, respectively.

SRAM 100 of the twelfth embodiment provides advantages similar to those of the sixth embodiment. Furthermore, no unnecessary current flows due to p channel MOS transistor 185ea and n channel MOS transistor 186ea being controlled by output enable signal OE.

THIRTEENTH EMBODIMENT

An SRAM according to a thirteenth embodiment of the present invention will be described hereinafter with reference to FIG. 17. The thirteenth embodiment differs from the third embodiment in the structure of output buffer 180. Components corresponding to those of the third embodiment has the same reference characters allotted, and only different features will be described.

Figure 17:
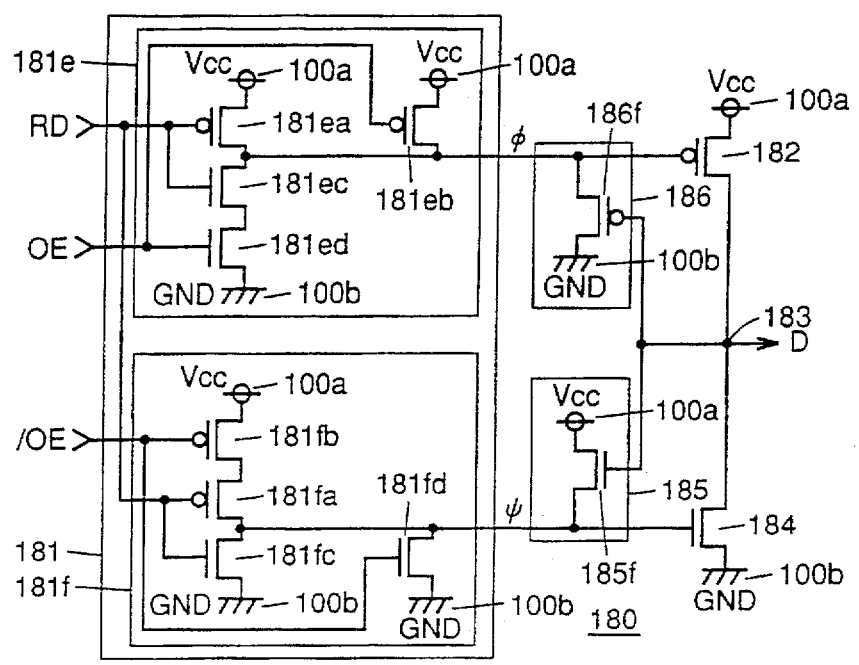

FIG. 17 is a circuit diagram showing an output buffer 180 according to the thirteenth embodiment. Output buffer 180 of the fifteenth embodiment differs from output buffer 180 of the third embodiment shown in FIG. 7 in the structure of data preamplifier 181, pull-down control circuit 185, and pull-up control circuit 186. Data preamplifier 181 of the thirteenth embodiment includes an NAND gate circuit 181e of p channel MOS transistors 181ea and 181eb and n channel MOS transistors 181eb and 181ed, receiving read data RD and output enable signal OE to provide signal φ of an L level when both received signals attain an H level, otherwise signal φ of an H level, and an NOR gate circuit 181f of p channel MOS transistors 181fa and 181fb and n channel MOS transistors 181fc and 181fd receiving read data RD and output signal /OE which is an inverted version of output enable signal OE to provide signal ψ of an H level when both signal attain an L level, otherwise signal ψ of an L level.

Pull-down control circuit 185 of the thirteenth embodiment includes an n channel MOS transistor 185f connected between power supply potential node 100a and the gate of n channel pull-down output transistor 184, and having a gate connected to output node 183. Pull-up control circuit 186 includes a p channel MOS transistor 186f connected between the gate of p channel pull-up output transistor 182 and ground potential node 100b, and having a gate connected to output node 183.

According to output buffer 180 of FIG. 17, when output enable signal OE attains an H level of activation (signal /OE attains an L level of activation) and read data RD attains an H level, p channel MOS transistors 181ea and 181eb in NAND gate circuit 181e are rendered non-conductive, and n channel MOS transistor 181ec and p channel MOS transistor 186f in pull-up control circuit 186 drive signal φ which is the gate potential of p channel pull-up output transistor 182 to an L level. P channel MOS transistor 186f is rendered conductive when signal φ becomes higher than potential D of output node 183 by at least absolute value $V_{thp}$ of the threshold value to compensate for n channel MOS transistor 181ec. Here, signal φ attains an L level. P channel MOS transistor 181fa in NOR gate circuit 181f is rendered non-conductive and n channel MOS transistor 181fc is rendered conductive. Signal ψ attains an L level.

P channel pull-up output transistor 182 receiving signal φ at its gate is rendered conductive, and n channel pull-down output transistor 184 receiving signal ψ at its gate is rendered non-conductive. Here, potential D of output node 183 is increased towards the H level. As a result, p channel MOS transistor 186f is rendered non-conductive, and n channel MOS transistor 185f is rendered conductive, whereby signal φ attains the level of ground potential GND. Signal ψ attains the level of the divided voltage of n channel MOS transistor 185f and n channel MOS transistor 181fc. More specifically, signal t is driven to an L level where n channel pull-down output transistor 184 is rendered non-conductive.

When output enable signal OE attains an H level of activation (signal /OE attains an L level of activation) and read data RD attains an L level, p channel MOS transistor 181ea and n channel MOS transistor 181ec are rendered conductive and non-conductive, respectively, in NAND gate circuit 181e, whereby signal φ attains an H level. N channel MOS transistors 181fc and 181fd in NOR gate circuit 181f are rendered non-conductive. P channel MOS transistor 181fa and n channel MOS transistor 185f in pull-down control circuit 185 drives signal ψ which is the gate potential of n channel pull-down output transistor 184 to an H level. N channel MOS transistor 185f is rendered conductive when signal ψ is lower than potential D of output node 183 by more than the threshold voltage to compensate for p channel MOS transistor 181fa. Here, signal ψ attains an H level.

P channel pull-up output transistor 182 receiving signal φ at its gate is rendered non-conductive, and n channel pull-down output transistor 184 receiving signal ψ at its gate is rendered conductive, whereby potential D of output node 183 is pulled down towards an L level. As a result, p channel MOS transistor 186f is rendered conductive, and n channel MOS transistor 185f is rendered non-conductive. Signal ψ attains the level of power supply potential $V_{CC}$, and signal φ attains the level of a divided voltage of p channel MOS transistor 186f and p channel MOS transistor 181ea. More specifically, signal φ is driven to an H level where p channel pull-up output transistor 182 is rendered non-conductive.

When output enable signal OE attains an L level of inactivation (signal /OE attains an H level of inactivation), signals φ and ψ provided from NAND gate circuit 181e and NOR gate circuit 181f, respectively, attain an H level and an L level, respectively, independent of the level of read data RD. Therefore, p channel pull-up output transistor 182 and n channel pull-down output transistor 184 are rendered non-conductive, whereby potential D of output node 183 attains a high impedance state.

According to SRAM 100 of the thirteenth embodiment, p channel MOS transistors 181ea and 181eb at the side of power supply potential node 100a are rendered non-conductive and only the transistors at the ground potential node side 100b including n channel MOS transistor 181ec and p channel MOS transistor 186 are rendered conductive when p channel pull-up output transistor 182 is rendered conductive. Therefore no through current flows in NAND gate circuit 181e and pull-up control circuit 186.

Furthermore, when n channel pull-down output transistor 184 is rendered conductive, n channel MOS transistors 181fc and 181fd at the side of ground potential node 100b are rendered non-conductive, and only the transistors at the side of power supply potential node 100a including p channel MOS transistor 181fa and n channel MOS transistor 185f are rendered conductive. Therefore, no through current flows in NOR gate circuit 181f and pull-up control circuit 185.

When potential D of output node 183 shows a transition from an H level to an L level, or an L level to an H level, there is a possibility of increase in the output impedance since the absolute value of the voltage between the drain and gate of n channel pull-down output transistor 184 or p channel pull-up output transistor 182 is small. In the present embodiment, the output impedance can be matched from the initial state by pull-down control circuit 185 and pull-up control circuit 186 operating according to potential D of output node 183.

FOURTEENTH EMBODIMENT

An SRAM according to a fourteenth embodiment of the present invention will be described hereinafter with reference to FIG. 18. The fourteenth embodiment differs from the thirteenth embodiment in the structure of output buffer 180. Components corresponding to those of the thirteenth embodiment have the same reference numerals allotted, and only different features will be described.

Figure 18:
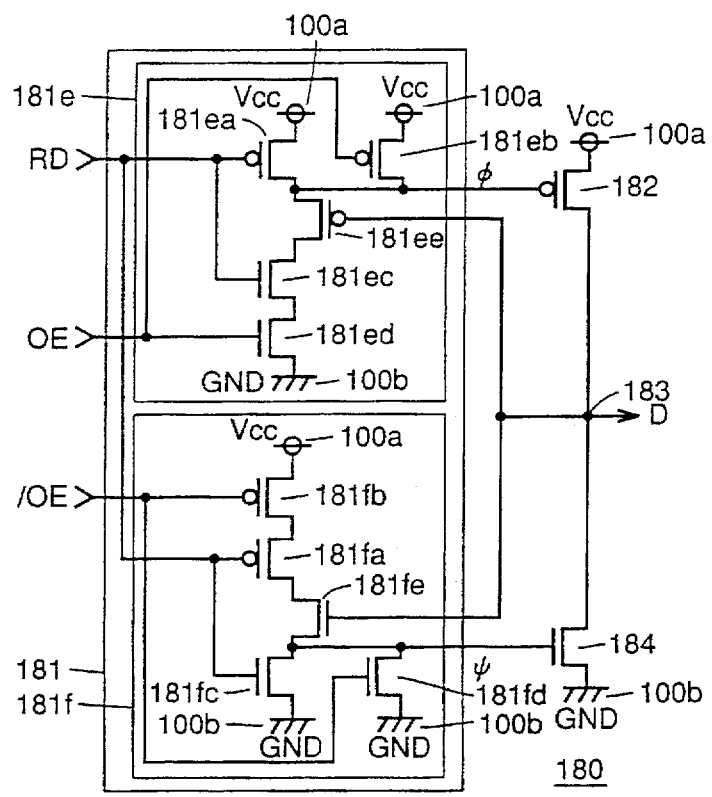

FIG. 18 is a circuit diagram of output buffer 180 according to the fourteenth embodiment. Output buffer 180 of FIG. 18 differs from output buffer 180 of the thirteenth embodiment shown in FIG. 17 in that n channel MOS transistor 185f of pull-down control circuit 185 and p channel MOS transistor 186f of pull-up control circuit 186 in output buffer 180 of the thirteenth embodiment are inserted into NOR gate circuit 181f and NAND gate circuit 181e of data preamplifier 181 as an n channel MOS transistor 181fe and a p channel MOS transistor 181ee. N channel MOS transistor 181fe is connected between power supply potential node 100a and the gate of n channel pull-down output transistor 184 via p channel MOS transistors 181fa and 181fb. P channel MOS transistor 181ee is connected between the gate of p channel pull-up output transistor 182 and ground potential node 100b via n channel MOS transistors 181ec and 181ed.

P channel MOS transistor 181fa is connected between power supply potential node 100a and the gate of n channel pull-down output transistor 184 via p channel MOS transistor 181fb and n channel MOS transistor 181fe. N channel MOS transistor 181ec is connected between the gate of p channel pull-up output transistor 182 and ground potential node 100b via n channel MOS transistor 181ed and p channel MOS transistor 181ee.

Similar to the thirteenth embodiment, SRAM 100 of the present fourteenth embodiment has p channel MOS transistors 181ea and 181eb at the side of power supply potential node 100a rendered non-conductive, and only the transistors at the side of ground potential node 100b including n channel MOS transistor 181ec and p channel MOS transistor 181ee conductive, when p channel pull-up output transistor 182 is rendered conductive. Therefore, no through current flows in NAND gate circuit 181e.

Furthermore, when n channel pull-down output transistor 184 is rendered conductive, n channel MOS transistors 181fc and 181fd at the side of ground potential node 100b are rendered non-conductive, and only the transistors at the side of power supply potential 100a including p channel MOS transistors 181fa and n channel MOS transistor 181fe are rendered conductive. Therefore, no through current flows in NOR gate 181f.

When potential D of output node 183 shows a transition from an H level to an L level or an L level to an H level, there is a possibility of increase in the output impedance since the absolute value of the voltage between the drain and gate of n channel pull-down output transistor 184 or p channel pull-down output transistor 182 is small. However, in the present embodiment, the output impedance establishes a match from the initial state due to p channel MOS transistor 181ee and n channel MOS transistor 181fe operating in response to potential D of output node 183.

Furthermore, the provision of p channel MOS transistor 181ee at the side of ground potential node 100b prevents a full swing of signal $\phi$ between power supply potential $V_{CC}$ and ground potential GND. This smaller amplitude of signal $\phi$ allows a transmission at a higher rate. Therefore, output buffer 180 suitable for high speed interface can be obtained.

The provision of n channel MOS transistor 181fe at the side of power supply potential node 100a prevents a full swing of signal $\psi$ between power supply potential $V_{CC}$ and ground potential GND. This smaller amplitude of signal $\psi$ allows transmission to be carried out at a higher speed. Therefore, output buffer 180 suitable for high speed interface can be obtained.

When the discharging potential of transmission line 200 becomes higher than power supply potential $V_{CC}$, potential D of output node 183 is correspondingly increased and applied to the gate of n channel MOS transistor 181fe. The resistance of n channel MOS transistor 181fe is reduced, whereby a high divided voltage is applied to the gate of n channel pull-down output transistor 184 when read data RD is pulled down to an L level from an H level. Therefore, the impedance of n channel pull-down output transistor 184 is reduced to match the output impedance.

FIFTEENTH EMBODIMENT

An SRAM according to a fifteenth embodiment of the present invention will be described hereinafter with reference to FIG. 19. Embodiment 15 differs from Embodiment 13 in the structure of output buffer 180. Components corresponding to those of the thirteenth embodiment have the same reference characters allotted, and only different features will be described.

Figure 19:
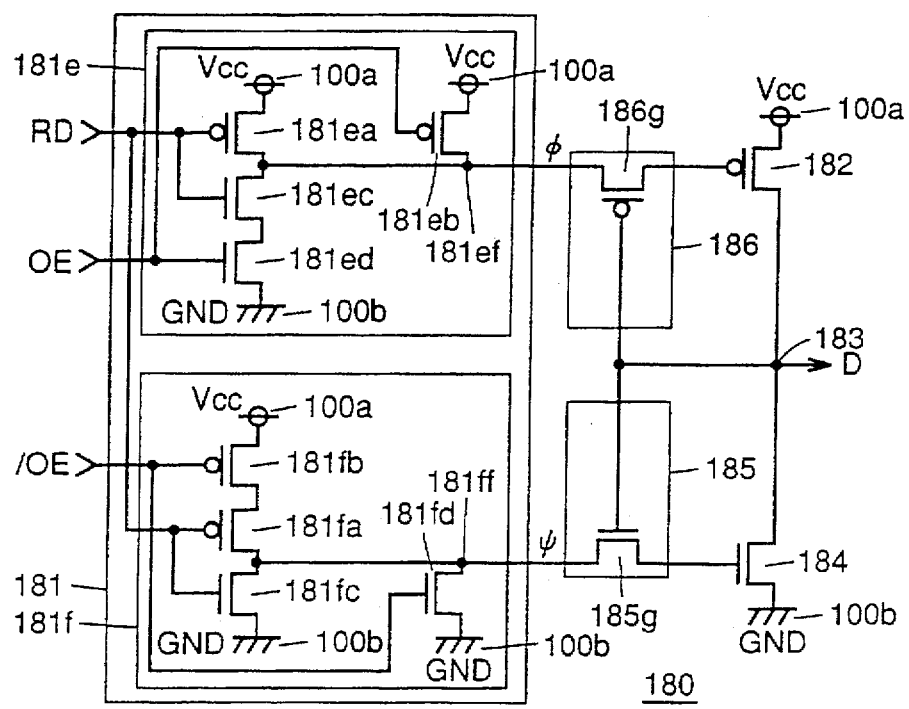

FIG. 19 is a circuit diagram of output buffer 180 of the fifteenth embodiment. Output buffer 180 of FIG. 19 differs from output buffer 180 of the thirteenth embodiment shown in FIG. 17 in that pull-down control circuit 185 includes an n channel MOS transistor 185g connected between the gate of n channel pull-down output transistor 184 and a node 181ff, and having the gate connected to output node 183, instead of n channel MOS transistor 185f, and pull-up control circuit 186 includes a p channel MOS transistor 186g instead of p channel MOS transistor 186f. P channel MOS transistor 186 is connected between the gate of p channel pull-up output transistor 182 and node 181ef, and has a gate connected to output node 183.

P channel MOS transistor 181fa is connected between power supply potential node 100a and the gate of n channel pull-down output transistor 184 via p channel MOS transistor 181fb and n channel MOS transistor 181fe. N channel MOS transistor 181ec is connected between the gate of p channel pull-up output transistor 182 and ground potential node 100b via n channel MOS transistor 181ed and p channel MOS transistor 181ee.

According to SRAM 100 of the fifteenth embodiment, p channel MOS transistors 181ea and 181eb at the side of power supply potential node 100a are rendered non-conductive, and only the transistors at the side of ground potential node 100b including n channel MOS transistor 181ec and p channel MOS transistor 186g are rendered conductive at the time p channel pull-up output transistor 182 is rendered conductive. Therefore, no through current flows in NAND gate circuit 181e and pull-up control circuit 186.

In rendering n channel pull-down output transistor 184 conductive, n channel MOS transistor 181fc and 181fd at the side of ground potential node 100b are rendered non-conductive, and only the transistors at the side of power supply potential node 100a including p channel MOS transistor 181fa and n channel MOS transistor 185g are rendered conductive. Therefore, no through current flows in NOR gate circuit 181f and pull-down control circuit 185.

When potential D of output node 183 shows a transition from an H level to an L level or an L level to an H level, there is a possibility of increase in the output impedance since the absolute value of the voltage between the drain and gate of n channel pull-down output transistor 184 or p channel pull-down output transistor 182 is small. In the present embodiment, output impedance matching can be established from the initial stage by p channel MOS transistor 186g and n channel MOS transistor 185g operating according to potential D of output node 183.

The provision of p channel MOS transistor 186g prevents a full swing of the gate potential of p channel pull-up output transistor 182 between power supply potential $V_{CC}$ and ground potential GND. This smaller amplitude of the gate potential allows transmission to be carried out at high speed. Therefore, output buffer 180 suitable for high speed interface can be obtained.

Furthermore, the provision of n channel MOS transistor 185g prevents a full swing of the gate potential of n channel pull-down output transistor 184 between power supply potential $V_{CC}$ and ground potential GND. This smaller amplitude of the gate potential allows a higher speed of transition. Therefore, output buffer 180 suitable for high speed interface can be obtained.

When the charging potential of transmission line 200 is higher than power supply potential $V_{CC}$, potential D of output node 183 is correspondingly increased which is applied to the gate of n channel MOS transistor 185g. As a result, the resistance of n channel MOS transistor 181g is reduced, and a high divided voltage is applied to the gate of n channel pull-down output transistor 184 when read data RD is pulled down to an L level from an H level. Therefore, the impedance of n channel pull-down output transistor 184 is reduced to establish matching of the impedance.

SIXTEENTH EMBODIMENT

An SRAM according a sixteenth embodiment of the present invention will be described hereinafter with reference to FIG. 20. The sixteenth embodiment differs from the fifteenth embodiment in the structure of output buffer 180. Components corresponding to those of the fifteenth embodiment have the same reference characters allotted, and only different features will be described.

Figure 20:
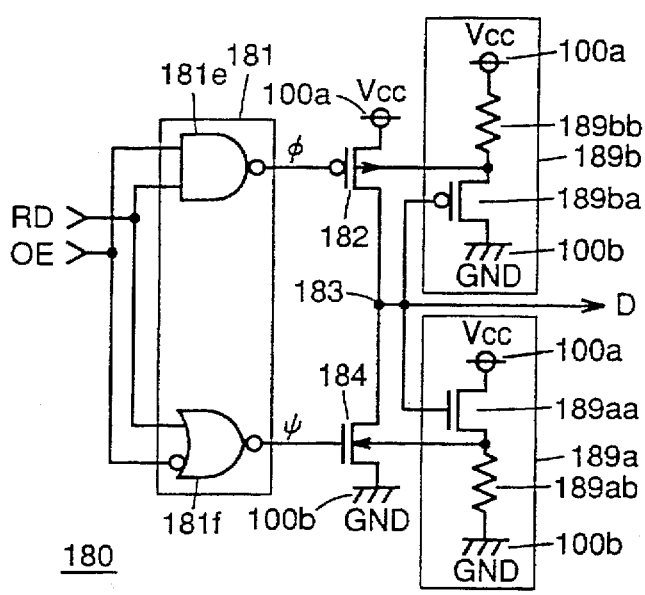

FIG. 20 is a circuit diagram of output buffer 180 of the sixteenth embodiment. Output buffer 180 of FIG. 20 differs from output buffer 180 of the fifteenth embodiment shown in FIG. 19 in the following three points. Firstly, pull-down control circuit 185 and pull-up control circuit 186 are not provided. Secondly, a pull-down control circuit 189a and a pull-up control circuit 189b are newly provided. Pull-down control circuit 189a controls the impedance of n channel pull-down output transistor 184 by controlling the backgate potential of n channel pull-down output transistor 184 according to potential D of output node 183. Pull-up control circuit 189b controls the impedance of p channel pull-up output transistor 182 by controlling the backgate potential of p channel pull-up output transistor 182 according to potential D of output node 183. Thirdly, n channel pull-down output transistor 184 and p channel pull-up output transistor 182 are formed in wells different from those of other n channel MOS transistors and p channel MOS transistors since the backgate potentials of n channel pull-down output transistor 184 and p channel pull-up output transistor 182, i.e., the potentials of the p type well in which n channel pull-down output transistor 184 is formed and the n type well in which p channel pull-up output transistor 182 is formed are variable and not fixed.

Pull-down control circuit 189a includes an n channel MOS transistor 189aa connected between power supply potential node 100a and the backgate of n channel pull-down output transistor 184, and having a gate connected to output node 183, and a resistor element 189ab connected between the backgate of n channel pull-down output transistor 184 and ground potential node 100b. Pull-up control circuit 189b includes a p channel MOS transistor 189ba connected between the backgate of p channel pull-up output transistor 182 and ground potential node 100b, and has a gate connected to output node 183, and a resistor element 189bb connected between power supply potential node 100a and the backgate of p channel pull-up output transistor 182.

According to output buffer 180 of FIG. 20, when output enable signal OE attains an H level of activation and read data RD attains an H level, signal φ provided from NAND gate circuit 181e attains an L level, and signal ψ provided from NOR gate circuit 181f attains an L level. P channel pull-up output transistor 182 receiving signal φ at its gate is rendered conductive, and n channel pull-down output transistor 184 receiving gate ψ at its gate is rendered non-conductive. Potential D of output node 183 is increased towards the H level. Following this increase, the resistance of p channel MOS transistor 189ba in pull-up control circuit 189b receiving potential D of output node 183 at its gate is increased. The backgate potential of p channel pull-up output transistor 182 is increased, whereby the impedance of p channel pull-up output transistor 182 is prevented from being reduced.

When output enable signal OE attains an H level of activation and read data RD attains an L level, signals φ and ψ provided from NAND gate circuit 181e and NOR gate circuit 181f, respectively, attain an H level. P channel pull-up output transistor 182 receiving signal φ at its gate is rendered non-conductive, and n channel pull-down output transistor 184 receiving signal ψ at its gate is rendered conductive. Potential D of output node 183 is lowered towards the L level. Following this reduction, the resistance of n channel MOS transistor 189aa in pull-down control circuit 189a receiving potential D of output node 183 at its gate becomes larger, and the backgate potential of n channel pull-down output transistor 184 is reduced. This prevents the impedance of n channel pull-down output transistor 184 from being reduced.

When output enable signal OE attains an L level of inactivation, signals φ and ψ provided from NAND gate 181e and NOR gate circuit 181f, respectively, attain an H level and an L level, respectively, independent of the level of read data RD. Therefore, p channel pull-up output transistor 182 and n channel pull-down output transistor 184 are both rendered non-conductive, whereby potential D of output node 183 attains a high impedance state.

According to SRAM of the sixteenth embodiment, when output buffer 180 provides data of an L level, the backgate potential of n channel pull-down output transistor 184 is reduced following potential D of output node 183. Therefore, the impedance of n channel pull-down output transistor 184 is prevented from being reduced. As a result, the impedance of n channel pull-down output transistor 184 matches that of transmission line 200.

When output buffer 180 provides data D of an H level, the backgate potential of p channel pull-up output transistor 182 is increased following potential D of output node 183. Therefore, the impedance of p channel pull-up output transistor 182 is prevented from being reduced. As a result, the impedance of p channel pull-up output transistor 182 matches that of transmission line 200.

Even when the amplitude of transmission 200 is greater than power supply potential $V_{CC}$ and transmission line 200 is charged to a level higher than power supply potential $V_{CC}$, the potential of output node 183 is correspondingly increased and applied to the gate of n channel MOS transistor 189aa in pull-down control circuit 189a. The backgate potential of n channel pull-down output transistor 184 increases. As a result, the impedance of n channel pull-down output transistor 184 is prevented from being increased at the initiation of charge being drawn out from output node 183. Therefore, the impedance of n channel pull-down output transistor 184 matches that of transmission line 200.

Since pull-down control circuit 189a and pull-up control circuit 189b, respectively, are formed in wells differing from those of n channel pull-down output transistor 184 and p channel pull-up output transistor 182, the resistance of the transistor and the resistor element forming pull-down control circuit 189a and pull-up control circuit 189b individually can be set to high value. Therefore, the through current flowing through pull-down control circuit 189a and pull-up control circuit 189b can be reduced.

The above embodiment was described of a structure for controlling the backgate potentials of pull-up transistor 182 and pull-down transistor 184 by pull-up control circuit 189b and pull-down control circuit 189a, respectively.

The impedance of output buffer 180 and transmission line 200 can be made to match with respect to the transition from an L level to an H level or from an H level an L level of potential D by implementing a structure that controls the backgate potential of a corresponding transistor by either pull-up control circuit 189b or pull-down control circuit 189a.

SEVENTEENTH EMBODIMENT

An SRAM according to a seventeenth embodiment of the present invention will be described hereinafter with reference to FIG. 21. The seventeenth embodiment differs from the thirteenth embodiment in the structure of output buffer 180. Components corresponding to those of the thirteenth embodiment have the same reference characters allotted, and only differing features will be described.

Figure 21:
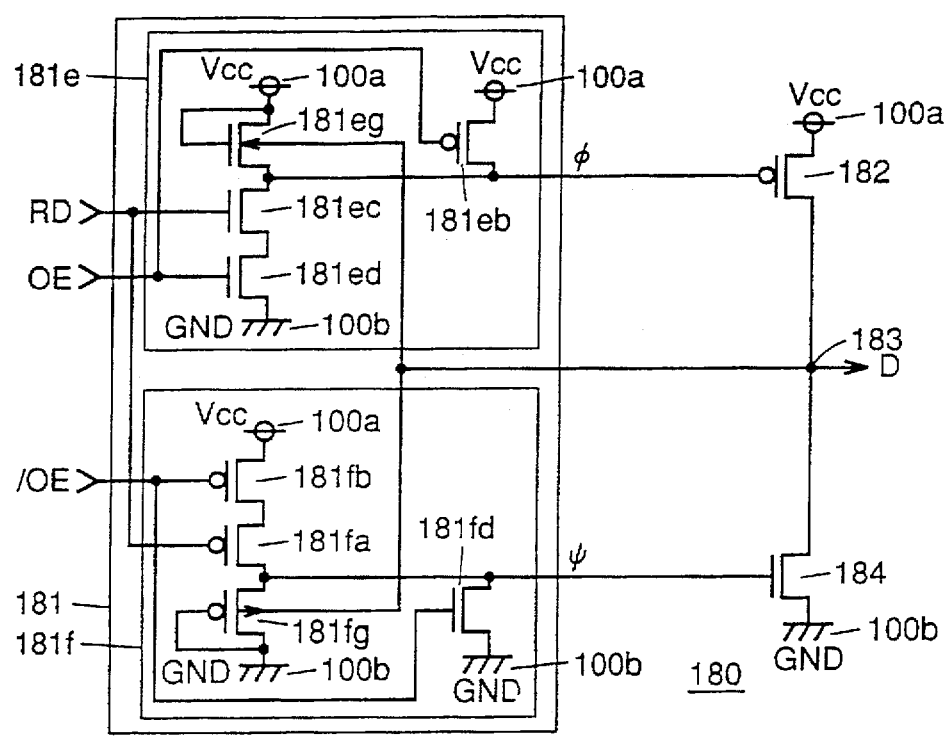

FIG. 21 is a circuit diagram of output buffer 180 according to the seventeenth embodiment. Output buffer 180 of FIG. 21 differs from output buffer 180 of the thirteenth embodiment shown in FIG. 17 in the following two points. Firstly, pull-down control circuit 185 and pull-up control circuit 186 are not provided. Secondly, an n channel MOS transistor 181eg and a p channel MOS transistor 181fg are newly provided instead of p channel MOS transistor 181ea in NAND gate circuit 181e and n channel MOS transistor 181fc in NOR gate circuit 181f, respectively. N channel MOS transistor 181eg is connected between power supply node 100a and the gate of p channel pull-up output transistor 182, and has the gate connected to power supply potential node 100a. P channel MOS transistor 181fg is connected between the gate of p channel pull-up output transistor 182 and ground potential node 100b, and has a gate connected to ground potential node 100b, and a backgate connected to output node 183.

According to output buffer 180 shown in FIG. 21, when output enable signal OE attains an H level of activation and read data RD attains an H level, n channel MOS transistor 181ec in NAND gate circuit 181e is rendered conductive, and signal $\phi$ attains an L level determined by the divided voltage of n channel MOS transistors 181ea, 181ec, and 181ed. P channel MOS transistor 181fa in NOR gate circuit 181f is rendered non-conductive, whereby signal $\psi$ attains an L level of the absolute value $V_{thp}$ of the threshold voltage of p channel MOS transistor 181fg. P channel pull-up output transistor 182 receiving signal $\phi$ at its gate is rendered conductive, and n channel pull-down output transistor 184 receiving signal $\psi$ at its gate is rendered non-conductive, whereby potential D of output node 183 is increased towards the H level. Following this increase, the resistance of n channel MOS transistor 181eg in NAND gate circuit 181e receiving potential D of output node 183 at the backgate is reduced. In response, signal $\phi$ is increased to suppress the impedance of p channel pull-up output transistor 182 from being reduced.

When output enable signal OE attains an H level of activation and read data RD attains an L level, n channel MOS transistor 181ec in NAND gate circuit 181e is rendered non-conductive, and signal $\phi$ attains an H level lower than power supply potential $V_{CC}$ by the threshold voltage $V_{thn}$ of n channel MOS transistor 181eg ($V_{CC}-V_{thn}$). P channel MOS transistor 181fa in NOR gate circuit 181f is rendered conductive, and signal $\psi$ attains an H level which is determined by the divided voltage of p channel MOS transistors 181fb, 181fa and 181fg. P channel pull-up output transistor 182 receiving signal $\phi$ at its gate is rendered non-conductive, and n channel pull-down output transistor 184 receiving signal $\psi$ at its gate is rendered conductive, whereby potential D of output node 183 is lowered towards the L level. Following this reduction, the resistance of p channel MOS transistor 181fg in NOR gate circuit 181f receiving potential D of output node 183 at its backgate is reduced. As a result, signal $\psi$ is reduced to prevent the impedance of n channel pull-down output transistor 184 from being reduced.

When output enable signal OE attains an L level of inactivation, signals $\phi$ and $\psi$ provided from NAND gate circuit 181e and NOR gate circuit 181f, respectively, attain an H level and an L level, respectively, irrespective of the level of read data RD. As a result, p channel pull-up output transistor 182 and n channel pull-down output transistor 184 are both rendered non-conductive, whereby potential D of output node 183 attains a high impedance state.

According to SRAM 100 of the seventeenth embodiment, when output buffer 180 provides data D of an L level, the gate potential of n channel pull-down output transistor 184 is reduced following potential D of output node 183. Therefore, the impedance of n channel pull-down output transistor 184 is prevented from being reduced. Therefore, the impedance of n channel pull-down output transistor 184 matches that of transmission line 200.

When output buffer 180 provides data D of an H level, the gate potential of p channel pull-up output transistor 182 is increased following potential D of output node 183. Therefore, the impedance of p channel pull-up output transistor 182 is prevented from being reduced. Therefore, the impedance of p channel pull-up output transistor 182 matches that of transmission line 200.

Even when the amplitude of transmission line 200 is greater than power supply potential $V_{CC}$, and transmission line 200 is charged to a level higher than power supply potential $V_{CC}$, the potential of output node 183 is correspondingly increased which is applied to the backgate of p channel MOS transistor 181fg of gate of NOR gate circuit 181f. The gate potential (signal ψ) of n channel pull-down output transistor 184 is increased. Therefore, the impedance of n channel pull-down output transistor 184 is suppressed from being increased at the initiation of charge being drawn out from output node 183. Therefore, the impedance of n channel pull-down output transistor 184 matches that of transmission line 200.

The above embodiment was described of a structure in which the gate potentials of pull-up transistor 189 and pull-down transistor 184 are controlled by NAND gate circuits 181e and 181f, respectively. The impedance of output buffer 180 and transmission line 200 can be made to match with respect to the transition of either an L level to an H level or an H level to an L level of potential D by implementing a structure that controls the gate potential of a corresponding transistor by NAND gate circuit 181e or NAND gate circuit 181f.

EIGHTEENTH EMBODIMENT

An SRAM according to an eighteenth embodiment of the present invention will be described hereinafter with reference to FIG. 22. The eighteenth embodiment differs from the thirteenth embodiment in the structure of output buffer 180. Components corresponding to those of the thirteenth embodiment have the same reference characters allotted, and only differing features will be described.

Figure 22:
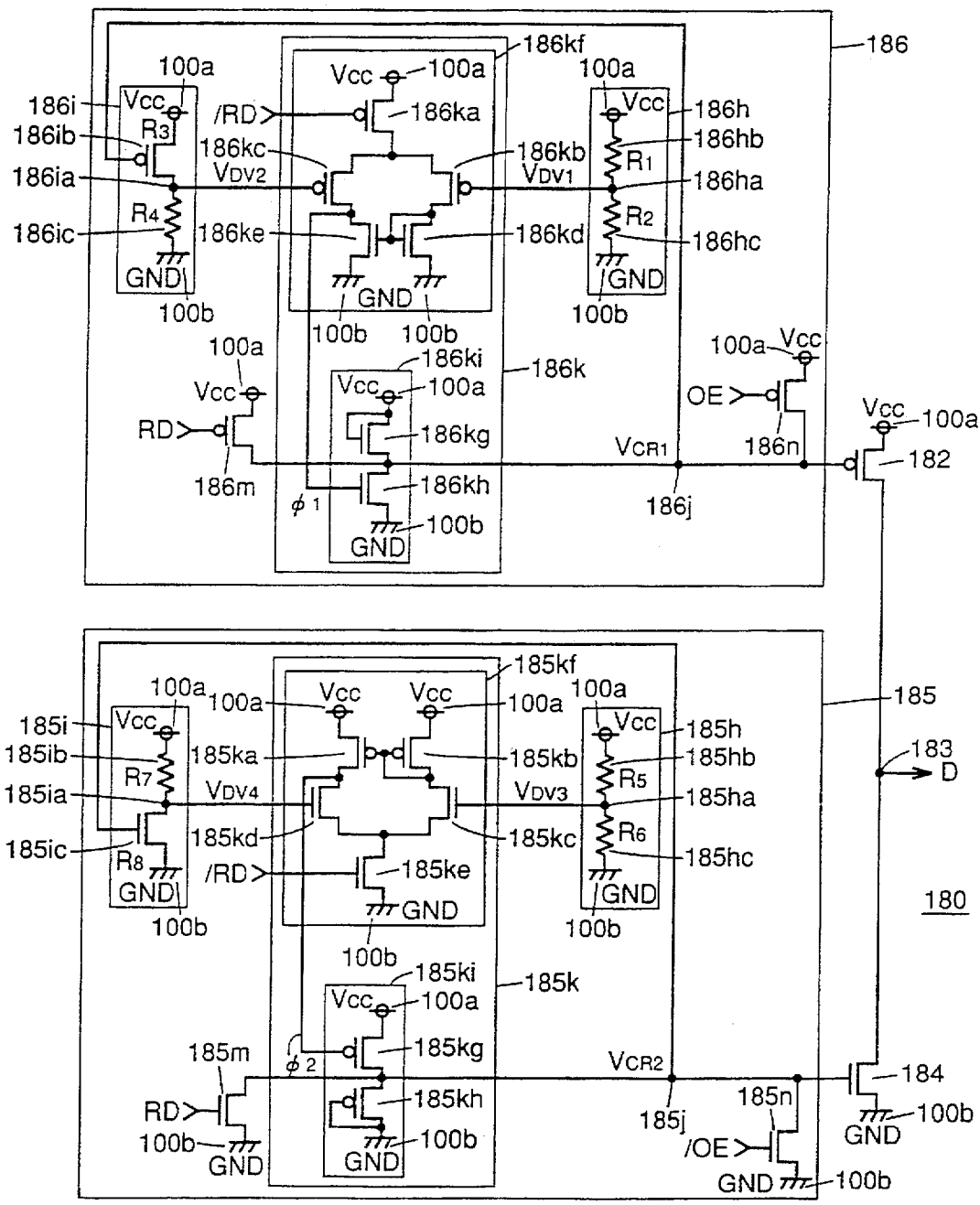

FIG. 22 is a circuit diagram of output buffer 180 of the eighteenth embodiment. Output buffer 180 of FIG. 22 differs from output buffer 180 of the thirteenth embodiment shown in FIG. 17 in that data preamplifier 180 is removed, and the structures of pull-down control circuit 185 and pull-up control circuit 186 differ.

Pull-up control circuit 186 includes a voltage divider circuit 186h, a control voltage divider circuit 186i and a comparator circuit 186k. Voltage divider circuit 186h includes a resistor element 186hb having a resistance of $R_2$ connected between power supply node 100a and a node 186ha, and a resistor element 186hc having a resistance $R_2$ connected between node 186ha and ground potential node 100b. Voltage divider circuit 186h provides divided voltage $V_{DV1}$ of $R_2 V_{CC}/(R_1+R_2)$ from node 186ha. Control voltage divider circuit 186i includes a p channel MOS transistor 186ib of a resistance of $R_3$, connected between power supply node 100a and a node 186ia, and having a gate connected to node 186j, and a resistor element 186ic of a resistance $R_4$ between node 186ia and having ground potential node 100b. Control voltage divider circuit 186i provides a control voltage $V_{DV2}$ of $R_4 V_{CC}/(R_3+R_4)$ from node 186ia.

Comparator circuit 186k receives divided voltage $V_{DV1}$ from node 186ha of voltage divider circuit 186h, control voltage $V_{DV2}$ from node 186ia in control voltage divider circuit 186i, read data RD and read data /RD which is an inverted version of read data RD. Comparator circuit 186k is activated when read data RD attains an H level (/RD attains an L level) to provide a comparison potential $V_{CR1}$ to node 186j that is increased when control voltage $V_{DV2}$ is higher than divided voltage $V_{DV1}$, and that is lowered otherwise. Comparator circuit 186k includes a p channel MOS transistor 186ka receiving read data /RD at its gate, a p channel MOS transistor 186kb receiving divided voltage $V_{DV1}$ at its gate, a p channel MOS transistor 186kc receiving control voltage $V_{DV2}$ at its gate, a differential amplifier circuit 186kf, and an output circuit 186ki. Differential amplifier circuit 186kf includes an n channel MOS transistor 186kd, and an n channel MOS transistor 186ke having a gate connected to the gate of n channel MOS transistor 186kd, forming an n channel current mirror circuit with n channel MOS transistor 186kd. Differential amplifier circuit 186kf provides an output signal $\phi_1$ which is an amplification of the potential difference between divided voltage $V_{DV1}$ and control voltage $V_{DV2}$. Output circuit 186ki includes an n channel MOS transistor 186kg, and an n channel MOS transistor 186kh receiving output signal $\phi_1$ from differential amplifier circuit 186kf at its gate. Output circuit 186ki increases and decreases $V_{CR1}$ when output signal $\phi_1$ attains an L level and an H level, respectively.

A power supply transistor 186m is connected between power supply potential node 100a and a node 186j connected to the gate of p channel pull-up output transistor 182. Power supply transistor 186m receives read data RD at its gate, and is rendered conductive when read data RD attains an L level. A gate pull-up transistor 186n is connected between power supply potential node 100a and the gates of p channel pull-up output transistor 182 for receiving output enable signal OE at its gate. Gate pull-up transistor 186n is rendered conductive when output enable signal OE attains an L level of inactivation to pull-up the gate potential of p channel pull-up output transistor 182 to the level of power supply potential $V_{DD}$.

Pull-down control circuit 185 includes a voltage divider circuit 185h, a control voltage divider circuit 185i, and a comparator circuit 185a.

Voltage divider circuit 185h includes a resistor element 185hb of resistance $R_5$, connected between power supply potential node 100a and node 185ha, and a resistor element 185hc of resistance $R_6$, connected between node 185ha and ground potential node 100b. Voltage divider circuit 185h provides divided voltage $V_{DV3}$ of $R_6 V_{CC}/(R_5+R_6)$ from node 185ha. Control voltage divider circuit 185i includes a resistor element 185ib of resistance $R_7$ connected between power supply node 100a and node 185ia, and an n channel MOS transistor 185ic of a resistance value $R_8$ connected between node 185ia and ground potential node 100b, and having a gate connected to node 185j. Control voltage divider circuit 185i provides control voltage $V_{DV4}$ of $R_8 V_{CC}/(R_7+R_8)$ from node 185ia.

Comparator circuit 185a receives divided voltage $V_{DV3}$ from node 185ha in voltage divider circuit 185h, control voltage $V_{DV4}$ from node 185ia of control voltage divider circuit 185i, read data RD and read data /RD which is an inverted version of read data RD. Comparator circuit 185a is activated when read data RD attains an L level (/RD attains an H level) to provide a comparison potential $V_{CR2}$ that is increased when control voltage $V_{DV4}$ is higher than divided voltage $V_{DV3}$, otherwise that is reduced.

Comparator circuit $185_k$ includes a differential amplifier circuit 185kf and an output circuit 185ki.

Differential amplifier circuit 85kf includes a p channel MOS transistor 185ka, a p channel MOS transistor 185kb having a gate connected to the gate of p channel MOS transistor 185ka, and forming a p channel current mirror circuit with transistor 185ka, an n channel MOS transistor 185kc receiving divided voltage $V_{DV3}$ at its gate, an n channel MOS transistor 185kd receiving control voltage $V_{DV4}$ at its gate, and an n channel MOS transistor 185ke receiving read data /RD at its gate. Differential amplifier circuit 185*kf* provides output signal $\phi_2$ which is an amplification of the potential difference between divided voltages $V_{DV3}$ and $V_{DV4}$.

Output circuit 185*ki* includes a p channel MOS transistor 185*kg* and a p channel MOS transistor 185*kh* connected in series between power supply potential $V_{CC}$ and ground potential GND. P channel MOS transistor 185*kg* having a gate connected to power supply potential $V_{CC}$ receives output signal $\phi_2$ from differential amplifier circuit 185*kf* at its gate. P channel MOS transistor 185*kh* has a source connected to the drain of p channel MOS transistor 185*kg*, and a gate and drain both connected to ground potential to form a diode connection. Output circuit 185*ki* increases and decreases $V_{CR2}$ when output signal $\phi_2$ attains an L level and an H level, respectively. A ground transistor 185*m* is connected between a node 185*j* connected to the gate of n channel pull-down output transistor 184 and ground potential node 100*b*, and receives read data RD at its gate. A gate pull-down transistor 185*n* is connected between the gate of n channel pull-down output transistor 184 and ground potential node 100*b*, and receives signal /OE which is an inverted version of output enable signal OE at its gate. Gate pull-down transistor 185*n* is rendered conductive when output enable signal OE attains an L level of inactivation (signal /OE attains an H level of inactivation) to pull-down the gate potential of n channel pull-down output transistor 184 to the level of ground potential GND.

In the present eighteenth embodiment, it is assumed that the gate length of p channel MOS transistor 186*ib* and the gate length of p channel pull-up output transistor 182 in control voltage divider circuit 186*i* are equally set to 0.8 μm. The gate width of p channel MOS transistor 186*ib* is set to 4 μm which is 1/100 the gate width of p channel pull-up output transistor 182 to reduce the through current flowing via p channel MOS transistor 186*ib* and resistor element 186*ic*. Resistance $R_4$ of resistor element 186*ic* is set to 5000 Ω which is 100 times the impedance of transmission line 200 connected to output node 183. Resistance $R_1$ of resistor element 186*hb* of voltage divider circuit 186*h* and resistance $R_2$ of resistance element 186*hc* are set equal so that the impedance of p channel pull-down output transistor 182 equals that of transmission line 200. The resistance value is set to a high resistance value of 5000 Ω in consideration of reducing the through current.

When resistance $R_3$ of p channel MOS transistor 186*ib* is greater than resistance $R_4$ of resistor element 186*ic*, i.e. when comparison potential $V_{CR1}$ which the gate potential is higher than the optimum value and the impedance of p channel pull-up output transistor 182 is greater than the impedance of transmission line 200, control voltage $V_{DV2}$ becomes lower than divided voltage $V_{DV1}$. Output signal $\phi_1$ in differential amplifier circuit 186*kf* is driven to an G level, whereby n channel MOS transistor 186*kh* receiving $\phi_1$ is rendered conductive. As a result, comparison potential $V_{CR1}$ is lowered. In response, resistance $R_3$ of p channel MOS transistor 186*ib* and the impedance of p channel pull-up output transistor 182 are reduced.

When resistance $R_3$ of p channel MOS transistor 186*ib* is smaller than resistance $R_4$ of resistance element 186*ic*, i.e. when comparison potential $V_{CR1}$ which becomes the gate potential is lower than the optimum value so that the impedance of p channel pull-up output transistor 182 is smaller than that of transmission line 200, control voltage $V_{DV2}$ becomes higher than divided voltage $V_{DV1}$. Differential amplifier circuit 186*kf* drives output signal $\phi_1$ to an L level, whereby n channel MOS transistor 186*kh* receiving $\phi_1$ is rendered non-conductive. As a result, comparison potential $V_{CR1}$ increases. In response, resistance value $R_3$ of p channel MOS transistor 186*ib* and the impedance of p channel pull-up output transistor 182 are increased. According to the above-described operation, resistance $R_3$ of p channel MOS transistor 186*ib* is set equal to resistance $R_4$ of resistor element 186*ic*, and the impedance of p channel pull-up output transistor 182 equals that of transmission line 200.

It is assumed that the gate length of n channel MOS transistor 185*ic* and the gate length of n channel pull-down output transistor 184 in control voltage divider circuit 185*ic* are equally set to 0.8 μm. The gate width of n channel MOS transistor 185*ic* is set to 4 μm which is 1/100 the gate width of n channel pull-down output transistor 184 in order to reduce the through current flowing via resistor element 185*ib* and n channel MOS transistor 185*ic*. Accordingly, resistance $R_7$ of resistor element 185*ib* is set to 5000 Ω which is 100 times the impedance of transmission line 200 connected to output node 183. Resistance $R_5$ of resistor element 185*hb* and resistance $R_6$ of resistor element 185*hc* in voltage divider circuit 185*h* are set equal so that the impedance of n channel pull-down output transistor 184 equals that of transmission line 200. The value of resistances $R_5$ and $R_6$ is set to a high resistance value of 5000 Ω in consideration of reducing the through current.

When resistance $R_8$ of n channel MOS transistor 185*ic* is greater than resistance $R_7$ of resistor element 185*ib*, i.e. when comparison potential $V_{CR2}$ which becomes a gate potential is lower than the optimum values so that the impedance of n channel pull-down output transistor 184 becomes greater than the impedance of transmission line 200, control voltage $V_{DV4}$ becomes greater than divided voltage $V_{DV4}$. As a result, differential amplifier circuit 185*kf* drives output signal $\phi_2$ to an L level, whereby p channel MOS transistor 185*kg* receiving $\phi_2$ is rendered conductive. As a result, comparison potential $V_{CR2}$ is increased. In response, resistance $R_8$ of n channel MOS transistor 185*ic* and the impedance of n channel pull-down output transistor 184 are reduced.

When resistance $R_8$ of n channel MOS transistor 185*ic* is smaller than resistance $R_7$ of resistor element 185*ib*, i.e. when comparison potential $V_{CR2}$ which becomes the gate potential is higher than the optimum value so that the impedance of n channel pull-down output transistor 184 becomes smaller than that of transmission line 200, control voltage $V_{DV4}$ becomes smaller than divided voltage $V_{DV3}$. As a result, differential amplifier circuit 185*kf* drives output signal $\phi_2$ to an H level, whereby p channel MOS transistor 185*kg* receiving $\phi_2$ is rendered non-conductive. As a result, comparison potential $V_{CR2}$ is reduced. In response, resistance $R_8$ of n channel MOS transistor 185*ic* and the impedance of n channel pull-down output transistor 184 are increased. According to the above-described operation, resistance $R_8$ of n channel MOS transistor 185*ic* is set equal to resistance $R_7$ os resistor element 185*ib*. The impedance of n channel pull-down output transistor 184 equals that of transmission line 200.

In output buffer 180 shown in FIG. 22, an output enable signal OE of an H level of activation (signal /OE attains an L level of activation) and read data RD attains an H level (/RD attains an L level), gate pull-up transistor 186*n* and gate pull-down transistor 185*n* both attain a non-conductive state. N channel MOS transistor 185*ke* is rendered non-conductive in differential amplifier circuit 185*kf*. Therefore, differential amplifier circuit 185*kf* is inactivated, and ground transistor 185*m* is rendered conductive. As a result, comparison potential $V_{CR2}$ of node 185*j* attains an L level, and n channel pull-down output transistor 184 is rendered non-conductive. When p channel MOS transistor 186ka in differential amplifier circuit 186kf is rendered conductive to activate differential amplifier circuit 186kf, power supply transistor 186m is rendered non-conductive. Comparator circuit 186k controls comparison potential $V_{CR1}$ so that resistance $R_3$ of p channel MOS transistor 186ib equals resistance $R_4$ of resistor element 186ic, i.e. so that the impedance of p channel pull-up output transistor 182 equals that of transmission line 200.

When output enable signal OE attains an H level of activation (signal /OE attains an L level of activation) and read data RD attains an L level (/RD attains an H level), gate pull-up transistor 186n and gate pull-down transistor 185n are both rendered non-conductive. P channel MOS transistor 186ka in differential amplifier circuit 186kf is rendered non-conductive, and differential amplifier circuit 186kf is inactivated. Power supply transistor 186m is rendered conductive, and comparison potential $V_{CR1}$ at node 186j attains an H level. P channel pull-up output transistor 182 is rendered non-conductive. N channel MOS transistor 185ke in differential amplifier circuit 185kf is rendered conductive, whereby differential amplifier circuit 185kf is activated. Ground transistor 185m is rendered non-conductive. Comparator circuit 185k controls comparison potential $V_{CR2}$ so that resistance $R_8$ of n channel MOS transistor 185ic equals resistance $R_7$ of resistance element 185ib, i.e. so that the impedance of n channel pull-down output transistor 184 equals the impedance of transmission line 200.

When output enable signal OE attains an L level of inactivation (signal /OE attains an H level of inactivation), gate pull-up transistor 186n and pull-down transistor 185n are both rendered conductive irrespective of the level of read data RD. Here, the gate potential of p channel pull-up output transistor 182 is driven to an H level, and the gate potential of n channel pull-down output transistor 184 is driven to an L level. P channel pull-up output transistor 182 and n channel pull-down output transistor 184 are both rendered non-conductive, whereby data D provided from output node 183 attains a high impedance state.

According to SRAM 100 of the eighteenth embodiment, the impedance of n channel pull-down output transistor 184 is set equal to the impedance of transmission line 200 by controlling the gate potential of n channel pull-down output transistor 184. Therefore, it is not necessary to adjust the channel length and the channel width so as to equal the impedance of transmission line 200. By just setting the channel length of n channel pull-down output transistor 184 equal to that of n channel MOS transistor 185ic, the impedance of n channel pull-down output transistor 184 can be made to match the impedance of transmission line 200.

The impedance of p channel pull-up output transistor 182 is set equal to the impedance of transmission line 200 by controlling the gate potential of p channel pull-up output transistor 182. Therefore, it is not necessary to adjust the channel length and the channel width so as to equal the impedance of transmission line 200. By just setting the channel length of p channel pull-up output transistor 182 equal to that of p channel MOS transistor 186ib, the impedance of p channel pull-up output transistor 182 can be made to match the impedance of transmission line 200.

NINETEENTH EMBODIMENT

An SRAM according a nineteenth embodiment of the present invention will be described hereinafter with reference to FIG. 23. The nineteenth embodiment differs from the eighteenth embodiment in the structure of output buffer 180. Components corresponding to those of the eighteenth embodiment have the same reference characters allotted, and only differing features will be described.

Figure 23:
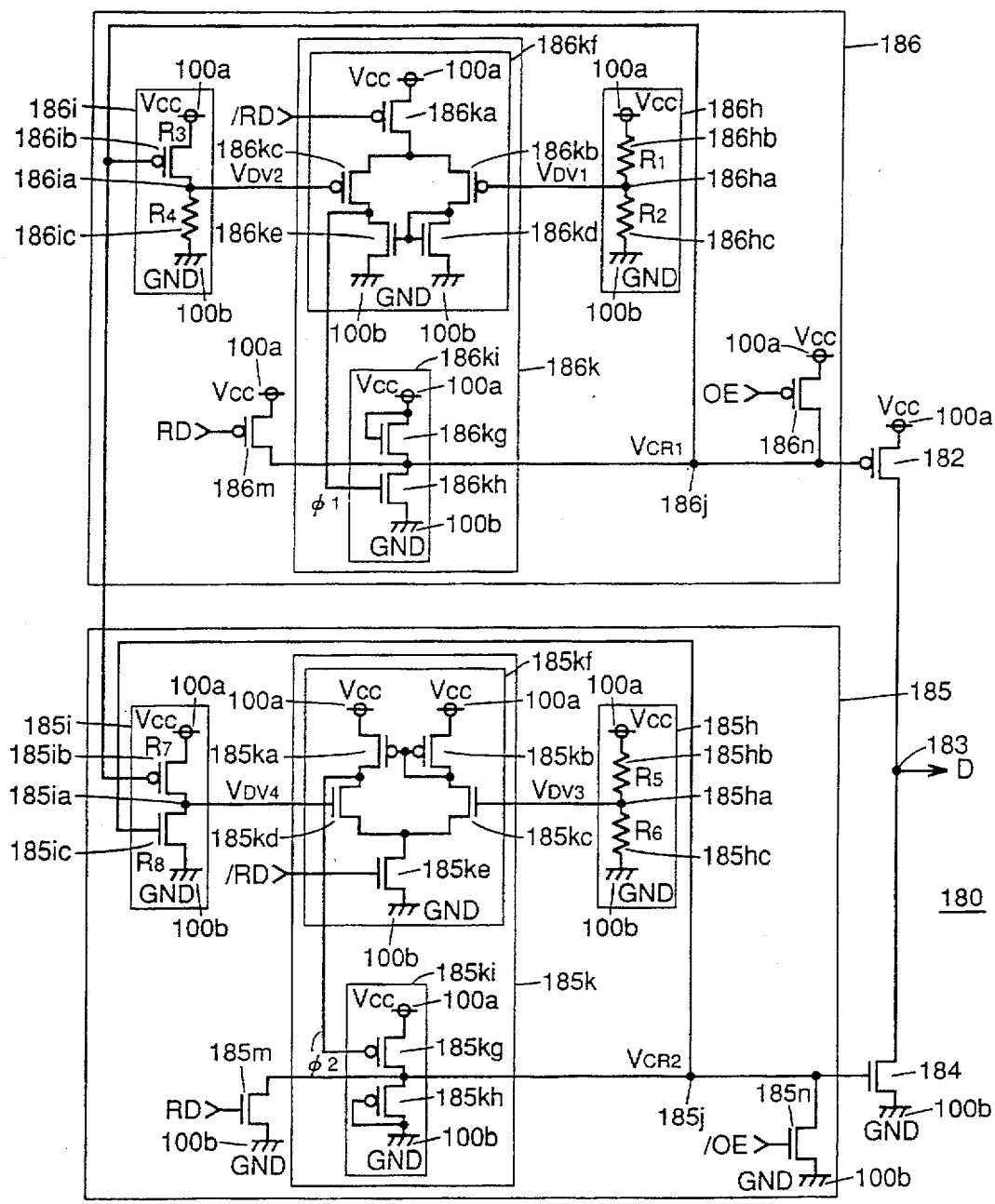

FIG. 23 is a circuit diagram of output buffer 180 according to the nineteenth embodiment. Output buffer 180 of FIG. 23 differs from output buffer 180 of the eighteenth embodiment shown in FIG. 22 in that resistor element 185ib in control voltage divider circuit 185ib is formed of a p channel MOS transistor receiving comparison potential $V_{CR1}$ at its gate. The circuit of the nineteenth embodiment operates in a manner similar to that of the eighteenth embodiment, and also provides similar advantages.

TWENTIETH EMBODIMENT

An SRAM according to a twentieth embodiment of the present invention will be described hereinafter with reference to FIG. 24. The twentieth embodiment differs from the eighteenth embodiment in the structure of output buffer 180. Components corresponding to those of the eighteenth embodiment have the same reference characters allotted, and only differing features will be described.

Figure 24:
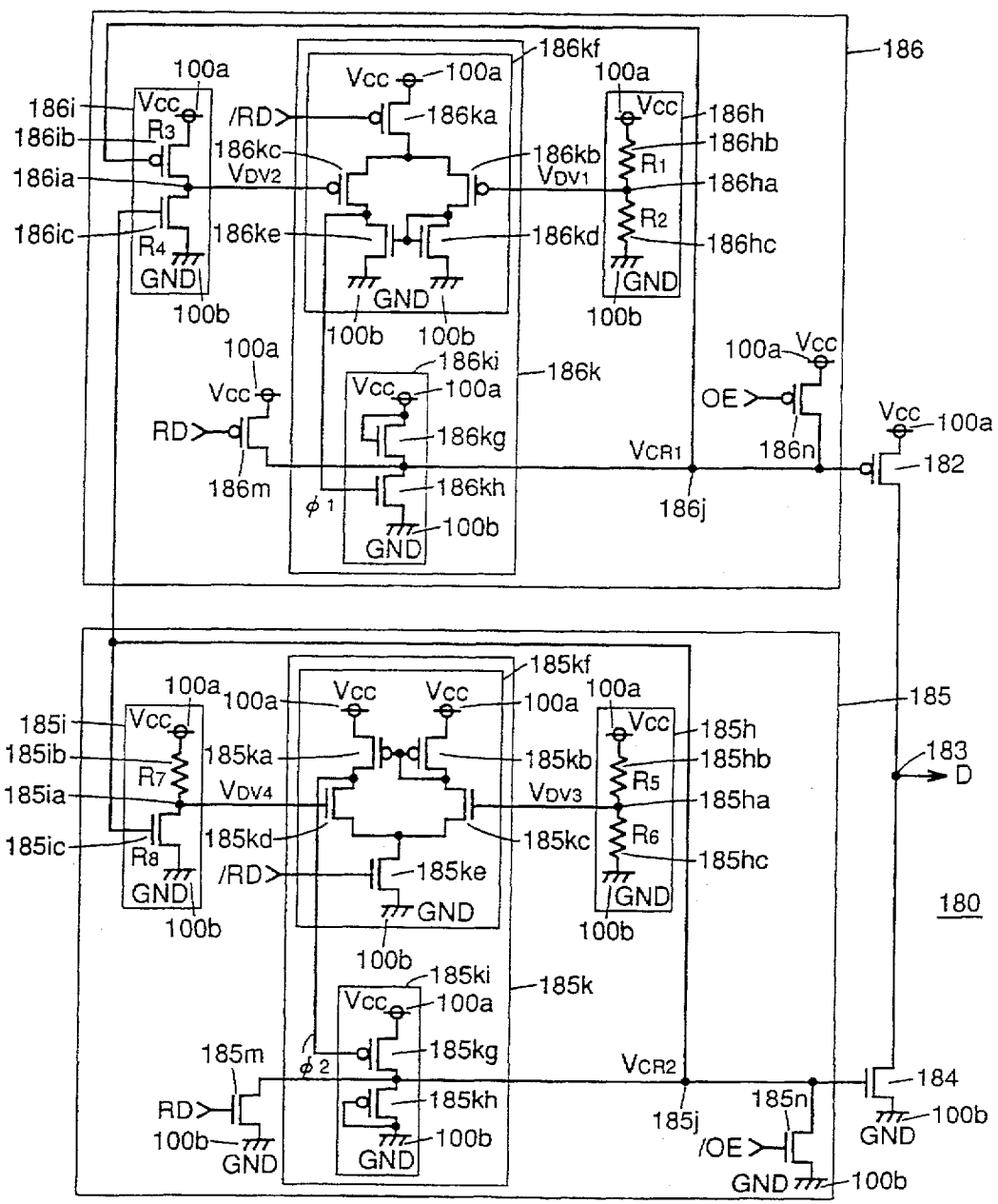

FIG. 24 is a circuit diagram of output buffer 180 according to the twentieth embodiment. Output buffer 180 of FIG. 24 differs from output buffer 180 of the eighteenth embodiment shown in FIG. 22 in that resistor element 186ic in control voltage divider circuit 186i is formed of an n channel MOS transistor receiving comparison potential $V_{CR2}$ at its gate. The circuit of the twentieth embodiment operates in a manner similar to that of the eighteenth embodiment, and also provides similar advantages.

TWENTY-FIRST EMBODIMENT

An SRAM according to a twenty-first embodiment of the present invention will be described hereinafter with reference to FIG. 25. The twenty-first embodiment differs from the nineteenth embodiment in the structure of output buffer 180. Components corresponding to the those of the nineteenth embodiment of the same reference characters allotted, and only differing features will be described.

Figure 25:
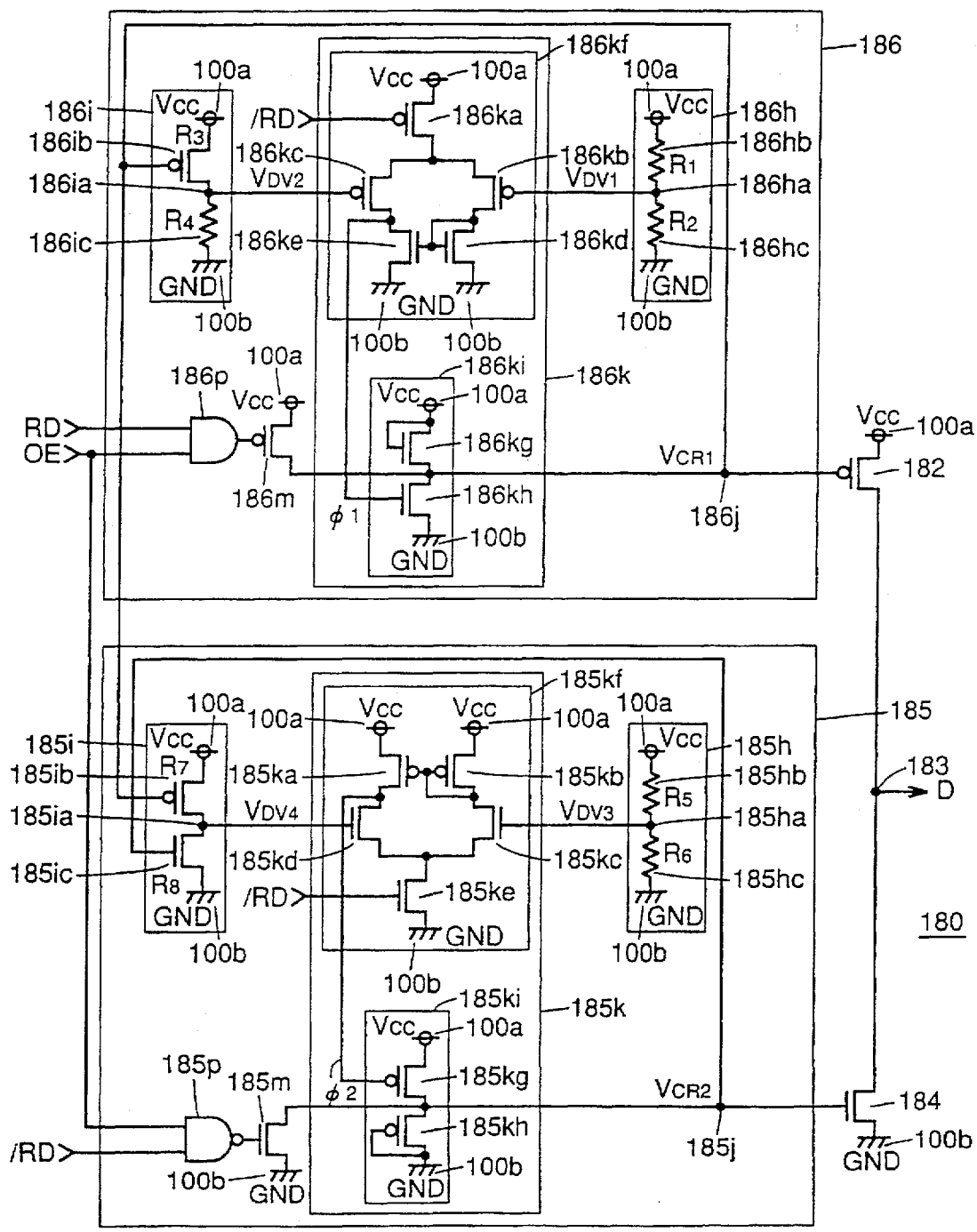

FIG. 25 is a circuit diagram of output buffer 180 according to the twenty-first embodiment. Output buffer 180 of FIG. 25 differs from output buffer 180 of the nineteenth embodiment shown in FIG. 23 in the following two points. Firstly, gate pull-up transistor 186n is removed, and an AND gate circuit 186p is provided instead. AND gate circuit 186p receives read data RD and output enable signal OE, and has its output connected to the gate of power supply transistor 186m. When output enable signal OE attains an L level of inactivation, an output signal of an L level is provided to power supply transistor 186m irrespective of the level of read data RD. As a result, power supply transistor 186m is rendered conductive, and p channel pull-up output transistor 182 is rendered non-conductive. Secondly, gate pull-down transistor 185n is removed, and an NAND gate circuit 185p is provided instead. NAND gate circuit 185p receives read data /RD and output enable signal OE, and has its output connected to the gate of ground transistor 185m. When output enable signal OE attains an L level of inactivation, an output signal of an H level is provided to ground transistor 185m irrespective of the level of read data RD. In response, ground transistor 185m is rendered conductive, and n channel pull-down output transistor 184 is rendered non-conductive. The circuit of FIG. 21 operates in a manner substantially similar to that of the nineteenth embodiment, and also provides similar advantages.

TWENTY-SECOND EMBODIMENT

An SRAM according to a twenty-second embodiment of the present invention will be described hereinafter with reference to FIGS. 26 and 27. The twenty-second embodiment differs from the twenty-first embodiment in that SRAM 100 includes four data input/output pins 110b and that the structure of output buffer 180 differs. Components corresponding to those of the twenty-first embodiment have the same reference characters denoted, and only differing features will be described.

Figure 26:
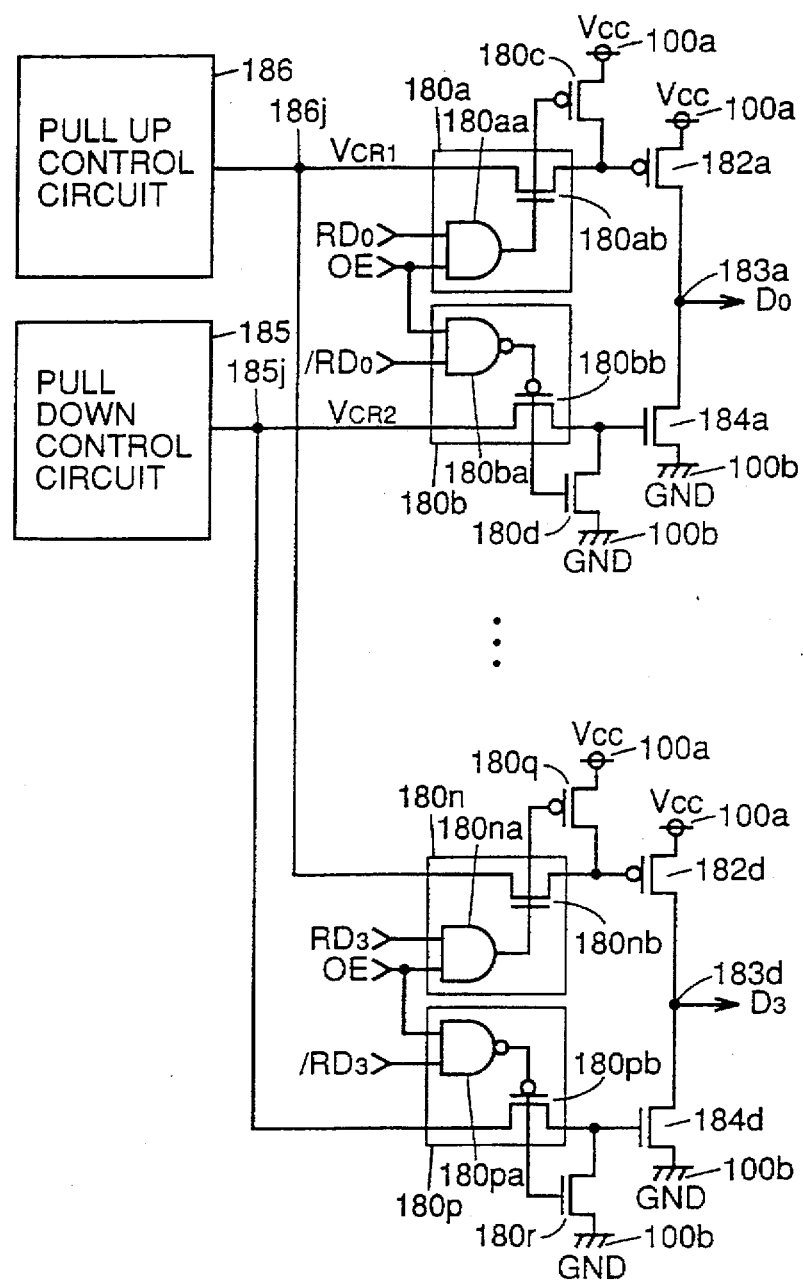

FIG. 26 is a circuit diagram of output buffer 180 of the twenty-second embodiment. Output buffer 180 of FIG. 26 differs from output buffer 180 of the twenty-first embodiment shown in FIG. 25 in the following three points. Firstly, there are four output nodes 183a, 183b, 183c and 183d (output nodes 183b and 183c are not shown in the drawing) corresponding to four data input/output pins. P channel pull-up output transistors 182a, 182b, 182c, and 182d (illustration of p channel pull-up output transistors 182b and 182c are not shown in the drawing) and n channel pull-down output transistors 184a, 184b, 184c and 184d (illustration of n channel pull-down output transistors 184b and 184c are not shown in the drawing) of equal size are provided corresponding to output nodes 183a, 183b, 183c and 183d, respectively. Secondly, power supply transistors 180c, 180g, 180k and 180q (power supply transistors 180g and 180k are not shown) and transmission circuits 180a, 180e, 180i and 180n (transmission circuits 180e and 180i are not shown) are provided corresponding to p channel pull-up output transistors 182a, 182b, 182c and 182d, respectively. Ground transistors 180d, 180h, 180m and 180r (ground transistors 180h and 180m are not shown) and transmission circuits 180b, 180f, 180j and 180p (transmission circuits 180f, 180j are not shown) are provided corresponding to n channel pull-down output transistors 184a, 184b, 184c, and 184d, respectively. Thirdly, the structures of pull-up output control circuit 186 and pull-down control circuit 185 differ.

Transmission circuits 180a, 180e, 180i and 180n include AND gate circuits 180aa, 180ea, 180ia, and 180na, respectively, each receiving a corresponding read data $RD_i$ (i=0,1,2, 3) and output enable signal OE for providing an output signal attaining an H level when the received signals both attain an H level, and transfer gates 180ab, 180eb, 180ib, and 180nb, respectively, connected between the gates of p channel pull-up output transistors 182a, 182b, 182c, and 182d and a node 186j to which comparison signal $V_{CR1}$ of pull-up control circuit 186 is provided, and having a gate connected to the output nodes of AND gate circuits 180aa, 180ea, 180ia, and 180na, respectively. Transmission control circuits 180b, 180f, 180j and 180p include NAND gate circuits 180ba, 180fa, 180ja, and 180pa, respectively, receiving corresponding read data $/RD_i$(i=0,1,2,3) and an output enable signal OE to provide an output signal of an L level when the received signals both attain an H level, and transfer gates 180bb, 180fb, 180jb and 180pb, respectively, connected between the gate of a corresponding one of n channel pull-down output transistors 184a, 184b, 184c, and 184d and a node 184j to which comparison signal $V_{CR2}$ of pull-down control circuit 185 is connected, and having a gate connected to a corresponding one of output nodes of NAND gate circuits 180ba, 180fa, 180ja, and 180pa.

Power supply transistors 180c, 180g, 180k and 180q are respectively connected between power supply potential node 100a and the gate of a corresponding one of p channel pull-up output transistors 182a, 182b, 182c, and 182d, and have respective gates connected to the output nodes of a corresponding of AND gate circuits 180aa, 180ea, 180ia, and 180na, and is rendered conductive when output enable signal OE attains an H level and a corresponding read data $RD_i$ attains an L level. Ground transistors 180d, 180h, 180m and 180r are connected between the gates of respective one of n channel pull-down output transistors 184a, 184b, 184c and 184d and ground potential node 100b, and have respective gates connected to the output node of a corresponding one of NAND gate circuits 180ba, 180fa, 180ja and 180pa, and is rendered conductive when output enable signal OE attains an H level and a corresponding read data $/RD_i$ attains an L level.

Figure 27:
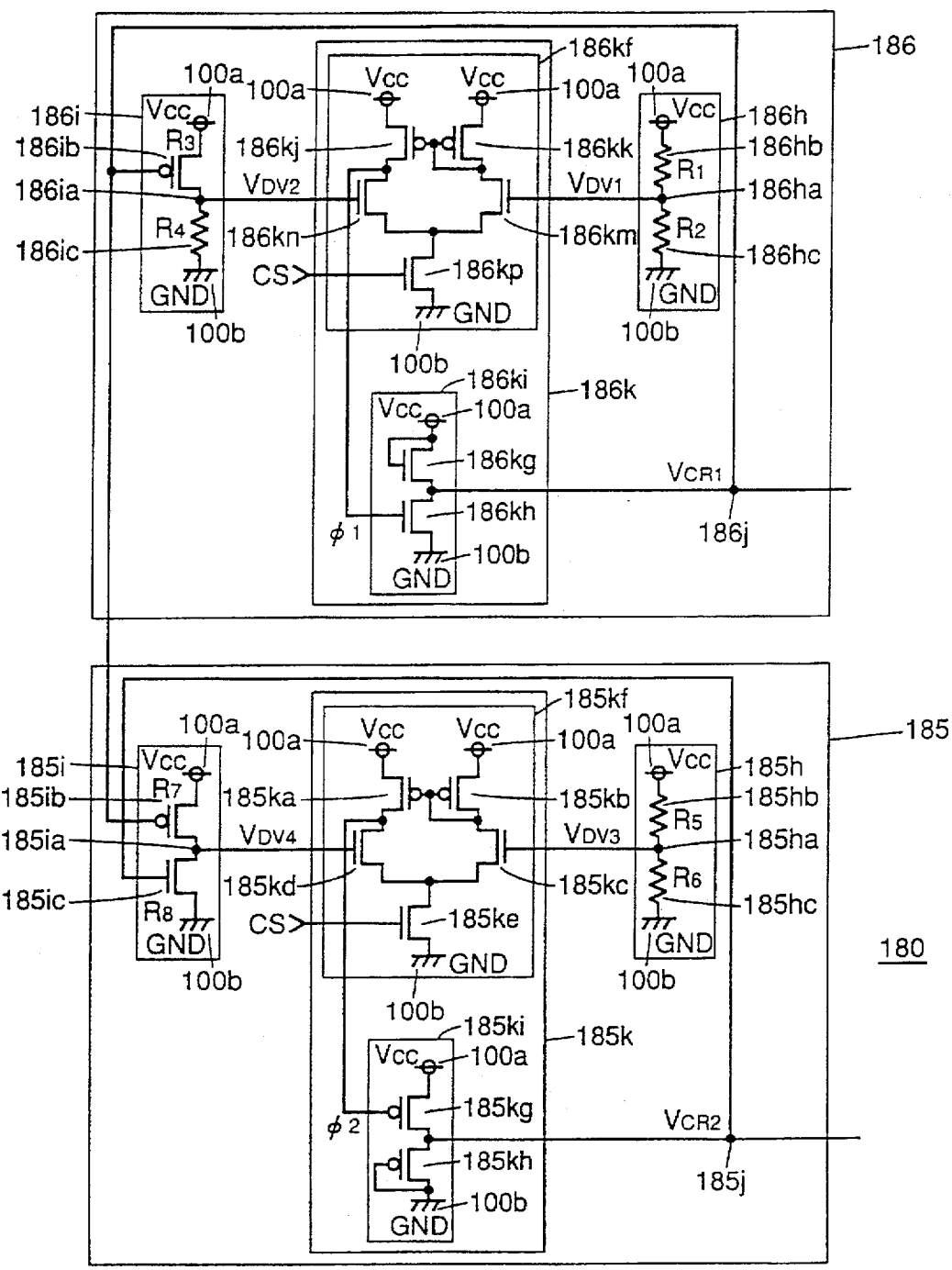
FIG. 27 is a diagram of a pull-up control circuit and a pull-down control circuit of the output buffer of the twenty-second embodiment.
Figure 28:
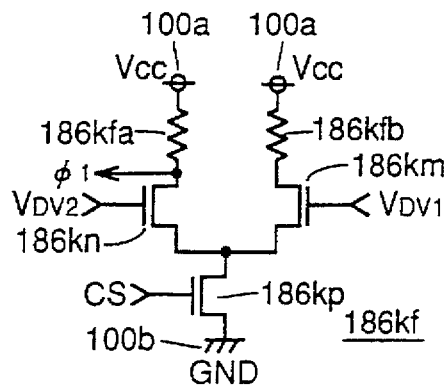
FIGS. 28, 29, and 30 are circuit diagrams showing examples of a differential amplifier circuit of the output buffer of the twenty-second embodiment.

FIG. 27 is a specific circuit diagram of pull-down control circuit 185 and pull-up control circuit 186 shown in FIG. 26. Referring to FIG. 27, the present embodiment differs from the nineteenth embodiment shown in FIG. 23 in that ground transistor 185m and gate pull-down transistor 185n in pull-down control circuit 185 are removed. N channel MOS transistor 181ke of differential amplifier circuit 185kf of comparator circuit 185k receives a chip select signal CS, instead of read data /RD at its gate. Chip select signal CS of an H level of activation allows read/write of data D in response to activation of the chip of SRAM 100. Furthermore, the structure of differential amplifier circuit 186kf of comparator circuit 186k differs in that power supply transistor 186m and gate pull-up transistor 186n are removed.

Differential amplifier circuit 186kf includes a p channel MOS transistor 186kj, a p channel MOS transistor 186kk having a gate connected to the gate of p channel MOS transistor 186kj, and forming a p channel current mirror circuit with p channel MOS transistor 186kj, an n channel MOS transistor 186km receiving divided voltage $V_{DV3}$ at its gate, an n channel MOS transistor 186kn receiving control voltage $V_{DV4}$ at its gate, and an n channel MOS transistor 186kp receiving chip select signal CS at its gate. Differential amplifier circuit 186kf provides an output signal $\phi_2$ which is an amplification of the potential difference between divided voltage $V_{DV3}$ and control voltage $V_{DV4}$.

According to output buffer 180 shown in FIGS. 26 and 27, similar to the nineteenth embodiment shown in FIG. 23, the gate length of p channel MOS transistor 186ib in control voltage divider circuit 186i and the gate length of p channel pull-up output transistor 182 are equally set to 0.8 μm. The gate width of p channel MOS transistor 186ib is set to 4 μm which is 1/100 the gate width of p channel pull-up output transistor 182. Resistance $R_4$ of resistor element 186ic is set to 5000 Ω which is 100 times the impedance of transmission line 200 connected to output node 183. Resistance $R_1$ of resistor element 186hb in voltage divider circuit 186h and resistance $R_2$ of resistor element 186hd are both set to a high resistance of 5000 Ω.

When resistance value $R_3$ of p channel MOS transistor 186ib is greater than resistance value $R_4$ of resistance element 186ic, i.e. when comparison potential $V_{CR1}$ which is the gate potential becomes higher than the optimum value so that the impedance of p channel pull-up output transistors 182a, 182b, 182c and 182d becomes higher than the impedance of transmission line 200, control voltage $V_{DV2}$ becomes smaller than divided voltage $V_{DV1}$. Differential amplifier circuit 186kf drives output signal $\phi_1$ to an H level. N channel MOS transistor 186kh receiving signal $\phi_1$ is rendered conductive, whereby comparison potential $V_{CR1}$ is reduced. In response, resistance $R_3$ of p channel MOS transistor 186ib and the impedance of p channel pull-up output transistors 182a, 182b, 182c and 182d becomes smaller.

When resistance $R_3$ of p channel MOS transistor 186ib becomes smaller than resistance $R_4$ of resistor element 186ic, i.e. when comparison potential $V_{CR1}$ of the gate potential becomes lower than the optimum value so that the impedance of p channel pull-up output transistor 182a, 182b, 182c and 182d becomes smaller than the impedance of transmission line 200, control voltage $V_{DV2}$ becomes higher than divided voltage $V_{DV1}$. Differential amplifier circuit 186kf drives output signal $\phi_1$ to an L level. N channel MOS transistor 186kh receiving $\phi_1$ is rendered non-conductive, whereby comparison potential $V_{CR1}$ increases. In response, resistance $R_3$ of p channel MOS transistor 183ib and the impedance of p channel pull-up output transistors 182a, 182b, 182c and 182d become higher. By operating in a manner similar to that of the nineteenth embodiment, resistance $R_3$ of p channel MOS transistor 186ib is set equal to resistance value $R_4$ of resistance element 186ic. The impedance of p channel pull-up output transistors 182a, 182b, 182c, and 182d become equal to the impedance of transmission line 200 connected to each of output nodes 183a, 183b, 183c and 183d, respectively.

Similar to the nineteenth embodiment, the gate length of n channel MOS transistor 186ic in control voltage divider circuit 186i and the gate length of n channel pull-down output transistors 184a, 184b, 184c and 184d are equally set to 0.8 μm. The gate width of n channel MOS transistor 185ic is set to 4 μm which is 1/100 the gate width of n channel pull-down output transistors 184a, 184b, 184c and 184d. Resistance $R_7$ of resistor element 185id is set to 5000 Ω which is 100 times the impedance of transmission line 200 connected to output node 183. Resistance $R_5$ of resistor element 185hb in voltage divider circuit 185h and resistance $R_6$ of resistor element 185hc are set to the high value of 5000 Ω.

When resistance $R_8$ of n channel MOS transistor 185ic becomes greater than resistance $R_7$ of resistor element 185ib, i.e. when comparison potential $V_{CR2}$ which becomes the gate potential becomes lower than the optimum value so that the impedance of n channel pull-down output transistors 184a, 184b, 184c and 184d become greater than the impedance of transmission line 200, control voltage $V_{DV4}$ becomes higher than divided voltage $V_{DV3}$. Differential amplifier circuit 185kf drives output signal $\phi_2$ to an L level. P channel MOS transistor 185kg receiving $\phi_2$ is rendered conductive, whereby comparison potential $V_{CR2}$ is increased. In response, resistance value $R_8$ of n channel MOS transistor 185ic and the impedance of n channel pull-down output transistors 184a, 184b, 184c and 184 become smaller.

When resistance $R_8$ of n channel MOS transistor 185ic becomes smaller than resistance $R_7$ of resistor element 185ib, i.e. when comparison potential $V_{CR2}$ which becomes the gate potential becomes higher than the optimum value so that the impedance of n channel pull-down output transistors 184a, 184b, 184c and 184d becomes smaller than the impedance of transmission line 200, control voltage $V_{DV4}$ becomes smaller than divided voltage $V_{DV3}$. Differential amplifier circuit 185kf drives output signal $\phi_2$ to an H level. P channel MOS transistor 185kg receiving signal $\phi_2$ is rendered non-conductive, whereby comparison potential $V_{CR2}$ is reduced. In response, resistance $R_8$ of n channel MOS transistor 185ic and the impedance of n channel pull-down output transistors 184a, 184b, 184c and 184d become greater. By operating in the above-described manner, resistance $R_8$ of n channel MOS transistor 185ic is set equal to resistance $R_7$ of resistor element 185ib. Also, the impedance of n channel pull-down output transistors 184a, 184b, 184c and 184d are set equal to the impedance of transmission line 200 connected to output nodes 183a, 183b, 183c, 183d, respectively.

According to output buffer 180 shown in FIGS. 26 and 27, differential amplifier circuits 186kf and 185kf are rendered inactive so that a differential amplify operation is not carried out when chip select signal CS attains an L level of inactivation. When chip select signal CS attains an H level, pull-up control circuit 186 provides to node 186j a comparison potential $V_{CR1}$ that is controlled so that the impedance of p channel pull-up output transistors 182a, 182b, 182c and 182d equal the impedance of transmission line 200 connected to output nodes 183a, 183b, 183c and 183d, respectively, as described above. Pull-down control circuit 185 provides comparison potential $V_{CR2}$ to node 185j that is controlled so that the impedance of n channel pull-down output transistors 184a, 184b, 184c and 184d equal the impedance of transmission line 200 connected to output nodes 183a, 183b, 183c and 183d, respectively.

When output enable signal OE attains an H level of activation and read data $RD_0$ attains an H level (/$RD_0$ attains an L level), the output signal of AND gate circuit 185aa attains an H level, whereby transfer gate 180ab is rendered conductive, and power supply transistor 180c is rendered non-conductive. P channel pull-up output transistor 182a is rendered conductive in response to receiving $V_{CR1}$ controlled so that the impedance equals the impedance of transmission line 200 connected to output node 183a. Furthermore, the output signal of NAND gate circuit 180ba attains an H level, whereby transfer gate 180bb is rendered non-conductive, ground transistor 180d is rendered conductive, and n channel pull-down output transistor 184a is rendered non-conductive. Therefore, data $D_0$ provided from output node 183a attains an H level.

When output enable signal OE attains an H level of activation and read data RD attains an L level (/RD attains an H level) during the H level period of chip select signal CS, the output signal of AND gate circuit 180aa attains an L level, whereby transfer gate 180ab is rendered non-conductive and transfer transistor 180c is rendered conductive. P channel pull-up output transistor 182a is rendered non-conductive, whereby the output signal of NAND gate circuit 180ba attains an L level. In response, transfer gate 180bb is rendered conductive, and ground transistor 180d is rendered non-conductive. N channel pull-down output transistor 184a is rendered conductive in response to receiving $V_{CR2}$ controlled so that the impedance thereof equal the impedance of transmission line 200 connected to output node 183a. Therefore, data $D_0$ provided from output node 183a attains an L level.

When output enable signal OE attains an L level of inactivation, the output signal of AND gate circuit 180aa attains an L level irrespective of the levels of read data RD and data select signal CS. In response, transfer gate 180ab is rendered non-conductive. Furthermore, power supply transistor 180c is rendered conductive, and p channel pull-up output transistor 182a is rendered non-conductive. The output signal of NAND gate circuit 180ba is driven to an H level. In response, transfer gate 180bb is rendered non-conductive, and ground transistor 180d is rendered conductive. N channel pull-down output transistor 184a is rendered non-conductive. Therefore, data $D_0$ provided from node 183a attains a high impedance state. The same applies for data $D_1$, $D_2$ and $D_3$. During the H level period of chip select signal CS, data D attains an H level, an L level, and a high impedance state when output enable signal OE attains an H level and a corresponding read data $RD_i$ attains an H level, when output enable signal OE attains an H level and corresponding read data $RD_i$ attains any level, and when output enable signal OE attains an L level and a corresponding read data $RD_i$ attains any level, respectively.

According to SRAM 100 of the twenty-second embodiment, the impedance of n channel pull-down output transistors 184a, 184b, 184c and 184d are set equal to the impedance of transmission line 200 by controlling the gate potentials of n channel pull-down output transistors 184a, 184b, 184c and 184d. It is therefore not necessary to adjust the channel length and the channel width so as to equal the impedance of transmission line 200. By just setting the channel length of n channel pull-down output transistors 184a, 184b, 184c and 184d equal to the channel length of n channel MOS transistor 185ic, the impedance of n channel pull-down output transistors 184a, 184b, 184c and 184d can be made to match the impedance of transmission line 200.

The impedance of p channel pull-up output transistor 182 is set equal to the impedance of transmission line 200 by controlling the gate potentials of p channel pull-up output transistors 182a, 182b, 182c and 182d, respectively. Therefore, it is not necessary to adjust the channel length and the channel width so as to equal the impedance of transmission line 200. By just setting the channel length of p channel pull-up transistors 182a, 182b, 182c and 182d equal to the channel length of p channel MOS transistor 186ib, the impedance of p channel pull-up output transistors 182a, 182b, 182c and 182d can be made to match the impedance of transmission line 200.

By providing transmission circuits 180b, 180f, 180j and 180p, pull-down control circuit 185 continues to output to node 185j during the H level period of chip select signal CS a $V_{CR2}$ controlled so that the impedance of n channel pull-down output transistors 184a, 184b, 184c, and 184d equal the impedance of transmission line 200 connected to output nodes 183a, 183b, 183c and 183d, respectively. Therefore, when output enable signal OE and read data /RD$_i$ attain an H level to render transfer gates 180bb, 800fb, 180jb and 180cb conductive, the gate potentials of n channel pull-down output transistors 184a, 184b, 184c and 184d immediately attain the level of $V_{CR2}$. Therefore, high speed access is possible.

By providing transmission circuits 180a, 180e, 180i, and 180n, pull-up control circuit 186 continues to provide to node 186j during the H level period of chip select signal CS a $V_{CR1}$ controlled so that the impedance of p channel pull-up output transistors 182a, 182b, 182c, 182d equal the impedance of transmission line 200 connected to output nodes 183a, 183b, 183c and 183d, respectively. Therefore, when output enable signal OE and read data RD$_i$ attain an H level to render transfer gates 180ab, 180eb, 180ib, and 180nb conductive, the gate potentials of p channel pull-up output transistors 182a, 182b, 182c and 182d immediately attain the level of the controlled $V_{CR1}$. Therefore, high speed access is possible.

By providing transmission circuits 180b, 180f, 180j and 180p corresponding to n channel pull-down output transistors 184a, 184b, 184c and 184d, respectively, so that a plurality of n channel pull-down output transistors 184a, 184b, 184c and 184d share one pull-down control circuit 185, the layout area of pull-down control circuit 185 will not be increased.

By providing transmission circuits 180a, 180e, 180i and 180n corresponding to p channel pull-up output transistors 182a, 182b, 182c, and 182d, respectively, so that the plurality of p channel pull-up output transistors 182a, 182b, 182c and 182d share one pull-up control circuit 186, the layout area of pull-up control circuit 186 will not be increased.

The present invention is not limited to the twenty-second embodiment in which differential amplifier circuit 186kf has a structure as shown in FIG. 27. Differential amplifier circuit 186kf may employ a structure in which p channel MOS transistor 186ka receives a chip select signal CS instead of read data /RD as in the twenty-first embodiment of FIG. 25. Alternatively, differential amplifier circuit 186kf may employ a structure in which resistors 186kfa and 186kfb are provided instead of p channel MOS transistors 186kj and 186kk.

Figure 29:
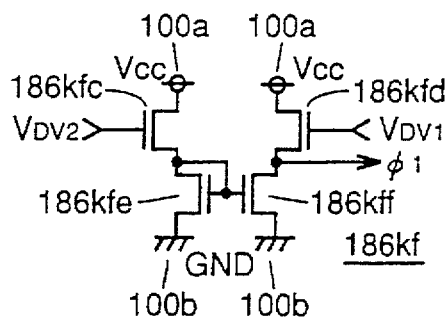
Figure 30:
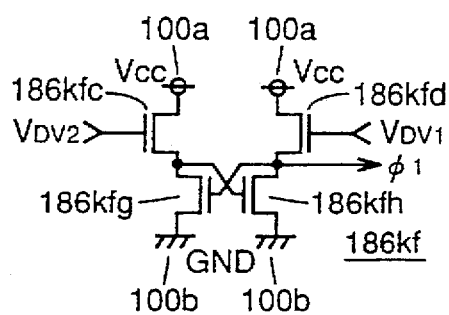

Furthermore, a differential amplifier circuit 186kf can be provided as shown in FIG. 29, including an n channel MOS transistor 186kfc receiving control voltage $V_{DV2}$ at its gate, an n channel MOS transistor 186kfd receiving divided voltage $V_{DV1}$ at its gate, an n channel MOS transistor 186kfe, and an n channel MOS transistor 186kff having a gate connected to the gate of n channel MOS transistor 186kfe to form an n channel current mirror circuit with n channel MOS transistor 186kfe. Furthermore, a differential amplifier circuit 186kf can take a structure as shown in FIG. 30, wherein n channel MOS transistors 186kfe and 186kff forming the n channel current mirror circuit of differential amplifier circuit 186kf of FIG. 26 are replaced with n channel MOS transistors 186kfg and 186kfh forming an n channel cross-coupled circuit.

Figure 31:
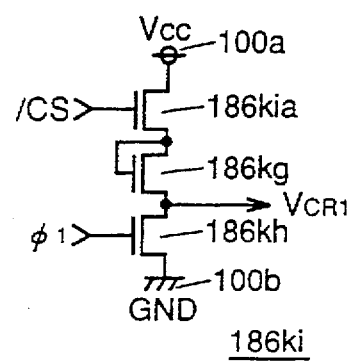
FIGS. 31 and 32 are circuit diagrams showing examples of an output circuit of the output buffer of the twenty-second embodiment.
Figure 32:
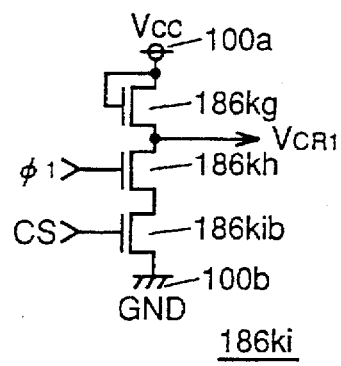

The present invention is not limited to the twenty-second embodiment in which output circuit 186ki has a structure as shown in FIG. 27. As shown in FIG. 31, output circuit 186ki can have a structure wherein a p channel MOS transistor 186kia is further included, connected between n channel MOS transistor 186kg and power supply potential node 100a, and having a gate receiving signal /CS which is an inverted version of chip select signal CS. Alternatively, as shown in FIG. 32, output circuit 186ki can further include an n channel MOS transistor 186kib connected between n channel MOS transistor 186kh and ground potential node 100b, having a gate receiving chip select signal CS.

TWENTY-THIRD EMBODIMENT

An SRAM according to a twenty-third embodiment of the present invention will be described hereinafter with reference to FIGS. 33 and 34. The twenty-third embodiment differs from the twenty-second embodiment in the structure of pull-down control circuit 185 and pull-up control circuit 186 in output buffer 180. Components corresponding to those of the twenty-second embodiment have the same reference characters denoted, and only differing features will be described.

Figure 33:
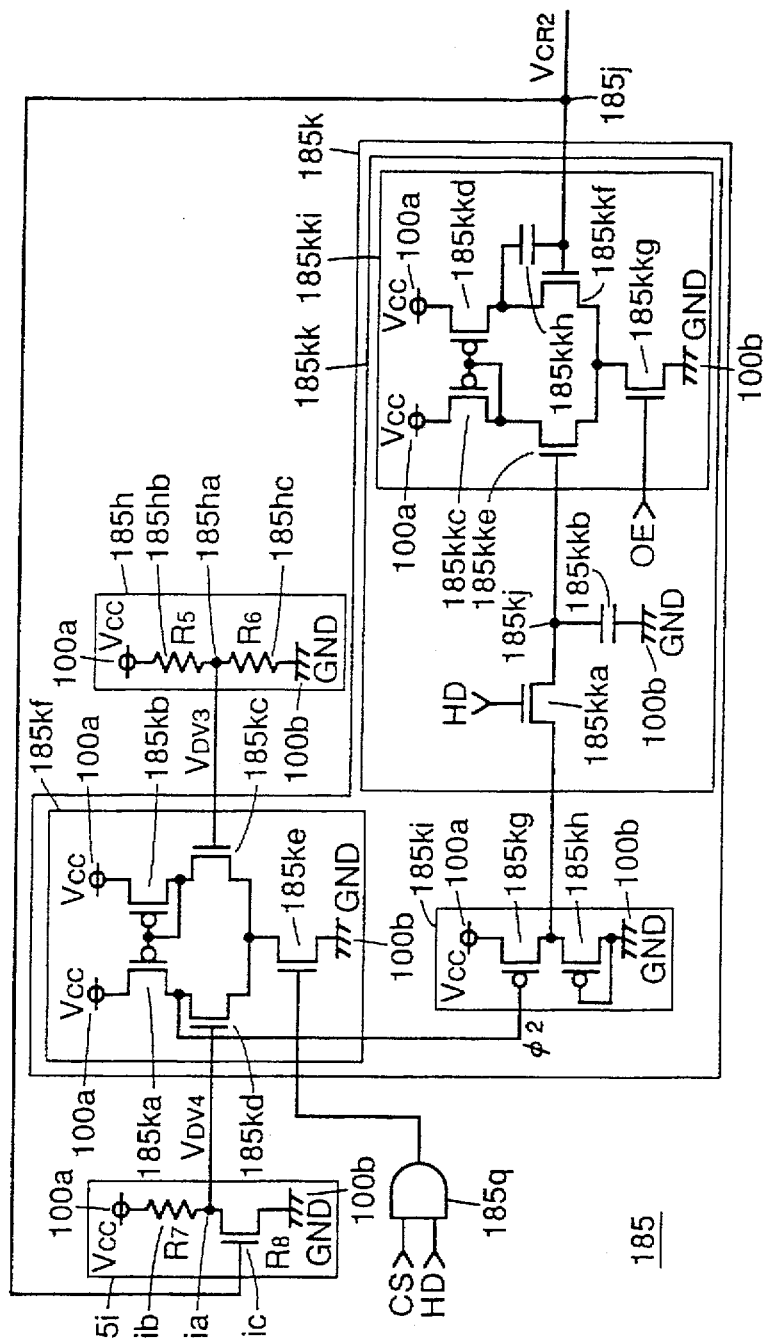
FIGS. 33 and 34 are circuit diagrams showing a pull-down control circuit and a pull-up control circuit, respectively, of an output buffer of a twenty-third embodiment of the present invention.

FIG. 33 is a circuit diagram of pull-down control circuit 185 of output buffer 186 according to the twenty-third embodiment. Output buffer 180 of FIG. 33 differs from output buffer 180 of the twenty-second embodiment shown in FIG. 27 in the following two points. Firstly, comparator circuit 185k further includes a potential hold circuit 185kk receiving a hold signal HD for holding the comparison potential $V_{CR2}$ of node 185j by sampling the potential of node 185kj at the transition of hold signal HD to an H level and an L level. Secondly, an AND gate circuit 185q is newly provided, receiving chip select signal CS and holding signal HD for providing an output signal of an L level when either of the received signals attain an L level to the gate of n channel MOS transistor 185ke in differential amplifier circuit 185kf, and rendering differential amplifier circuit 185kf inactive when one of chip select signal CS and hold signal HD attains an L level.

Potential hold circuit 185kk includes an n channel MOS transistor 185kka, a capacitor 185kkb, and a differential amplifier circuit 185kki. N channel MOS transistor 185kka receives a hold signal HD at its gate. Capacitor 185kkb is connected between a node 185kk and ground potential node 100b. Differential amplifier circuit 185kki includes a p channel MOS transistor 185kkc, a p channel MOS transistor 185kkd having a gate connected to the gate of p channel transistor 185kkc for forming a p channel current mirror circuit with p channel MOS transistor 185kkc, an n channel MOS transistor 185kke having a gate connected to a node 185kj, an n channel MOS transistor 185kkf having a gate connected to node 185j, an n channel MOS transistor 185kkg receiving output enable signal OE at its gate, and a capacitor 185kkh connected between the drain of p channel MOS transistor 185kkd and the gate of n channel MOS transistor 185kkf.

In this pull-down control circuit 185, differential amplifier circuit 185kf is inactivated when chip select signal CS attains an L level, similar to that twenty-second embodiment. When chip select signal CS, hold signal HD and output enable signal OE attain an H level, differential amplifier circuit 185kki in potential hold circuit 185kk operates so that comparison potential $V_{CR2}$ of node 185j equals the potential of node 185kj. Therefore, comparison potential $V_{CR2}$ is controlled in a manner similar to that of pull-down control circuit 185 of the twenty-second embodiment. When chip select signal CS and output enable signal OE attain an H level and hold signal HD attains an L level, the potential of node $185_{kj}$ is stored in capacitor $185_{kkb}$. Differential amplifier circuit 185kki sets the level of comparison potential $V_{CR2}$ equal to the level of the stored node 185kj, and differential amplifier circuit $185_{kf}$ is inactivated. In order to reduce power consumption, the size of the transistor (ratio of channel width to channel length) forming differential amplifier circuit 185kki is set smaller than the size (ratio of channel width to channel length) of the transistor forming differential amplifier circuit 185kf.

Figure 34:
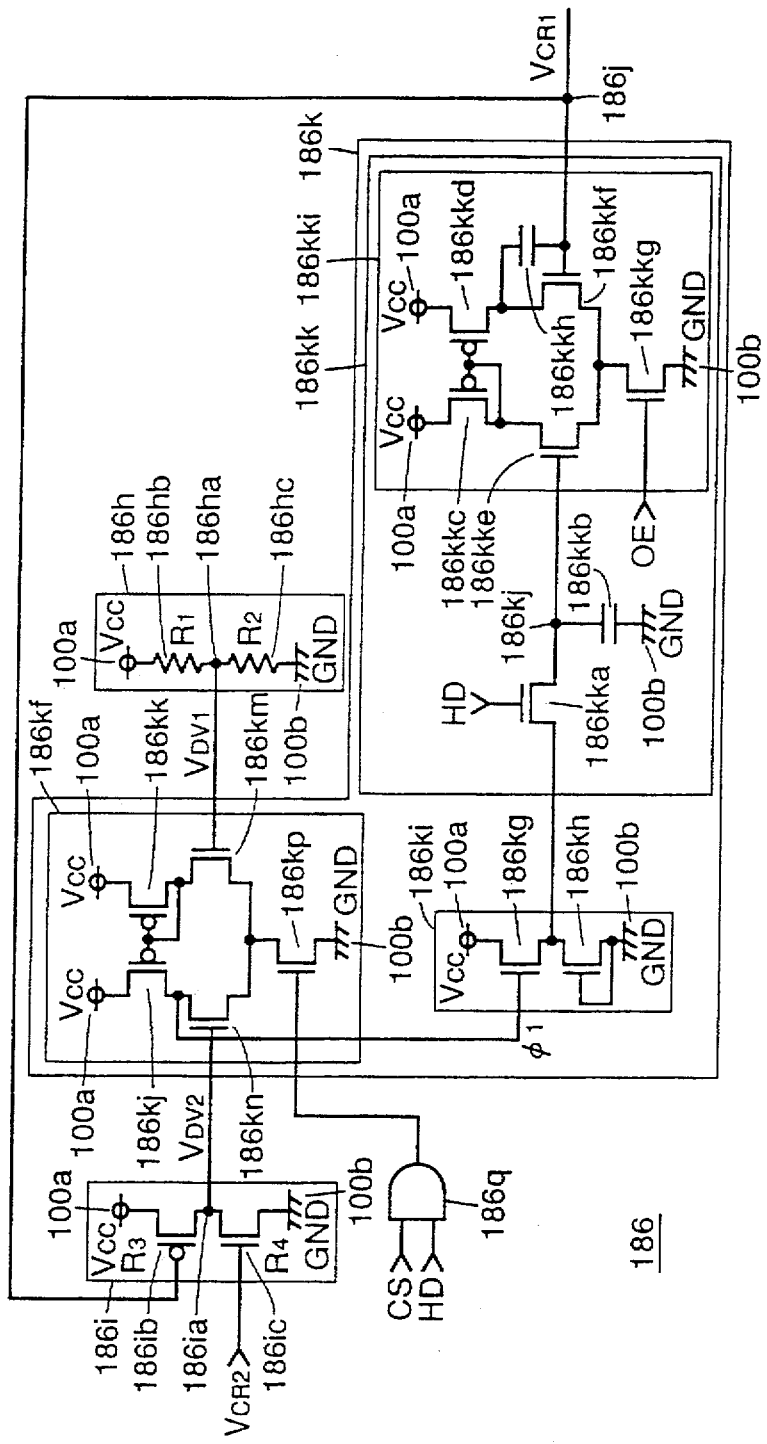

FIG. 34 is a circuit diagram of pull-up control circuit 186 of output buffer 180 according to the twenty-third embodiment. Pull-up control circuit 186 differs from pull-up control circuit 186 in output buffer 180 of the twenty-second embodiment shown in FIG. 27 in the following two points. Firstly, comparator circuit 186k further includes a potential hold circuit 186kk receiving a hold signal HD for maintaining the level of comparison potential $V_{CR1}$ of node 186j by sampling the potential of node 186kj at the transition of hold signal HD to an H level from an L level. Secondly, an AND gate circuit 186q is newly provided, receiving a chip select signal CS and a hold signal HD to provide an output signal of an L level when either of the received signals attains an L level to the gate of n channel MOS transistor 186ke in differential amplifier circuit 186kf, and inactivating differential amplifier circuit 186kf when one of the received signals attains an L level.

Potential hold circuit 186kk includes an n channel MOS transistor 186kka receiving hold signal HD at its gate, a capacitor 186kkb connected between a node 186kj and ground potential node 100b, and a differential amplifier circuit 186kki. Differential amplifier circuit 186kki includes a p channel MOS transistor 186kkc, a p channel MOS transistor 186kkd having a gate connected to the gate of p channel MOS transistor 186kkc, and forming a p channel current mirror circuit with p channel MOS transistor 186kkc, an n channel MOS transistor 186kke having a gate connected to node 186kj, an n channel MOS transistor 186kkf having a gate connected to a node 186j, an n channel MOS transistor 186kkg receiving output enable signal OE at its gate, and a capacitor 186kkh connected between the drain of p channel MOS transistor 186kkd and the gate of n channel MOS transistor 186kkf.

According to pull-up control circuit 186, differential amplifier circuit 186kf is inactivated when chip select signal CS attains an L level, similar to the twenty-second embodiment. When chip select signal CS, hold signal HD and output enable signal OE attain an H level, differential amplifier circuit 186kki in potential hold circuit 186kk operates so that the comparison potential $V_{CR1}$ of node 186j equals the potential of node 186kj. Therefore, comparison potential $V_{CR1}$ is controlled, similar to that in pull-up control circuit 186 of the twenty-second embodiment. When chip select signal CS and output enable signal OE attain an H level and hold circuit HD attains an L level, the potential of node $186_{kj}$ is stored in capacitor 186kkb. Differential amplifier circuit 186kki sets the comparison potential $V_{CR1}$ equal to the potential of node 186kj, whereby differential amplifier circuit 186kf is inactivated. In order to reduce power consumption, the size (ratio of channel width to channel length) of the transistor forming differential amplifier circuit 186kki is set smaller than the size (ratio channel width to channel length) of the transistor forming differential amplifier circuit 186kf.

The circuit of the twenty-third embodiment operates in a manner similar to that of the twenty-second embodiment, provided that a potential holding operation is newly added. The twenty-third embodiment provides similar advantages. Furthermore, potential holding circuit 185kk is provided in pull-down control circuit 185. Hold signal HD is driven to an L level from an H level when comparison potential $V_{CR2}$ at node 185j attains an optimum value. Comparison potential $V_{CR2}$ of node 185j is maintained by holding circuit 185kk of a small power consumption. By inactivating differential amplifier circuit 185kf having a great power consumption, the power consumption of output buffer 180 can be reduced.

Furthermore, potential hold circuit 186kk is provided in pull-up control circuit 186. Hold circuit HD is driven to an L level from an H level when comparison potential $V_{CR1}$ of node 186j attains an optimum value. Comparison potential $V_{CR1}$ of node $186_j$ is maintained by hold circuit 186kk of low power consumption. By inactivating differential amplifier circuit 186kf of a great power consumption, the power consumption of output buffer 180 can be reduced.

TWENTY-FOURTH EMBODIMENT

An SRAM according to a twenty-fourth embodiment of the present invention will be described hereinafter with reference to FIG. 35. The twenty-fourth embodiment differs from the twenty-third embodiment in that SRAM 100 additionally includes an internal potential supply circuit 101, and that voltage divider circuits 185h and 186h and control voltage divider circuits 185i and 186i in pull-down control circuit 185 and pull control circuit 186, respectively, of output buffer 180 receive internal potential intV from internal potential supply circuit 101, instead of power supply potential $V_{CC}$. Components corresponding to those of the twenty-third embodiment have the same reference characters allotted, and only different features will be described.

Figure 35:
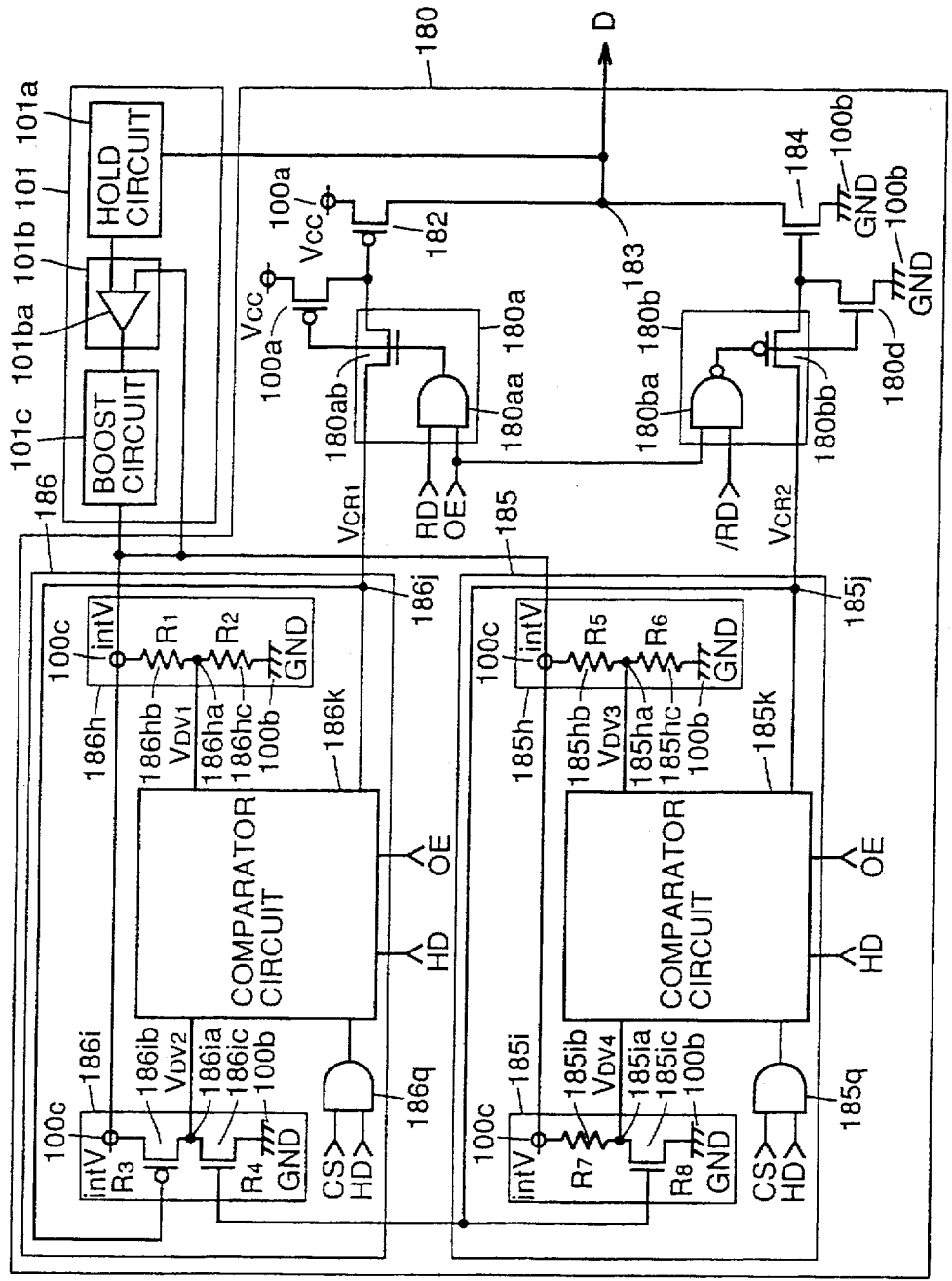
FIG. 35 is a circuit diagram showing an output buffer and an internal potential supply circuit according to a twenty fourth embodiment of the present invention.

FIG. 35 is a circuit diagram showing internal potential supply circuit 101 and output buffer 180 in the twenty-fourth embodiment. Internal potential supply circuit 101 receives potential D of output node 183 to maintain potential D at the maximum value. Internal potential intV of a level equal to the held potential is provided to an internal potential node 100c. More specifically, potential $V_{CC}$ is provided when transmission line 200 connected to output node 183 is equal to the amplitude of power supply potential $V_{CC}$, and a potential higher than power supply potential $V_{CC}$ is provided when transmission line 200 is greater than the amplitude of power supply potential $V_{CC}$. Internal potential supply circuit 101 includes a hold circuit 101a receiving potential D of output node 183 for holding the maximum value of potential D, a comparator circuit 101b including a differential amplifier circuit 101ba receiving the potential held in hold circuit 101a and internal potential intV of internal node 100c to provide an output signal attaining an H level and an L level when internal potential intV is lowered than and higher than the held potential, respectively, and a boost circuit 101c receiving an output signal from comparator circuit 101b to set the potential of internal power supply node 100c to a level higher than power supply potential $V_{CC}$ by providing charge to internal potential node 100c when the received signal attains an H level and suppressing supply of charge when the received signal attains an L level.

Pull-down control circuit 185 and pull-up control circuit 186 shown in FIG. 35 differs from those of the twenty-third embodiment shown in FIGS. 33 and 34 in the following three points. Firstly, resistor element 185hb in voltage divider circuit 185h is connected between node 185ha and an internal power supply node 100c, instead of power supply potential node 100a. Secondly, resistor element 185ib in control voltage divider circuit 185i is connected between internal potential node 100c, instead of power supply potential node 100a, and node 185ib. Thirdly, resistor element 186hb in voltage divider circuit 186h is connected between internal power supply node 100c, instead of power supply node 100a, and node 186ha. Fourthly, p channel MOS transistor 186ib in control voltage divider circuit 186i is connected between internal potential node 100c, instead of power supply potential node 100a, and node 186ia.

According to the circuitry shown in FIG. 35, internal potential supply circuit 101 provides internal potential intV of the level of power supply potential $V_{CC}$ when the potential of transmission line 200 connected to output node 183 is power supply potential $V_{CC}$. Therefore, an operation similar to that of the twenty-third embodiment is carried out and provides similar advantages. When the potential of transmission line 200 is $V_H$ which is greater than the power supply potential $V_{CC}$, internal potential supply circuit 101 maintains potential $V_H$ higher than power supply potential $V_{CC}$ to provide internal potential intV of an equal level. As a result, the resistance of n channel MOS transistor 185ic in voltage divider circuit 185i is increased, so that control voltage $V_{DV4}$ becomes higher than divided voltage $V_{DV3}$. In response, comparison circuit 185k causes comparison potential $V_{CR2}$ to be increased. Therefore, the impedance of n channel pull-down output transistor 184 receiving this comparison potential $V_{CR2}$ at its gate is reduced. Thus, during output of data D of an L level, the output impedance of n channel pull-down output transistor 184 matches the impedance of transmission line 200 at initiation of charge being drawn out from transmission line 200 charged to a level higher than power supply potential $V_{CC}$ by n channel pull-down output transistor 184.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising output buffer means, wherein said output buffer means comprises an output node for providing an output potential according to an input signal attaining one of a first level and a second level, a first node to which a first power supply potential is supplied, a second node to which a second power supply potential is supplied, first switching means connected between said first node and said output node, and rendered conductive/non-conductive in response to a first control signal according to said input signal, second switching means connected between said second node and said output node, and rendered conductive/non-conductive according to said input signal, and control means receiving said input signal and a potential of said output node for providing said first control signal, wherein said control means renders said first switching means non-conductive when said input signal attains said second level, and renders said first switching means conductive, and then renders said first switching means non-conductive from the conductive state so as to follow change in a potential level of said output node when said input signal is driven to said first level from said second level.

2. The semiconductor device according to claim 1, wherein said second power supply potential is higher than said first power supply potential, said first switching means includes an n channel pull-down output transistor coupled so as to form a conduction path between said output node and said first node, said second switching means includes a pull-up output transistor coupled so as to form a conduction path between said second node and said output node, and rendered conductive by having a gate potential controlled according to said input signal when said input signal attains said first level, and said control means includes an internal node connected to a gate of said n channel pull-down output transistor, and outputs a potential level corresponding to said first control signal, a pull-down gate control transistor coupled between said output node and said internal node, and rendered conductive by having a gate potential controlled according to said input signal when said input signal attains to said first level from said second level, and a gate discharge transistor coupled between said internal node and said first node, and rendered non-conductive by having a gate potential controlled according to said input signal when said input signal is said first level.

3. The semiconductor device according to claim 1, wherein said first power supply potential is higher than said second power supply potential, said first switching means includes a p channel pull-up output transistor coupled so as to form a conduction path between said output node and said first node, said second switching means includes a pull-down output transistor coupled so as to form a conduction path between said second node and said output node, and rendered conductive by having a gate potential controlled according to said input signal when said input signal attains said first level, and said control means includes an internal node connected to a gate of said p channel pull-up output transistor, and outputs a potential level corresponding to said first control signal, a pull-up gate control transistor coupled between said output node and said internal node, and rendered conductive by having a gate potential controlled according to said input signal when said input signal attains to said second level from said first level, and a gate charge transistor coupled between said internal node and said first node, and rendered non-conductive by having a gate potential controlled according to said input signal when said input signal is said second level.

4. The semiconductor device according to claim 1, wherein said second power supply potential is higher than said first power supply potential, said first switching means includes an n channel pull-down output transistor coupled so as to form a conduction path between said output node and said first node, said second switching means includes a p channel pull-up output transistor coupled so as to form a conduction path between said output node and said second node in response to a second control signal according to said input signal, and said control means includes a first internal node connected to a gate of said n channel pull-down output transistor, and outputs a potential level corresponding to said first control signal, a second internal node connected to a gate of said p channel pull-up output transistor, and outputs a potential level corresponding to said second control signal, a pull-down gate control transistor coupled between said output node and said first internal node, and rendered conductive by having a gate potential controlled according to said input signal when said input signal attains to said first level from second level, a gate discharge transistor coupled between said first internal node and said first node, and rendered non-conductive by having a gate potential controlled according to said input signal when said input signal is said first level, a pull-up gate control transistor coupled between said output node and said second internal node, and rendered conductive by having a gate potential controlled according to said input signal when said input signal attains to said second level from said first level, and a gate charge transistor coupled between said second internal node and said second node, and rendered non-conductive by having a gate potential controlled according to said input signal when said input signal is said second level.

* * * * *